United States Patent
Koezuka et al.

(10) Patent No.: US 9,748,355 B2
(45) Date of Patent: Aug. 29, 2017

(54) METHOD FOR MANUFACTURING OXIDE SEMICONDUCTOR TRANSISTOR WITH LOW-NITROGEN, LOW-DEFECT INSULATING FILM

(71) Applicant: Semiconductor Energy Laboratory Co., Ltd., Atsugi-shi, Kanagawa-ken (JP)

(72) Inventors: Junichi Koezuka, Tochigi (JP); Toshinari Sasaki, Shinagawa (JP); Shunpei Yamazaki, Setagaya (JP)

(73) Assignee: Semicoductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/945,056

(22) Filed: Jul. 18, 2013

(65) Prior Publication Data

US 2014/0030845 A1 Jan. 30, 2014

(30) Foreign Application Priority Data

Jul. 26, 2012 (JP) .................... 2012-165728

(51) Int. Cl.
*H01L 29/66* (2006.01)
*H01L 29/786* (2006.01)

(52) U.S. Cl.
CPC .... *H01L 29/66477* (2013.01); *H01L 29/7869* (2013.01)

(58) Field of Classification Search
CPC ............ H01L 29/66477; H01L 29/7869
(Continued)

(56) References Cited

U.S. PATENT DOCUMENTS 5,528,032 A 6/1996 Uchiyama et al.
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Peter Bradford
(74) *Attorney, Agent, or Firm* — Robinson Intellectual Property Law Office; Eric J. Robinson

(57) ABSTRACT

The amount of nitrogen that is transferred to an oxide semiconductor film of a transistor including the oxide semiconductor film is reduced. In addition, in a semiconductor device which includes a transistor including an oxide semiconductor film, change in electrical characteristics is suppressed and reliability is improved. After a nitrogen-containing oxide insulating film is formed over a transistor including an oxide semiconductor film where a channel region is formed, nitrogen is released from the nitrogen-containing oxide insulating film by heat treatment. Note that the nitrogen concentration which is obtained by secondary ion mass spectrometry (SIMS) is greater than or equal to the lower limit of detection by SIMS and less than $3 \times 10^{20}$ atoms/cm$^3$.

21 Claims, 26 Drawing Sheets

(58) Field of Classification Search
USPC .......................................................... 438/104
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,466,463 | B2 | 6/2013 | Akimoto et al. |
| 8,669,556 | B2 | 3/2014 | Yamazaki et al. |
| 8,680,522 | B2 | 3/2014 | Yamazaki et al. |
| 8,901,556 | B2 | 12/2014 | Okazaki et al. |
| 8,936,963 | B2 | 1/2015 | Ohara et al. |
| 8,993,386 | B2 | 3/2015 | Ohara et al. |
| 8,994,021 | B2 | 3/2015 | Yamazaki et al. |
| 9,331,208 | B2 | 5/2016 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1* | 6/2006 | Kumomi et al. ................ 257/57 |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0215945 | A1* | 9/2007 | Tokunaga et al. ............. 257/347 |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0067508 | A1* | 3/2008 | Endo et al. ...................... 257/43 |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0233848 | A1* | 9/2010 | Ohara ............... H01L 21/02554 438/104 |
| 2011/0114945 | A1* | 5/2011 | Yamazaki et al. ............... 257/43 |
| 2011/0127523 | A1* | 6/2011 | Yamazaki ........................ 257/43 |
| 2011/0133180 | A1* | 6/2011 | Yamazaki ........................ 257/43 |
| 2011/0140205 | A1 | 6/2011 | Sakata et al. |
| 2012/0241736 | A1 | 9/2012 | Imoto et al. |
| 2012/0241738 | A1 | 9/2012 | Imoto et al. |
| 2013/0187161 | A1 | 7/2013 | Yamazaki |
| 2013/0270549 | A1 | 10/2013 | Okazaki et al. |
| 2015/0194509 | A1 | 7/2015 | Ohara et al. |
| 2016/0240694 | A1 | 8/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-224479 | 10/2009 |
| JP | 2010-239131 A | 10/2010 |
| JP | 2011-009697 A | 1/2011 |
| JP | 2012-134475 A | 7/2012 |

(56) References Cited

FOREIGN PATENT DOCUMENTS

| WO | WO-2004/114391 | 12/2004 |
|----|----------------|---------|
| WO | WO-2010/103935 | 9/2010  |
| WO | WO-2012/073844 | 6/2012  |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—0 TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel Using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,",

(56) References Cited

OTHER PUBLICATIONS

SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2927-2959.

Meiboom.S et al., "Theory of the Blue Phase of Cholesteric Liquid Crystals,", Phys. Rev. Lett. (Physical Review Letters), May 1, 1984, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4306-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

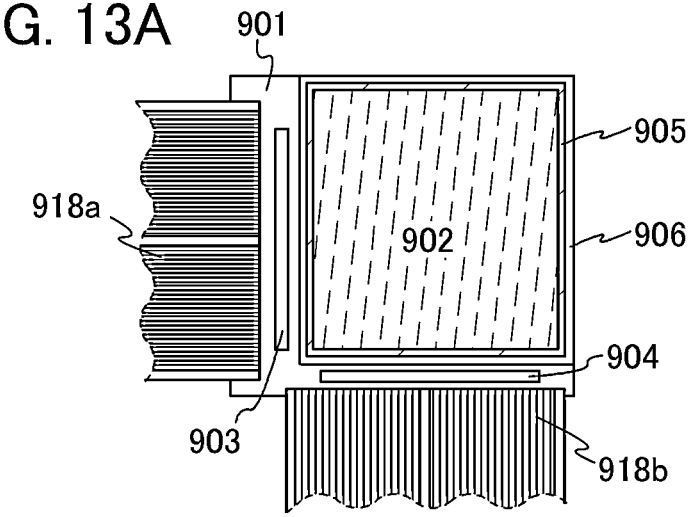
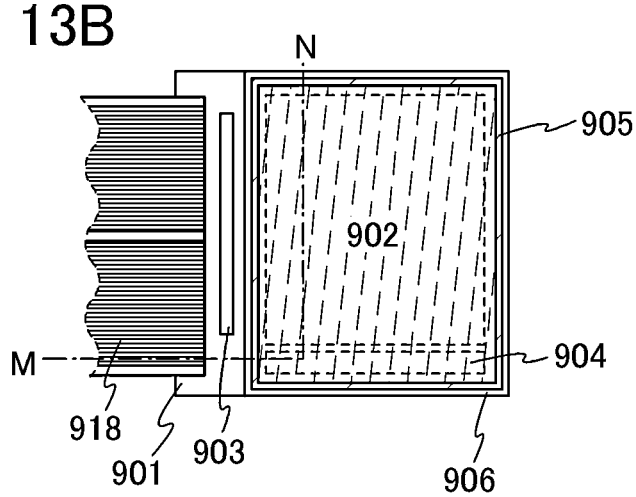
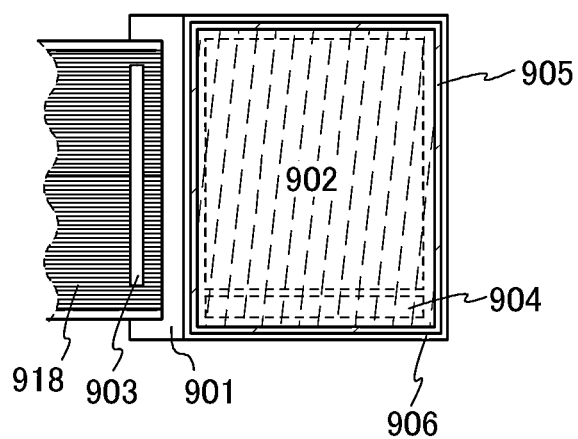

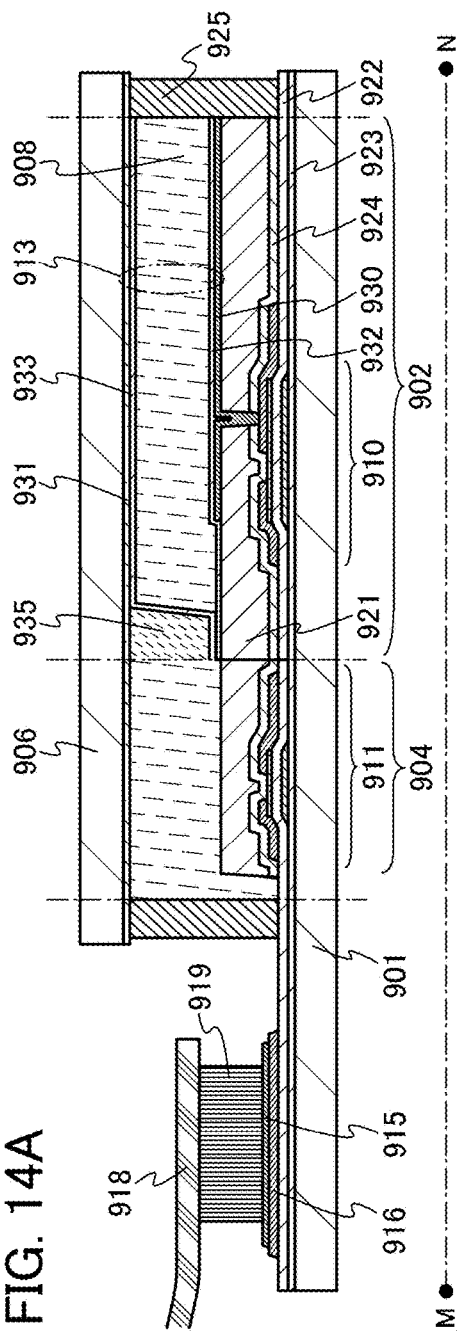
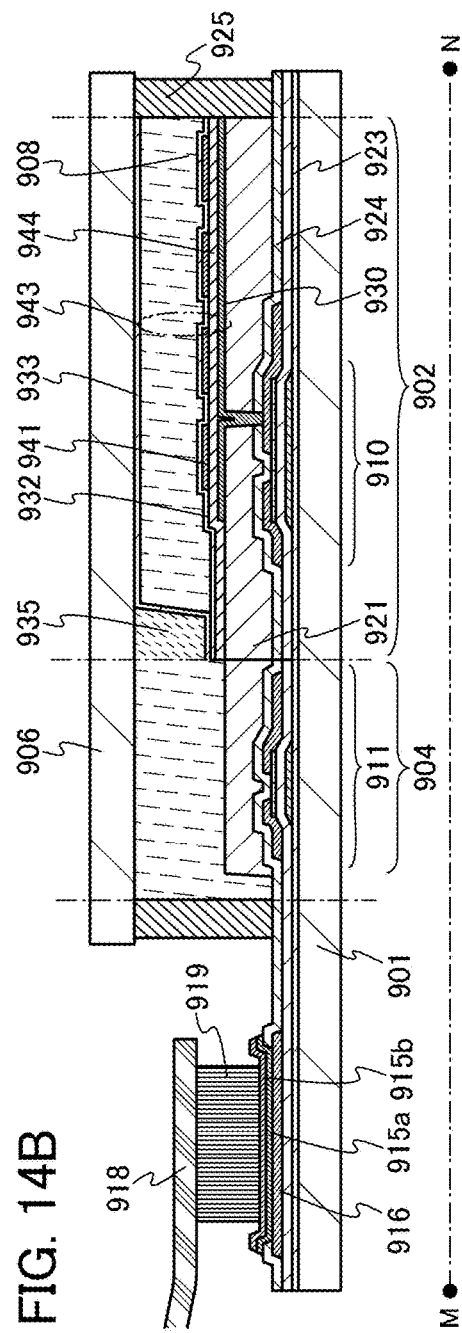

(※) below the lower limit of

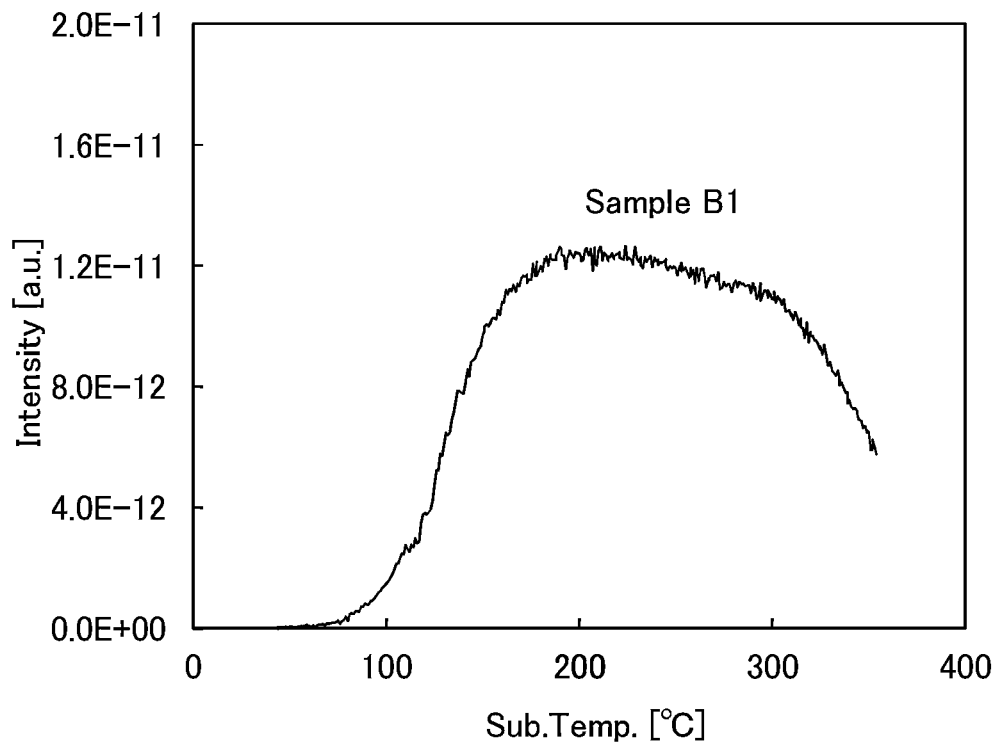
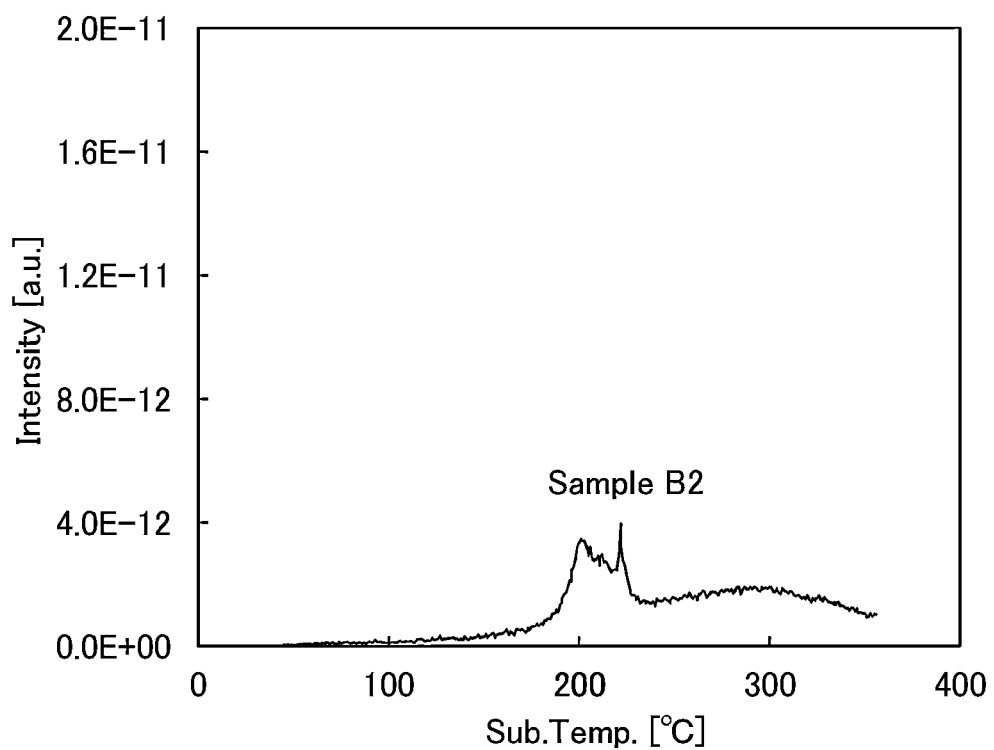

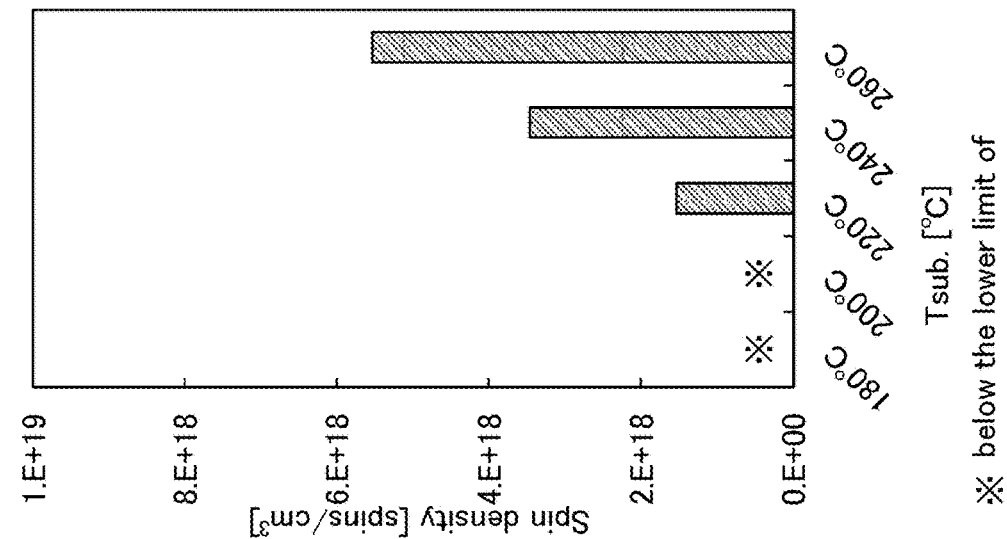
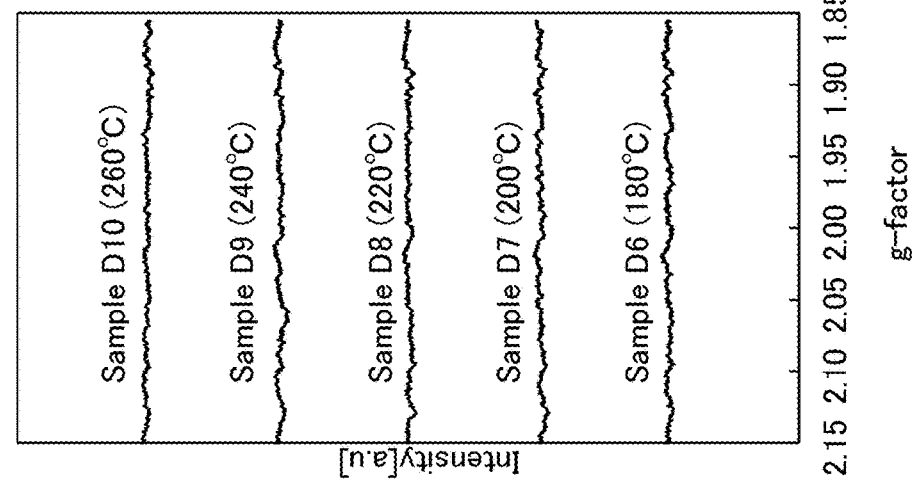
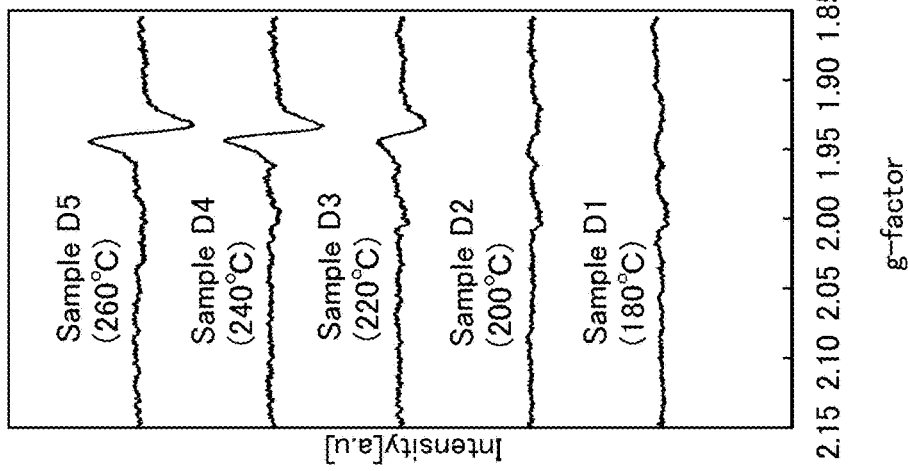

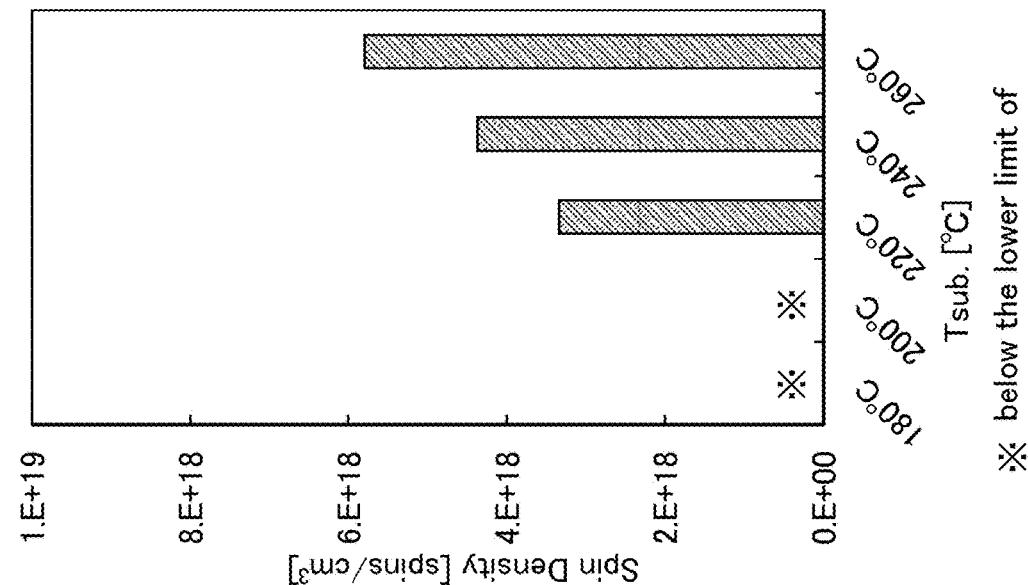
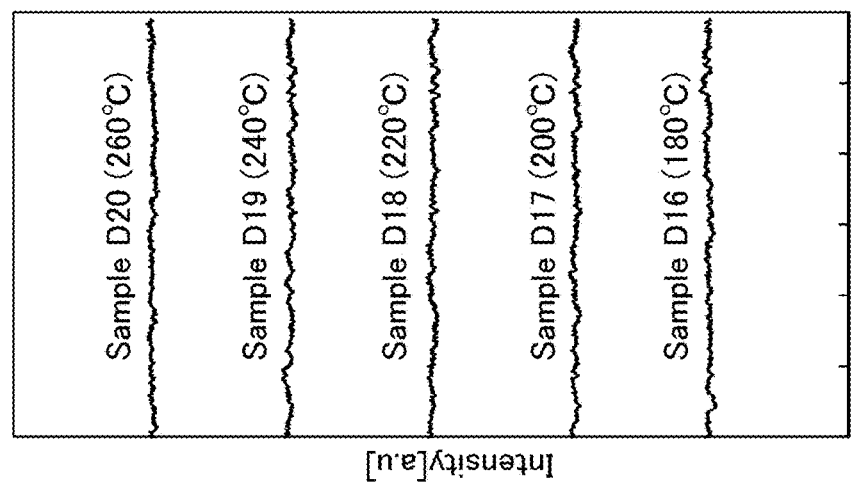
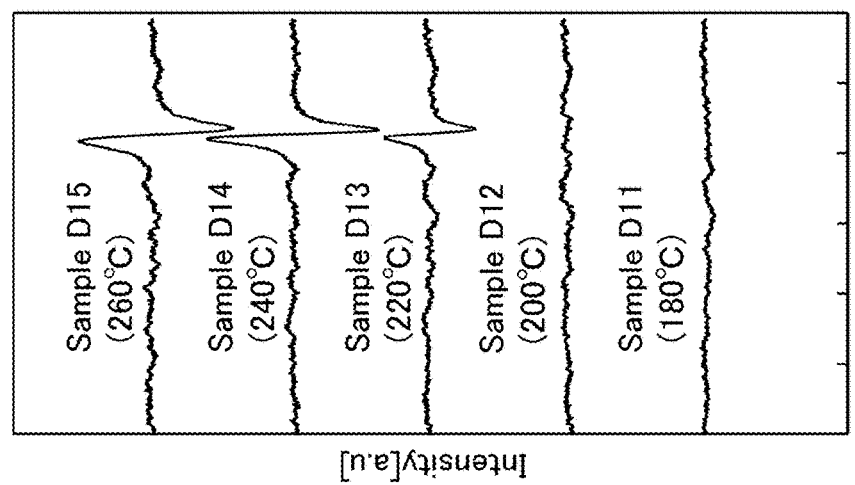

METHOD FOR MANUFACTURING OXIDE SEMICONDUCTOR TRANSISTOR WITH LOW-NITROGEN, LOW-DEFECT INSULATING FILM

BACKGROUND OF THE INVENTION

1. Field of the Invention

The present invention relates to a semiconductor device including a field-effect transistor and a method for manufacturing the semiconductor device.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, transistors formed using such silicon semiconductors are used in integrated circuits (ICs) and the like.

In recent years, attention has been drawn to a technique in which, instead of a silicon semiconductor, metal oxide exhibiting semiconductor characteristics is used for transistors. Note that in this specification, metal oxide exhibiting semiconductor characteristics is referred to as an oxide semiconductor.

For example, a technique is disclosed in which a transistor is manufactured using zinc oxide or In—Ga—Zn-based oxide as an oxide semiconductor and the transistor is used as a switching element or the like of a pixel of a display device (see Patent Documents 1 and 2).

Meanwhile, it has been pointed out that hydrogen behaves as a supply source of carriers particularly in an oxide semiconductor. Therefore, some measures need to be taken to prevent hydrogen from entering the oxide semiconductor at the time of forming the oxide semiconductor, and the amount of hydrogen in an oxide semiconductor film or a gate insulating film in contact with the oxide semiconductor film is reduced to suppress change of threshold voltage (see Patent Document 3).

REFERENCE

[Patent Document 1] Japanese Published Patent Application No. 2007-123861

[Patent Document 2] Japanese Published Patent Application No. 2007-096055

[Patent Document 3] Japanese Published Patent Application No. 2009-224479

SUMMARY OF THE INVENTION

Meanwhile, nitrogen behaves as a supply source of carriers in a manner similar to that of hydrogen. Therefore, when nitrogen enters an oxide semiconductor film, the carrier density of the oxide semiconductor film is increased; thus, change in electrical characteristics, typically a negative shift of the threshold voltage of a transistor including the oxide semiconductor film is caused. Further, there is a problem in that electrical characteristics fluctuate among the transistors.

In addition, in the case of providing an insulating film as a protective film over a transistor including an oxide semiconductor film, an oxide insulating film is preferably provided to reduce an interface state between the insulating film and the oxide semiconductor film. However, the oxide insulating film includes some defects when nitrogen is contained in the oxide insulating film. Further, due to the defects, there is a problem in electrical characteristics of the transistor including the oxide semiconductor film in that the amount of change in electrical characteristics, typically change of the threshold voltage of the transistor is increased due to change over time or a bias-temperature stress test (hereinafter also referred to as a BT stress test). Moreover, there is another problem in that the rising gate voltage (Vg) of the on-state current differs at a different drain voltage.

Further, in the case of providing an insulating film as a protective film over the transistor including the oxide semiconductor film by a plasma CVD method, plasma damage is caused to the oxide semiconductor film and the oxide semiconductor film has some defects. There is an oxygen vacancy as one of the defects included in the oxide semiconductor film, and when oxygen vacancies are included in the oxide semiconductor film, the transistor including the oxide semiconductor film has a problem in that change in electrical characteristics, typically a negative shift of the threshold voltage of the transistor including the oxide semiconductor film is caused.

Thus, one object of one embodiment of the present invention is to reduce the amount of nitrogen that is transferred to an oxide semiconductor film of a transistor including the oxide semiconductor film and reduce the amount of nitrogen in an oxide insulating film formed over the transistor. Another object of one embodiment of the present invention is to suppress change in electrical characteristics and improve reliability in a semiconductor device which includes a transistor including an oxide semiconductor film.

According to one embodiment of the present invention, a method for manufacturing a semiconductor device includes a step of forming a nitrogen-containing oxide insulating film over a transistor including an oxide semiconductor film where a channel region is formed, and a step of releasing nitrogen from the nitrogen-containing oxide insulating film by heat treatment.

The temperature of the heat treatment is a temperature at which nitrogen is released from the nitrogen-containing oxide insulating film, typically higher than or equal to 150° C. and lower than or equal to 500° C.

According to another embodiment of the present invention, in a semiconductor device which includes a transistor including an oxide semiconductor film where a channel region is formed and a nitrogen-containing oxide insulating film over the transistor, the nitrogen concentration of the nitrogen-containing oxide insulating film is greater than or equal to the lower limit of detection by secondary ion mass spectrometry (SIMS) and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$.

Note that the nitrogen-containing oxide insulating film may contain oxygen at a higher proportion than oxygen in the stoichiometric composition. In the case of forming the nitrogen-containing oxide insulating film by a plasma CVD method, as a source gas, a deposition gas containing silicon and nitrogen oxide such as dinitrogen monoxide or nitrogen dioxide serving as an oxidizing gas are used, so that oxidation reaction is promoted. Accordingly, a film containing oxygen at a higher proportion than oxygen in the stoichiometric composition, typically a nitrogen-containing oxide insulating film can be formed.

In the case of forming the oxide insulating film over the oxide semiconductor film where the channel region is formed by a plasma CVD method in which a deposition gas containing silicon and an oxidizing gas are used, nitrogen oxide such as dinitrogen monoxide or nitrogen dioxide is used as the oxidizing gas, whereby an oxide insulating film, typically a nitrogen-containing oxide insulating film can be formed while damage to the oxide semiconductor film is reduced.

It is possible to release nitrogen from the nitrogen-containing oxide insulating film by heat treatment after the nitrogen-containing oxide insulating film is formed over the transistor including the oxide semiconductor film where the channel region is formed, and the nitrogen concentration of the nitrogen-containing oxide insulating film subjected to the heat treatment is greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. Consequently, it is possible to reduce the amount of nitrogen that is transferred to the oxide semiconductor film.

According to the embodiments of the present invention, it is possible to suppress change in electrical characteristics and improve reliability in a transistor including an oxide semiconductor film where a channel region is formed.

BRIEF DESCRIPTION OF THE DRAWINGS

FIGS. 13A to 13C are top views each illustrating one embodiment of a display device.

FIGS. 14A and 14B are cross-sectional views each illustrating one embodiment of a display device.

FIGS. 21A and 21B show results of TDS measurement.

FIGS. 23A to 23C show results of ESR measurement.

FIGS. 24A to 24C show results of ESR measurement.

DETAILED DESCRIPTION OF THE INVENTION

Figure 1A:
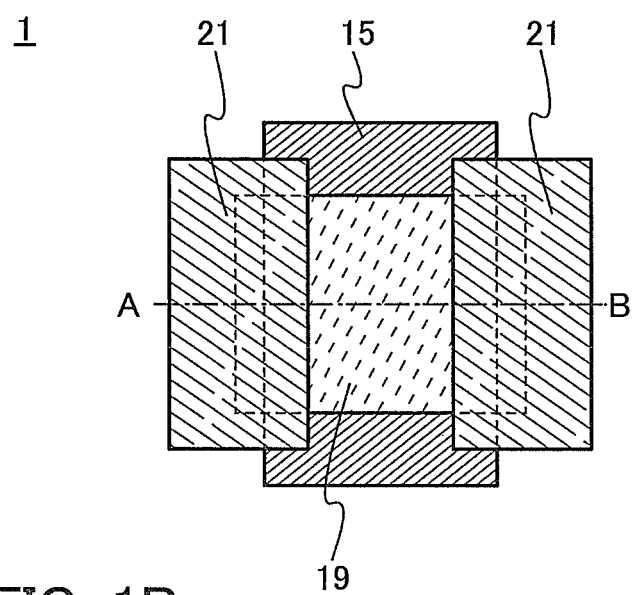
FIGS. 1A and 1B are a top view and a cross-sectional view illustrating one embodiment of a transistor.

Embodiments and examples of the present invention will be described below in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is in some cases exaggerated for clarity. Therefore, the embodiments and the examples of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor which can be regarded as having no drain current flowing therein when a gate voltage is 0 V is defined as a transistor having normally-off characteristics. In contrast, a transistor which can be regarded as having a drain current flowing therein when a gate voltage is 0 V is defined as a transistor having normally-on characteristics.

Embodiment 1

In this embodiment, a semiconductor device of one embodiment of the present invention and a method for manufacturing the semiconductor device will be described with reference to drawings.

Figure 1B:
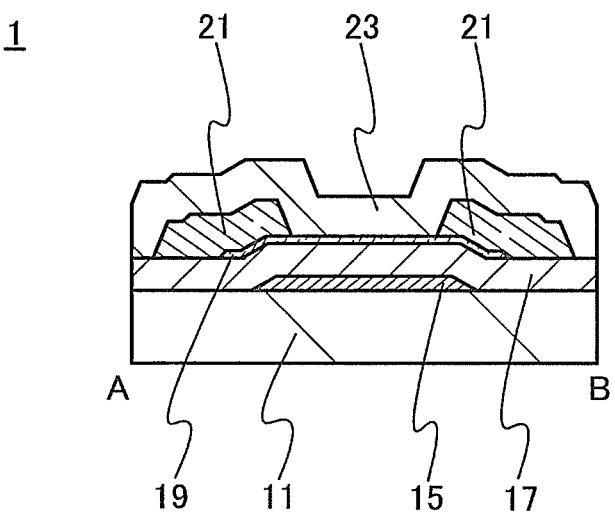

FIGS. 1A to 1B are a top view and a cross-sectional view of a transistor 1 of the semiconductor device. FIG. 1A is a top view of the transistor 1, and FIG. 1B is a cross-sectional view taken along dashed-dotted line A-B in FIG. 1A. Note that in FIG. 1A, a substrate 11, a gate insulating film 17, a nitrogen-containing oxide insulating film 23, and the like are omitted for simplicity.

The transistor 1 illustrated in FIGS. 1A and 1B includes a gate electrode 15 over the substrate 11, the gate insulating film 17 over the substrate 11 and the gate electrode 15, an oxide semiconductor film 19 overlapping with the gate electrode 15 with the gate insulating film 17 provided therebetween, and a pair of electrodes 21 in contact with the oxide semiconductor film 19. The nitrogen-containing oxide insulating film 23 is formed over the gate insulating film 17, the oxide semiconductor film 19, and the pair of electrodes 21.

The nitrogen concentration of the nitrogen-containing oxide insulating film 23 formed over the transistor 1 of this embodiment, which is obtained by secondary ion mass spectrometry (SIMS), is greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. Since the amount of nitrogen in the nitrogen-containing oxide insulating film 23 is small, the amount of nitrogen that is transferred to the oxide semiconductor film 19 of the transistor 1 is small. Further, the number of defects in the nitrogen-containing oxide insulating film is small.

Note that the nitrogen-containing oxide insulating film 23 may be an oxide insulating film containing oxygen at a higher proportion than oxygen in the stoichiometric composition, which will be described in Embodiment 2.

When the oxide semiconductor film 19 contains nitrogen, the oxide semiconductor film 19 easily has n-type conductivity by generation of electrons serving as carriers and an increase of carrier density. Thus, the transistor including the oxide semiconductor film 19 tends to have normally-on characteristics. For these reasons, the amount of nitrogen that enters the oxide semiconductor film 19 can be reduced by setting the nitrogen concentration of the nitrogen-containing oxide insulating film 23 formed over the oxide semiconductor film 19 to be greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. Accordingly, a negative shift of the threshold voltage of the transistor can be suppressed and fluctuation in electrical characteristics of the transistors can be reduced by reducing the amount of nitrogen in the oxide semiconductor film 19. Moreover, leakage current, typically an off-state current in a source and a drain of the transistor can be reduced. Further, the number of defects in the nitrogen-containing oxide insulating film 23, in particular, the number of defects at the interface between the oxide semiconductor film 19 and the nitrogen-containing oxide insulating film 23 and the number of defects in the nitrogen-containing oxide insulating film 23 near the oxide semiconductor film 19 can be reduced by reducing the nitrogen concentration of the nitrogen-containing oxide insulating film 23; and the amount of change in electrical characteristics of the transistor can be reduced and the rising gate voltage (Vg) of the on-state current can be made substantially the same at a different drain voltage.

A nitrogen-containing oxide insulating film having the above nitrogen concentration is preferably used as the nitrogen-containing oxide insulating film 23 in order to improve characteristics of the interface with the oxide semiconductor film 19. The nitrogen-containing oxide insulating film 23 can be formed using any of the following having a thickness of greater than or equal to 150 nm and less than or equal to 400 nm: nitrogen-containing silicon oxide (also described as silicon oxynitride in some cases); nitrogen-containing aluminum oxide (also described as aluminum oxynitride in some cases); nitrogen-containing hafnium oxide (also described as hafnium oxynitride in some cases); nitrogen-containing gallium oxide (also described as gallium oxynitride in some cases); nitrogen-containing Ga—Zn-based metal oxide; and the like.

Note that in this specification, a "silicon oxynitride film" refers to a film that contains oxygen at a higher proportion than nitrogen, and a "silicon nitride oxide film" refers to a film that contains nitrogen at a higher proportion than oxygen. As for an aluminum oxynitride film, a hafnium oxynitride film, a gallium oxynitride film, an aluminum nitride oxide film, a hafnium nitride oxide film, and a gallium nitride oxide film, the relation between the amount of nitrogen and the amount of oxygen is similar to that in a silicon oxynitride film and a silicon nitride oxide film.

Other details of the transistor 1 are described below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 11. Furthermore, any of these substrates further provided with a semiconductor element may be used as the substrate 11.

Still alternatively, a flexible substrate may be used as the substrate 11, and the transistor 1 may be provided directly on the flexible substrate. Alternatively, a separation layer may be provided between the substrate 11 and the transistor 1. The separation layer can be used when part or the whole of a semiconductor device formed over the separation layer is separated from the substrate 11 and transferred onto another substrate. In such a case, the transistor 1 can be transferred to a substrate having low heat resistance or a flexible substrate as well.

Note that a base insulating film may be provided between the substrate 11 and the gate electrode 15. Typical examples of the base insulating film are films of silicon oxide, silicon oxynitride, silicon nitride, silicon nitride oxide, gallium oxide, hafnium oxide, yttrium oxide, aluminum oxide, and aluminum oxynitride. Note that when a film of silicon nitride, gallium oxide, hafnium oxide, yttrium oxide, or aluminum oxide is used as the base insulating film, it is possible to suppress diffusion of impurities, typically an alkali metal, water, and hydrogen into the oxide semiconductor film 19 from the substrate 11.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. Further, the gate electrode 15 may have a single-layer structure or a stacked-layer structure of two or more layers. A single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order can be given as examples. Alternatively, a film, an alloy film, or a nitride film which contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the gate electrode 15 and the gate insulating film 17. These films each have a work function higher than or equal to 5 eV, preferably higher than or equal to 5.5 eV, which is higher than the electron affinity of an oxide semiconductor; thus, the threshold voltage of a transistor including an oxide semiconductor can be shifted in the positive direction. Accordingly, a switching element having what is called normally-off characteristics can be obtained. For example, in the case of using an In—Ga—Zn-based oxynitride film, an In—Ga—Zn-based oxynitride film whose nitrogen concentration is higher than at least the nitrogen concentration of the oxide semiconductor film 19, specifically, an In—Ga—Zn-based oxynitride film whose nitrogen concentration is higher than or equal to 7 at. % is used.

The gate insulating film 17 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film. Note that an oxide insulating film is preferably used for at least a region of the gate insulating film 17, which is in contact with the oxide semiconductor film 19, in order to improve characteristics of the interface with the oxide semiconductor film 19.

Further, it is possible to prevent outward diffusion of oxygen from the oxide semiconductor film 19 and entry of hydrogen, water, or the like into the oxide semiconductor film 19 from the outside by providing an insulating film having a blocking effect against oxygen, hydrogen, water, and the like for the gate insulating film 17. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples.

The gate insulating film 17 may be formed using a high-k material such as hafnium silicate (HfSi$_x$O$_y$), hafnium silicate containing nitrogen (HfSi$_x$O$_y$N$_z$), hafnium aluminate containing nitrogen (HfAl$_x$O$_y$N$_z$), hafnium oxide, or yttrium oxide, so that gate leakage current of the transistor can be reduced.

Moreover, it is preferable that the gate insulating film 17 have a stacked-layer structure including the following: a silicon nitride film with a small number of defects as a first silicon nitride film; a silicon nitride film with small amounts of released hydrogen and released ammonia as a second silicon nitride film over the first silicon nitride film; and any one of the oxide insulating films given above as examples of the gate insulating film 17 over the second silicon nitride film. In the second silicon nitride film, in thermal desorption spectrometry, the number of released hydrogen molecules is preferably less than $5\times10^{21}$ molecules/cm$^3$, more preferably less than or equal to $3\times10^{21}$ molecules/cm$^3$, further preferably less than or equal to $1\times10^{21}$ molecules/cm$^3$, and the number of released ammonia molecules is preferably less than $1\times10^{22}$ molecules/cm$^3$, more preferably less than or equal to $5\times10^{21}$ molecules/cm$^3$, further preferably less than or equal to $1\times10^{21}$ molecules/cm$^3$. The first silicon nitride film and the second silicon nitride film are used as part of the gate insulating film 17, so that a gate insulating film with a small number of defects and small amounts of released hydrogen and released ammonia can be formed as the gate insulating film 17. Consequently, it is possible to reduce the amount of hydrogen and nitrogen in the gate insulating film 17, which are transferred to the oxide semiconductor film 19.

In the case where the trap level (also referred to as interface level) is present at the interface between an oxide semiconductor film and a gate insulating film or in the gate insulating film in a transistor including an oxide semiconductor, change of the threshold voltage, typically a negative shift of the threshold voltage of the transistor and an increase in the subthreshold swing (S value) showing a gate voltage needed for changing the drain current by one digit when the transistor is turned on are caused. Thus, there is a problem in that electrical characteristics fluctuate among the transistors. For this reason, when, as the gate insulating film 17, the silicon nitride film with a small number of defects is used, and the oxide insulating film is provided in a region of the gate insulating film 17, which is in contact with the oxide semiconductor film 19, a negative shift of the threshold voltage and an increase of an S value can be suppressed.

The thickness of the gate insulating film 17 is preferably greater than or equal to 5 nm and less than or equal to 400 nm, more preferably greater than or equal to 10 nm and less than or equal to 300 nm, further preferably greater than or equal to 50 nm and less than or equal to 250 nm.

The oxide semiconductor film 19 preferably contains at least indium (In) or zinc (Zn). Alternatively, the oxide semiconductor film 19 preferably contains both In and Zn. In order to reduce fluctuations in electrical characteristics of the transistors including the oxide semiconductor, the oxide semiconductor preferably contains one or more of stabilizers in addition to In and Zn.

As for stabilizers, gallium (Ga), tin (Sn), hafnium (Hf), aluminum (Al), and zirconium (Zr) can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

As the oxide semiconductor, for example, the following can be used: indium oxide, tin oxide, or zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Note that, for example, an In—Ga—Zn-based metal oxide means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material represented by $In/MO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3). Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8) may be used. Note that in the atomic ratio of the metal elements, there is a margin of error of ±20% of the above atomic ratios.

However, the composition is not limited to those described above, and a material having the appropriate composition may be used depending on needed semiconductor characteristics and electrical characteristics (e.g., field-effect mobility and threshold voltage). In order to obtain needed semiconductor characteristics, it is preferable that the carrier density, the impurity concentration, the defect density, the atomic ratio of a metal element and oxygen, the interatomic distance, the density, and the like be set to be appropriate.

For example, a high mobility can be obtained relatively easily in the case where the In—Sn—Zn-based metal oxide is used. However, the mobility can be increased by reducing the defect density in the bulk also in the case where the In—Ga—Zn-based metal oxide is used.

Further, the energy gap of a metal oxide that can form the oxide semiconductor film 19 is greater than or equal to 2 eV, preferably greater than or equal to 2.5 eV, more preferably greater than or equal to 3 eV. In this manner, the off-state current of the transistor can be reduced by using an oxide semiconductor having a wide energy gap.

Note that the oxide semiconductor film 19 may have an amorphous structure, a single crystal structure, or a polycrystalline structure.

As the oxide semiconductor film 19, a c-axis aligned crystalline oxide semiconductor (CAAC-OS) film including crystallized parts may be used.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

In a transistor using the CAAC-OS film, change in electrical characteristics due to irradiation with visible light or ultraviolet light is small. Thus, the transistor has high reliability.

Alternatively, the oxide semiconductor film 19 may have a stacked-layer structure of a plurality of oxide semiconductor films. For example, the oxide semiconductor film 19 may have a stacked-layer structure of a first oxide semiconductor film and a second oxide semiconductor film which are formed using metal oxides with different compositions. Alternatively, for example, the first oxide semiconductor film may be formed using any of two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be made the same and the atomic ratios of the constituent elements of the first oxide semiconductor film and the second oxide semiconductor film may be made different. For example, the first oxide semiconductor film may contain In, Ga, and Zn at an atomic ratio of 1:1:1, and the second oxide semiconductor film may contain In, Ga, and Zn at an atomic ratio of 3:1:2. Alternatively, the first oxide semiconductor film may contain In, Ga, and Zn at an atomic ratio of 1:3:2, and the second oxide semiconductor film may contain In, Ga, and Zn at an atomic ratio of 2:1:3. Note that in the atomic ratio of the metal elements in each oxide semiconductor film, there is a margin of error of ±20% of the above atomic ratios.

At this time, one of the first oxide semiconductor film and the second oxide semiconductor film, which is closer to the gate electrode (on the channel side), preferably contains In and Ga at a proportion satisfying the relation In>Ga. The other oxide semiconductor film, which is farther from the gate electrode (on the back channel side) preferably contains In and Ga at a proportion satisfying the relation In≤Ga.

Further, the oxide semiconductor film 19 may have a three-layer structure of a first oxide semiconductor film, a second oxide semiconductor film, and a third oxide semiconductor film, in which the constituent elements thereof are made the same and the atomic ratios of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

In an oxide semiconductor film which contains less In than Ga and Zn at an atomic ratio, typically the first oxide semiconductor film containing In, Ga, and Zn at an atomic ratio of 1:3:2, an oxygen vacancy is less likely to occur than in an oxide semiconductor film containing more In than Ga and Zn at an atomic ratio, typically the second oxide semiconductor film, and an oxide semiconductor film containing Ga, Zn, and In at the same atomic ratio, typically the third oxide semiconductor film. Accordingly, an increase in carrier density can be suppressed.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film 19 has the above structure, the amount of change of the threshold voltage of the transistor due to change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion satisfying the relation In>Ga has higher mobility than an oxide containing In and Ga at a proportion satisfying the relation In≤Ga. Further, in Ga, the formation energy of an oxygen vacancy is larger and thus an oxygen vacancy is less likely to occur, than in In; therefore, the oxide containing In and Ga at a proportion satisfying the relation In≤Ga has more stable characteristics than the oxide containing In and Ga at a proportion satisfying the relation In>Ga.

An oxide semiconductor containing In and Ga at a proportion of In>Ga is used on the channel side, and an oxide semiconductor containing In and Ga at a proportion satisfying the relation In≤Ga is used on the back channel side; so that field-effect mobility and reliability of the transistor can be further improved.

Further, the first oxide semiconductor film, the second oxide semiconductor film, and the third oxide semiconductor film may be formed using oxide semiconductors having different crystallinity. That is, the oxide semiconductor film 19 may be formed using a combination of any of a single crystal oxide semiconductor, a polycrystalline oxide semiconductor, an amorphous oxide semiconductor, and a CAAC-OS, as appropriate. When an amorphous oxide semiconductor is applied to any one of the first oxide semiconductor film, the second oxide semiconductor film, and the third oxide semiconductor film, internal stress or external stress of the oxide semiconductor film 19 is relieved, change in characteristics of the transistor is reduced, and reliability of the transistor can be further improved.

The thickness of the oxide semiconductor film 19 is preferably greater than or equal to 1 nm and less than or equal to 100 nm, more preferably greater than or equal to 1 nm and less than or equal to 50 nm, still more preferably greater than or equal to 1 nm and less than or equal to 30 nm, further preferably greater than or equal to 3 nm and less than or equal to 20 nm.

The concentration of alkali metals or alkaline earth metals in the oxide semiconductor film 19, which is obtained by secondary ion mass spectrometry (SIMS), is preferably lower than or equal to $1 \times 10^{18}$ atoms/cm$^3$, more preferably lower than or equal to $2 \times 10^{16}$ atoms/cm$^3$. This is because, when alkali metals or alkaline earth metals are bonded to an oxide semiconductor, some of the alkali metals or the alkaline earth metals generate carriers and cause an increase in the off-state current of the transistor.

Hydrogen contained in the oxide semiconductor film 19 reacts with oxygen bonded to a metal atom to produce water, and a defect is formed in a lattice from which oxygen is released (or a portion from which oxygen is released). In addition, reaction of hydrogen and oxygen causes generation of electrons serving as carrier. Therefore, in the oxide semiconductor film 19, the hydrogen concentration which is obtained by SIMS is preferably less than $5 \times 10^{18}$ atoms/cm$^3$, more preferably less than or equal to $1 \times 10^{18}$ atoms/cm$^3$, still more preferably less than or equal to $5 \times 10^{17}$ atoms/cm$^3$, further preferably less than or equal to $1 \times 10^{16}$ atoms/cm$^3$.

Hydrogen contained in the oxide semiconductor film 19 reacts with oxygen bonded to a metal atom to produce water, and a defect is formed in a lattice from which oxygen is released (or a portion from which oxygen is released). In addition, a bond between part of hydrogen and oxygen causes generation of electrons serving as carriers. Thus, the impurities containing hydrogen are reduced as much as possible in the formation process of the oxide semiconductor film, whereby the hydrogen concentration of the oxide semiconductor film can be reduced. Accordingly, the oxide semiconductor film from which hydrogen is removed as much as possible is used for a channel region, whereby a negative shift of the threshold voltage of the transistor can be suppressed and fluctuation in electrical characteristics of the transistors can be reduced. Moreover, leakage current, typically an off-state current in the source and the drain of the transistor can be reduced.

Further, the nitrogen concentration of the oxide semiconductor film 19 is less than or equal to $5 \times 10^{18}$ atoms/cm$^3$, whereby a negative shift of the threshold voltage of the transistor can be suppressed and fluctuation in electrical characteristics of the transistor can be reduced.

Note that the oxide semiconductor film can be highly purified by reducing the amount of hydrogen as much as possible. It can be proved through various experiments that a transistor whose channel region is formed in a highly purified oxide semiconductor film has a small off-state current. For example, even when an element has a channel width of $1 \times 10^6$ μm and a channel length of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode ranging from 1 V to 10 V. In that case, it can be found that a value obtained by dividing the off-state current by the channel width of the transistor is less than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film has been used for a channel region of the transistor, and the off-state current of the transistor has been measured from change in the amount of charge of the capacitor per unit time. As a result, it is found that in the case where the voltage between the source electrode and the drain electrode of the transistor is 3 V, a smaller off-state current of several tens of yoctoamperes per micrometer (yA/μm) can be obtained. Consequently, the transistor whose channel region is formed in the highly purified oxide semiconductor film has an extremely small off-state current.

The pair of electrodes 21 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used.

Note that although the pair of electrodes 21 is provided between the oxide semiconductor film 19 and the nitrogen-containing oxide insulating film 23 in this embodiment, the pair of electrodes 21 may be provided between the gate insulating film 17 and the oxide semiconductor film 19.

Next, a method for manufacturing the transistor 1 illustrated in FIGS. 1A and 1B is described with reference to FIGS. 2A to 2E.

Figure 2A:
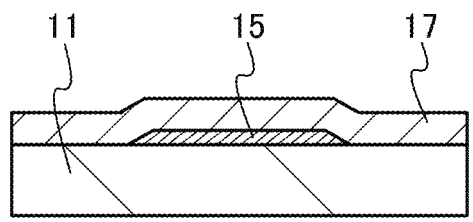
FIGS. 2A to 2E are cross-sectional views illustrating one embodiment of a method for manufacturing a transistor.

As illustrated in FIG. 2A, the gate electrode 15 is formed over the substrate 11, and the gate insulating film 17 is formed over the gate electrode 15.

A formation method of the gate electrode 15 is described below. First, a conductive film is formed by a sputtering method, a CVD method, an evaporation method, or the like and then a mask is formed over the conductive film by a photolithography process. Then, part of the conductive film is etched using the mask to form the gate electrode 15. After that, the mask is removed.

Note that instead of the above formation method, the gate electrode 15 may be formed by an electrolytic plating method, a printing method, an ink-jet method, or the like.

Here, a 100-nm-thick tungsten film is formed by a sputtering method. Then, a mask is formed by a photolithography process and the tungsten film is dry-etched using the mask to form the gate electrode 15.

The gate insulating film 17 is formed by a sputtering method, a CVD method, an evaporation method, or the like.

In the case of forming the gate insulating film 17 using a silicon oxide film or a silicon oxynitride film by a CVD method, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case of forming a film in which silicon nitride films having a stacked-layer structure and an oxide insulating film are stacked as the gate insulating film 17, it is preferable to stack the silicon nitride films by a two-step formation method. First, a first silicon nitride film with a small number of defects is formed by a plasma CVD method in which a mixed gas of silane, nitrogen, and ammonia is used as a source gas. Next, a silicon nitride film with small amounts of released hydrogen and released ammonia can be formed as a second silicon nitride film in such a manner that nitrogen, ammonia, and a deposition gas containing silicon are used as a source gas and the flow ratio of nitrogen to ammonia is set to be greater than or equal to 10:1 and less than or equal to 50:1, preferably greater than or equal to 20:1 and less than or equal to 40:1. With such a formation method, a silicon nitride film with a small number of defects and with small amounts of released hydrogen and released ammonia can be formed as the gate insulating film 17.

Moreover, in the case of forming a gallium oxide film as the gate insulating film 17, a metal organic chemical vapor deposition (MOCVD) method can be employed.

Here, the gate insulating film 17 in which a 300-nm-thick first silicon nitride film, a 50-nm-thick second silicon nitride film, and a 50-nm-thick silicon oxynitride film are stacked is formed by a plasma CVD method.

Figure 2B:
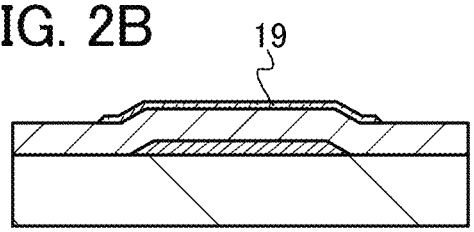

Next, as illustrated in FIG. 2B, the oxide semiconductor film 19 is formed over the gate insulating film 17.

A formation method of the oxide semiconductor film 19 is described below. An oxide semiconductor film is formed over the gate insulating film 17 by a sputtering method, a coating method, a pulsed laser deposition method, a laser ablation method, or the like. Then, after a mask is formed over the oxide semiconductor film by a photolithography process, the oxide semiconductor film is partly etched using the mask. Accordingly, the oxide semiconductor film 19 which is over the gate insulating film 17 and subjected to element isolation so as to partly overlap with the gate electrode 15 is formed as illustrated in FIG. 2B. After that, the mask is removed.

Alternatively, by employing a printing method for forming the oxide semiconductor film 19, the oxide semiconductor film 19 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, an atmosphere of a rare gas (typically argon), oxygen, or a mixed gas of a rare gas and oxygen is used as appropriate. In the case of the mixed atmosphere of a rare gas and oxygen, the proportion of oxygen to a rare gas is preferably higher.

Note that the target may be selected as appropriate depending on the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

A CAAC-OS film is formed by, for example, a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby the CAAC-OS film can be deposited.

For the deposition of the CAAC-OS film, the following conditions are preferably employed.

By suppressing entry of impurities into the CAAC-OS film during the deposition, the crystal state can be prevented from being broken by the impurities. For example, reducing the concentration of impurities (e.g., hydrogen, water, carbon dioxide, and nitrogen) which exist in the deposition chamber is favorable. Furthermore, the concentration of impurities in a deposition gas can be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than the strain point of the substrate, preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn-based metal oxide target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

After the oxide semiconductor film is formed, dehydrogenation or dehydration may be performed by heat treatment. The heat treatment is performed typically at a temperature higher than or equal to 150° C. and lower than or equal to 500° C., preferably higher than or equal to 250° C. and lower than or equal to 450° C., more preferably higher than or equal to 300° C. and lower than or equal to 450° C.

The heat treatment is performed in an atmosphere of an inert gas including nitrogen or a rare gas such as helium, neon, argon, xenon, or krypton. Alternatively, the heat treatment may be performed first in an atmosphere of an inert gas and then in an oxygen atmosphere. It is preferable that the above atmosphere of an inert gas and oxygen atmosphere do not contain hydrogen, water, and the like. The treatment time is 3 minutes to 24 hours.

An electric furnace, an RTA apparatus, or the like can be used for the heat treatment. With the use of the RTA apparatus, the heat treatment can be performed at a temperature higher than or equal to the strain point of the substrate if the heating time is short. Therefore, the heat treatment time can be shortened.

The heat treatment is performed after the oxide semiconductor film is formed, whereby the hydrogen concentration of the oxide semiconductor film can be less than $5 \times 10^{18}$ atoms/cm$^3$, preferably less than or equal to $1 \times 10^{18}$ atoms/cm$^3$, more preferably less than or equal to $5 \times 10^{17}$ atoms/cm$^3$, further preferably less than or equal to $1 \times 10^{16}$ atoms/cm$^3$.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere of nitrogen and oxygen, whereby the oxide semiconductor film 19 is formed.

Figure 2C:
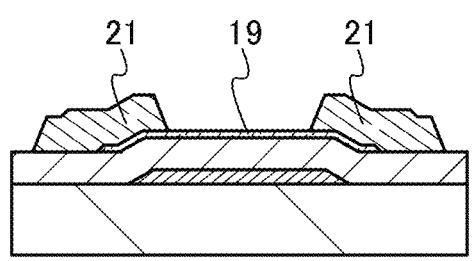

Next, as illustrated in FIG. 2C, the pair of electrodes 21 is formed.

A formation method of the pair of electrodes 21 is described below. First, a conductive film is formed by a sputtering method, a CVD method, an evaporation method, or the like. Then, a mask is formed over the conductive film by a photolithography process. After that, the conductive film is etched using the mask to form the pair of electrodes 21. After that, the mask is removed.

Here, a 50-nm-thick tungsten film, a 400-nm-thick aluminum film, and a 100-nm-thick titanium film are sequentially stacked by a sputtering method. Then, a mask is formed over the titanium film by a photolithography process and the tungsten film, the aluminum film, and the titanium film are dry-etched using the mask to form the pair of electrodes 21.

After the pair of electrodes 21 is formed, cleaning treatment is preferably performed to remove an etching residue. A short circuit of the pair of electrodes 21 can be suppressed by this cleaning treatment. The cleaning treatment can be performed using an alkaline solution such as a tetramethylammonium hydroxide (TMAH) solution; an acidic solution such as a hydrofluoric acid solution or an oxalic acid solution; or water.

Next, a nitrogen-containing oxide insulating film 22 is formed over the oxide semiconductor film 19 and the pair of electrodes 21. The nitrogen-containing oxide insulating film 22 is formed by a sputtering method, a CVD method, an evaporation method, or the like. In the case of forming the nitrogen-containing oxide insulating film 22 by a plasma CVD method, a deposition gas containing silicon and an oxidizing gas are preferably used as a source gas. Typical examples of the deposition gas containing silicon include silane, disilane, trisilane, and silane fluoride. As the oxidizing gas, nitrogen oxide such as dinitrogen monoxide and nitrogen dioxide can be given as examples. With the use of the nitride oxide such as dinitrogen monoxide and nitrogen dioxide as the oxidizing gas, the nitrogen-containing oxide insulating film 22 can be formed while damage to the oxide semiconductor film 19 is reduced. Moreover, plasma generated in an atmosphere of nitrogen oxide such as dinitrogen monoxide and nitrogen dioxide has strong oxidizing power than plasma generated in an oxygen atmosphere; therefore, it is possible to contain oxygen in the nitrogen-containing oxide insulating film 22 at a higher proportion than oxygen in the stoichiometric composition. Note that when oxygen is used as the oxidizing gas, a particle is generated and the yield is decreased; however, when nitrogen oxide such as dinitrogen monoxide and nitrogen dioxide is used as the oxidizing gas, generation of a particle can be suppressed.

Further, when nitrogen oxide such as dinitrogen monoxide and nitrogen dioxide is used as the oxidizing gas, the nitrogen-containing oxide insulating film 22, in which a slight amount of nitrogen is contained, is formed.

Here, as the nitrogen-containing oxide insulating film 22, a nitrogen-containing silicon oxide film is formed by a plasma CVD method.

Next, nitrogen is released from the nitrogen-containing oxide insulating film 22 by heat treatment to reduce the nitrogen concentration of the nitrogen-containing oxide insulating film 22. As a result, the nitrogen-containing oxide insulating film 23 whose nitrogen concentration is greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$ can be formed as illustrated in FIG. 2E. The heat treatment is performed typically at a temperature higher than or equal to 150° C. and lower than or equal to 500° C., preferably higher than or equal to 200° C. and lower than or equal to 450° C., more preferably higher than or equal to 300° C. and lower than or equal to 450° C. Nitrogen of the nitrogen-containing oxide insulating film 22 can be released by the heat treatment. Note that water, hydrogen, or the like can be eliminated from the nitrogen-containing oxide insulating film 22 by the heat treatment.

Here, the heat treatment is performed at 350° C. in a mixed atmosphere of nitrogen and oxygen for one hour.

Here, models for the transfer of nitrogen, hydrogen, and water in the oxide semiconductor film 19 and the nitrogen-containing oxide insulating film 22 by heat treatment are described with reference to FIGS. 3A to 3D and FIGS. 4A to 4E. Note that in FIGS. 3A to 3D and FIGS. 4A to 4E, a dotted-line arrow indicates the transfer of each atom, and a solid arrow indicates change during heat treatment or change before and after heat treatment. As the nitrogen-containing oxide insulating film 22, an oxide insulating film containing oxygen at a higher proportion than oxygen in the stoichiometric composition is used.

FIGS. 3A to 3D show the models which mainly occur by heat treatment in the nitrogen-containing oxide insulating film 22.

Figure 3A:
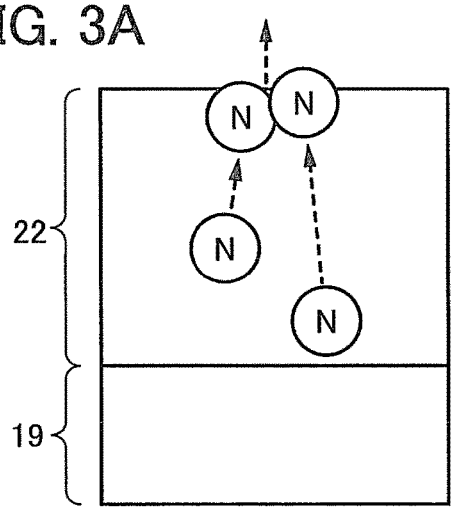
FIGS. 3A to 3D are models for the transfer of nitrogen, hydrogen, and water in a nitrogen-containing oxide insulating film by heat treatment.

FIG. 3A shows the behavior of a nitrogen atom by heat treatment. In this model, nitrogen atoms (here, two nitrogen atoms) contained in the nitrogen-containing oxide insulating film 22 are bonded to each other by the heat treatment in the nitrogen-containing oxide insulating film 22 or on the surface thereof and are eliminated from the nitrogen-containing oxide insulating film 22 as a nitrogen molecule.

Figure 3B:
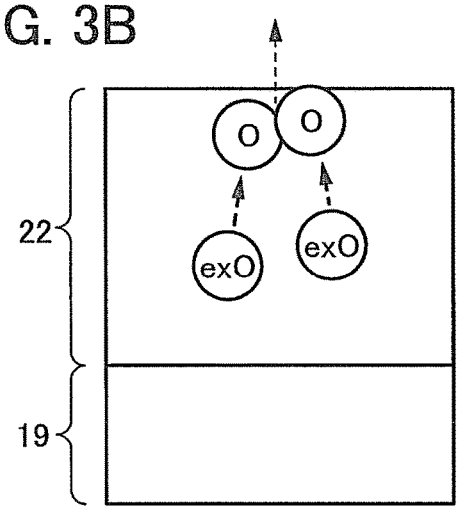

FIG. 3B shows the behavior of an oxygen atom by heat treatment. In this model, an excess of oxygen atoms exO (here, two oxygen atoms) over oxygen in the stoichiometric composition, which are contained in the nitrogen-containing oxide insulating film 22, are bonded to each other by the heat treatment in the nitrogen-containing oxide insulating film 22 or on the surface thereof and are eliminated from the nitrogen-containing oxide insulating film 22 as an oxygen molecule.

Figure 3C:
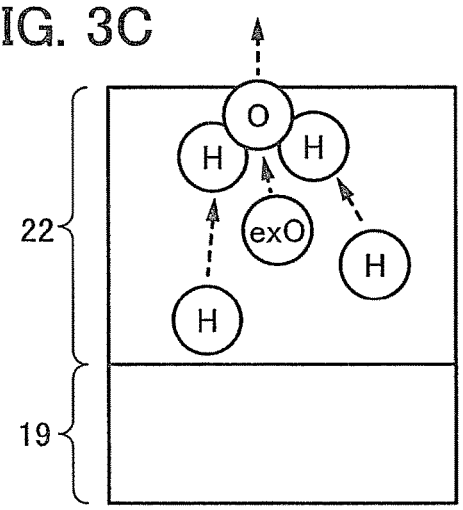

FIG. 3C shows the behavior of a hydrogen atom and an oxygen atom by heat treatment. In this model, hydrogen atoms (here, two hydrogen atoms) and an excess of oxygen atoms exO over oxygen in the stoichiometric composition, which are contained in the nitrogen-containing oxide insulating film 22, are bonded to each other by the heat treatment in the nitrogen-containing oxide insulating film 22 or on the surface thereof and are eliminated from the nitrogen-containing oxide insulating film 22 as a water molecule.

Figure 3D:
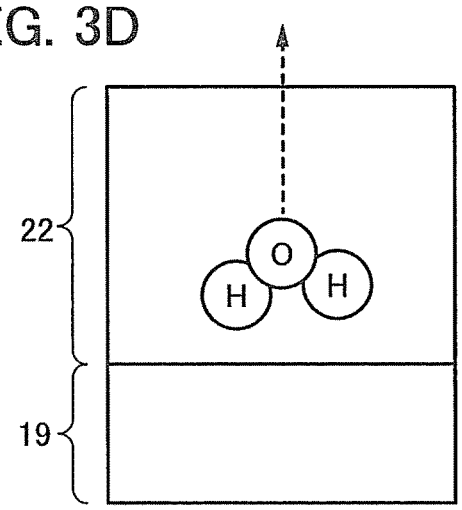

FIG. 3D shows the behavior of a water molecule by heat treatment. A water molecule contained in the nitrogen-containing oxide insulating film 22 is eliminated from the nitrogen-containing oxide insulating film 22 by the heat treatment.

From the above models, at least one of nitrogen, hydrogen, and water is eliminated from the nitrogen-containing oxide insulating film 22 by heat treatment, so that the amount of at least one of nitrogen, hydrogen, and water in the film can be reduced.

Next, a model which can occur by heat treatment in the oxide semiconductor film 19 is described with reference to FIGS. 4A to 4E.

Figure 4A:
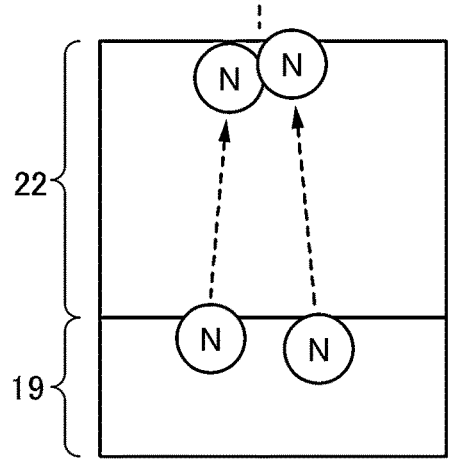
FIGS. 4A to 4E are models for the transfer of nitrogen, hydrogen, and water in an oxide semiconductor film by heat treatment.

FIG. 4A shows the behavior of a nitrogen atom by heat treatment. This is a model in which nitrogen atoms N (here, two nitrogen atoms) contained in the oxide semiconductor film 19 are bonded to each other by the heat treatment in the oxide semiconductor film 19, at the interface between the oxide semiconductor film 19 and the nitrogen-containing oxide insulating film 22, or in the nitrogen-containing oxide insulating film 22 or on the surface thereof and are eliminated from the oxide semiconductor film 19 as a nitrogen molecule.

Figure 4B:
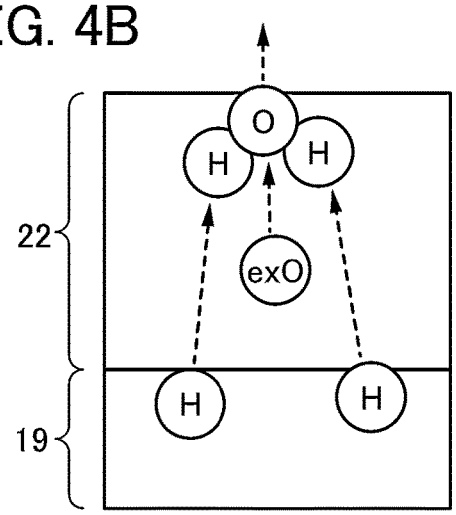

FIG. 4B shows one behavior of a hydrogen atom and an oxygen atom by heat treatment. In this model, hydrogen atoms H (here, two hydrogen atoms) contained in the oxide semiconductor film 19 are transferred to the nitrogen-containing oxide insulating film 22 by the heat treatment, are then bonded to an excess of oxygen atoms exO over oxygen in the stoichiometric composition in the nitrogen-containing oxide insulating film 22 or on the surface thereof, and are eliminated from the nitrogen-containing oxide insulating film 22 as a water molecule.

Figure 4C:
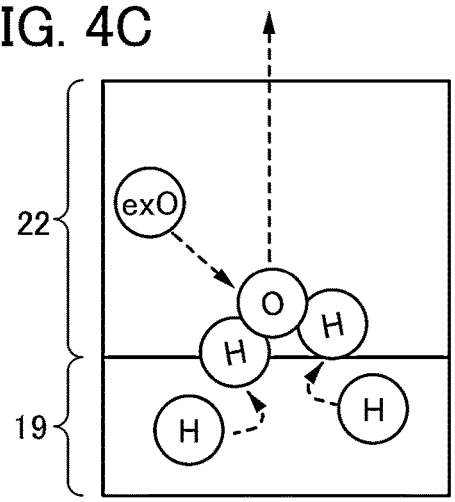

FIG. 4C shows another behavior of a hydrogen atom and an oxygen atom by heat treatment. This is a model in which hydrogen atoms H contained in the oxide semiconductor film 19 and an excess of oxygen atoms exO over oxygen in the stoichiometric composition are bonded to each other by the heat treatment in the oxide semiconductor film 19 or at the interface between the oxide semiconductor film 19 and the nitrogen-containing oxide insulating film 22 and are eliminated from the nitrogen-containing oxide insulating film 22 as a water molecule.

Figure 4D:
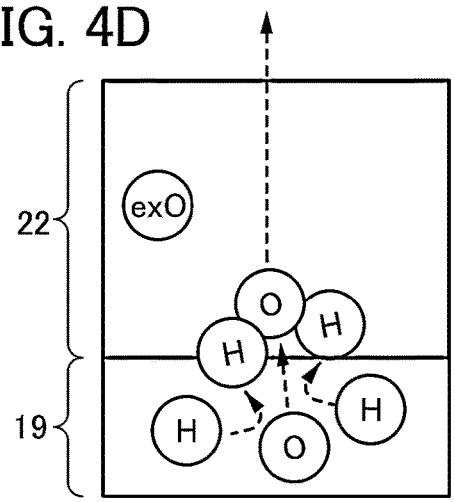
Figure 4E:
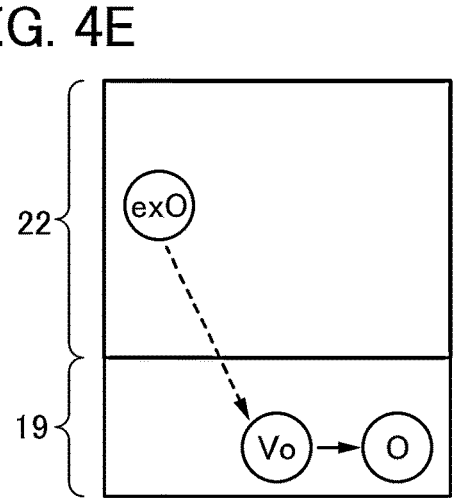

FIGS. 4D and 4E each show another behavior of a hydrogen atom and an oxygen atom by heat treatment. This is a model in which hydrogen atoms H and an oxygen atom O which are contained in the oxide semiconductor film 19 are bonded to each other by the heat treatment in the oxide semiconductor film 19, at the interface between the oxide semiconductor film 19 and the nitrogen-containing oxide insulating film 22, or in the nitrogen-containing oxide insulating film 22 or on the surface thereof and are released from the nitrogen-containing oxide insulating film 22 as a water molecule. At this time, in the oxide semiconductor film 19, an excess of oxygen atoms exO over oxygen in the stoichiometric composition, which is contained in the nitrogen-containing oxide insulating film 22, is transferred to a vacancy of the oxygen atom after its release, which is an oxygen vacancy Vo as shown in FIG. 4E, and compensates the oxygen vacancy Vo; accordingly, the excess of oxygen atoms exO becomes an oxygen atom O.

As described above, at least one of nitrogen, hydrogen, and water is eliminated from the oxide semiconductor film 19 by heat treatment, so that the amount of at least one of nitrogen, hydrogen, and water in the film can be reduced.

Note that after the step of forming the pair of electrodes 21 over the oxide semiconductor film 19, which is illustrated in FIG. 2C, an oxide semiconductor film having few oxygen vacancies may be formed by exposing the oxide semiconductor film 19 to plasma generated in an oxygen atmosphere and supplying oxygen to the oxide semiconductor film 19. As the oxidizing gas, oxygen, ozone, dinitrogen monoxide, and nitrogen dioxide can be given as examples. Further, in the plasma treatment, the oxide semiconductor film 19 is preferably exposed to plasma generated with no bias applied to the substrate 11 side. Consequently, the oxide semiconductor film 19 can be supplied with oxygen without being damaged; accordingly, the number of oxygen vacancies in the oxide semiconductor film 19 can be reduced. Moreover, impurities remaining on the surface of the oxide semiconductor film 19 due to etching treatment at the time of forming the pair of electrodes 21, for example, a halogen such as fluorine or chlorine can be removed.

Through the above process, the nitrogen-containing oxide insulating film 23 whose nitrogen concentration is low can be formed over the transistor including the oxide semiconductor film, as illustrated in FIG. 2E. Moreover, a transistor in which change in the electrical characteristics is suppressed and the reliability is improved can be manufactured.

Modified Example

A modified example of the transistor illustrated in FIGS. 1A and 1B is described with reference to FIG. 5.

Figure 5:
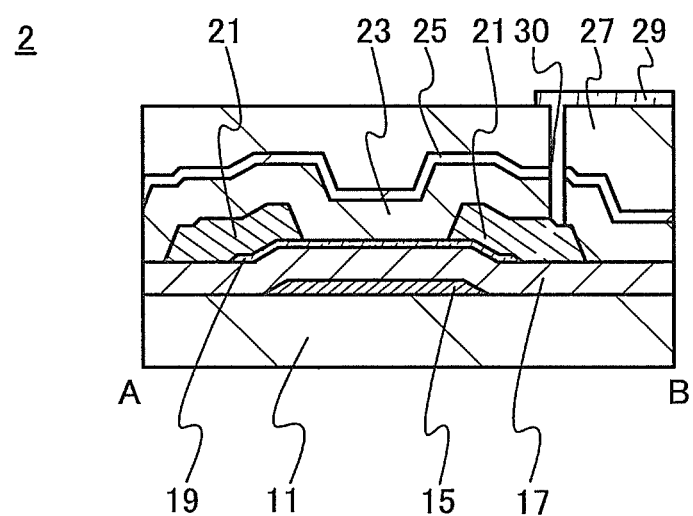
FIG. 5 is a cross-sectional view illustrating one embodiment of a transistor.

FIG. 5 is a cross-sectional view of a transistor 2 of the semiconductor device. The transistor 2 illustrated in FIG. 5 includes the gate electrode 15 over the substrate 11, the gate insulating film 17 over the substrate 11 and the gate electrode 15, the oxide semiconductor film 19 overlapping with the gate electrode 15 with the gate insulating film 17 provided therebetween, and the pair of electrodes 21 in contact with the oxide semiconductor film 19. The nitrogen-containing oxide insulating film 23 is formed over the gate insulating film 17, the oxide semiconductor film 19, and the pair of electrodes 21, and a nitride insulating film 25 is formed over the nitrogen-containing oxide insulating film 23. In addition, a planarization film 27 is formed over the nitride insulating film 25. In an opening 30 formed in the nitrogen-containing oxide insulating film 23, the nitride insulating film 25, and the planarization film 27, a conductive film 29 connected to one of the pair of electrodes 21 may be provided.

As the nitride insulating film 25, a silicon nitride film, a silicon nitride oxide film, an aluminum nitride film, an aluminum nitride oxide film, or the like having a thickness greater than or equal to 50 nm and less than or equal to 200 nm can be formed. Note that the amounts of hydrogen and nitrogen in the nitride insulating film 25, which are transferred to the oxide semiconductor film 19, can be reduced by providing, as the nitride insulating film 25, the silicon nitride film with small amounts of released hydrogen and released ammonia, which is given as an example of the gate insulating film 17.

The planarization film 27 can be formed using an organic material such as an acrylic resin, an epoxy resin, a benzocyclobutene resin, polyimide, or polyamide. Note that the planarization film may be formed by stacking a plurality of insulating films formed using any of these materials.

Note that it is preferable to provide the nitride insulating film 25 between the nitrogen-containing oxide insulating film 23 and the planarization film 27 because adhesion between the nitride insulating film 25 and the planarization film 27 is improved.

The conductive film 29 can be formed using, as appropriate, the material of the pair of electrodes 21. In addition, the conductive film 29 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Through the above process, the nitrogen-containing oxide insulating film whose nitrogen concentration is low can be formed over the transistor including the oxide semiconductor film. Moreover, a transistor in which change in the electrical characteristics is suppressed and the reliability is improved can be manufactured.

Note that the structures, methods, and the like described in this embodiment can be used as appropriate in combination with any of the structures, methods, and the like described in the other embodiments and examples.

Embodiment 2

In this embodiment, a structure of a transistor and a protective film in which the transfer of nitrogen to an oxide semiconductor film is suppressed and oxygen vacancies in the oxide semiconductor film can be reduced will be described with reference to FIG. 6. Note that the description about the same structures as those in Embodiment 1 will be omitted.

In a transistor including an oxide semiconductor film where a channel region is formed, part of oxygen vacancies which are one example of defects in the oxide semiconductor film serve as donors to generate electrons serving as carriers. Thus, the oxide semiconductor film has lower resistance, which results in poor electrical characteristics of the transistor. For example, the threshold voltage of a transistor including an oxide semiconductor film which includes oxygen vacancies tends to shift in the negative direction, and thus the transistor tends to have normally-on characteristics. This tendency occurs remarkably in oxygen vacancies caused on the back channel side. Note that in this embodiment, the back channel refers to the side of the oxide semiconductor film 19, which is opposite to the side facing to the gate electrode 15, that is, the vicinity of the interface of the oxide semiconductor film 19 with a nitrogen-containing oxide insulating film 24a.

Further, when an oxide semiconductor film includes oxygen vacancies, there is a problem in that the amount of change in electrical characteristics, typically change of the threshold voltage of the transistor is increased due to change over time or a bias-temperature stress test (hereinafter also referred to as a BT stress test).

Therefore, in this embodiment, a transistor with excellent electrical characteristics in which a negative shift of the threshold voltage is suppressed and a manufacturing method thereof are described. In addition, a highly reliable transistor in which the amount of change in electrical characteristics due to change over time or a BT photostress test is small and a manufacturing method thereof are described.

Figure 6:
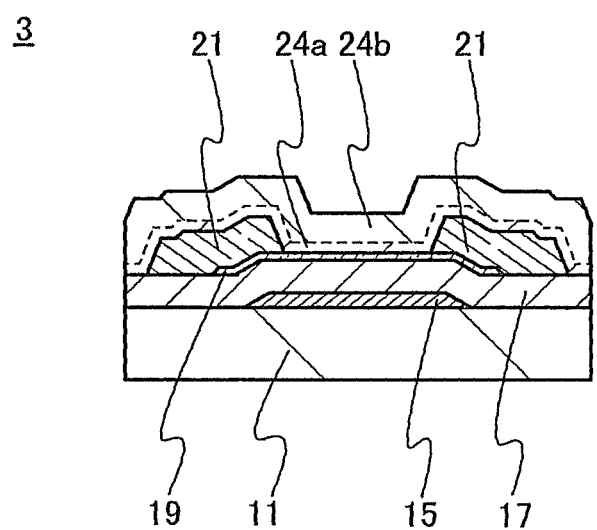
FIG. 6 is a cross-sectional view illustrating one embodiment of a transistor.

FIG. 6 is a cross-sectional view of a transistor 3 of the semiconductor device. The transistor 3 illustrated in FIG. 6 includes the gate electrode 15 over the substrate 11, the gate insulating film 17 over the substrate 11 and the gate electrode 15, the oxide semiconductor film 19 overlapping with the gate electrode 15 with the gate insulating film 17 provided therebetween, and the pair of electrodes 21 in contact with the oxide semiconductor film 19. The nitrogen-containing oxide insulating film 24a and a nitrogen-containing oxide insulating film 24b are formed over the gate insulating film 17, the oxide semiconductor film 19, and the pair of electrodes 21. Note that although the nitrogen-containing oxide insulating film 24a and the nitrogen-containing oxide insulating film 24b are stacked here over the transistor 3, only one of the nitrogen-containing oxide insulating film 24a and the nitrogen-containing oxide insulating film 24b may be formed.

Further, the nitrogen-containing oxide insulating film 24a is formed to be in contact with the oxide semiconductor film 19 in the transistor 3 of this embodiment. As the nitrogen-containing oxide insulating film 24a, an oxide insulating film transmitting oxygen is formed. Note that the nitrogen-containing oxide insulating film 24a also functions as a film which relieves damage to the oxide semiconductor film 19 at the time of forming the nitrogen-containing oxide insulating film 24b later.

As the oxide insulating film transmitting oxygen, a silicon oxynitride film or the like having a thickness greater than or equal to 5 nm and less than or equal to 150 nm, preferably greater than or equal to 5 nm and less than or equal to 50 nm, more preferably greater than or equal to 10 nm and less than or equal to 30 nm can be formed.

Further, it is preferable that the number of defects in the nitrogen-containing oxide insulating film 24a be small, typically the spin density of a signal due to a dangling bond of silicon, which appears when g is 2.001, be lower than or equal to $3\times10^{17}$ spins/cm$^3$ by ESR measurement. This is because, when defect density in the nitrogen-containing oxide insulating film 24a is high, oxygen may be bonded to the defect and the amount of oxygen transmitting through the nitrogen-containing oxide insulating film 24a is decreased.

Further, it is preferable that the number of defects at the interface between the nitrogen-containing oxide insulating film 24a and the oxide semiconductor film 19 be small, typically the spin density of a signal due to an oxygen vacancy in the oxide semiconductor film, which appears when g is 1.93, be lower than or equal to $1\times10^{17}$ spins/cm$^3$, more preferably lower than or equal to the lower limit of detection by ESR measurement.

Note that all oxygen atoms entering the nitrogen-containing oxide insulating film 24a from the outside are not transferred to the outside of the nitrogen-containing oxide insulating film 24a and some oxygen remains in the nitrogen-containing oxide insulating film 24a in some cases. Further, oxygen enters the nitrogen-containing oxide insulating film 24a and oxygen contained in the nitrogen-containing oxide insulating film 24a is transferred to the outside of the nitrogen-containing oxide insulating film 24a, whereby the transfer of oxygen in the nitrogen-containing oxide insulating film 24a occurs in some cases.

By forming the oxide insulating film transmitting oxygen as the nitrogen-containing oxide insulating film 24a, oxygen released from the nitrogen-containing oxide insulating film 24b which is provided over the nitrogen-containing oxide insulating film 24a, which contains oxygen at a higher proportion than oxygen in the stoichiometric composition, can be transferred to the oxide semiconductor film 19 through the nitrogen-containing oxide insulating film 24a.

The nitrogen-containing oxide insulating film 24b is formed to be in contact with the nitrogen-containing oxide insulating film 24a. The nitrogen-containing oxide insulating film 24b is formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis.

As the nitrogen-containing oxide insulating film 24a, a silicon oxide film or a silicon oxynitride film can be formed under the conditions as follows: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 200 Pa with introduction of a source gas into the treatment chamber, and high-frequency power is supplied to an electrode provided in the treatment chamber.

Note that when the ratio of the amount of the oxidizing gas to the amount of the deposition gas containing silicon is 100 or higher, the amount of hydrogen in the nitrogen-containing oxide insulating film 24b can be reduced. Consequently, the amount of hydrogen entering the nitrogen-containing oxide insulating film 24b can be reduced; thus, a negative shift of the threshold voltage of the transistor can be suppressed.

As the nitrogen-containing oxide insulating film 24b, a silicon oxide film, a silicon oxynitride film, or the like having a thickness greater than or equal to 30 nm and less than or equal to 500 nm, preferably greater than or equal to 50 nm and less than or equal to 400 nm can be formed.

Further, it is preferable that the number of defects in the nitrogen-containing oxide insulating film 24b be small, typically the spin density of a signal due to a dangling bond of silicon, which appears when g is 2.001, be lower than or equal to $1.5 \times 10^{18}$ spins/cm$^3$, more preferably lower than or equal to $1 \times 10^{18}$ spins/cm$^3$ by ESR measurement. Note that the nitrogen-containing oxide insulating film 24b is provided more apart from the oxide semiconductor film 19 than the nitrogen-containing oxide insulating film 24a is; thus, the nitrogen-containing oxide insulating film 24b may have higher defect density than the nitrogen-containing oxide insulating film 24a.

As the nitrogen-containing oxide insulating film 24b, a silicon oxynitride film is formed under the conditions as follows: the substrate placed in a treatment chamber of the plasma CVD apparatus, which is vacuum-evacuated, is held at a temperature higher than or equal to 180° C. and lower than or equal to 260° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions of the nitrogen-containing oxide insulating film 24b, the high-frequency power having the above power density is supplied to the treatment chamber having the above pressure, whereby the degradation efficiency of the source gas in plasma is increased, oxygen radicals are increased, and oxidation of the source gas is promoted; therefore, oxygen is contained in the nitrogen-containing oxide insulating film 24b at a higher proportion than oxygen in the stoichiometric composition. On the other hand, the bond between silicon and oxygen is weak in the film formed at the above substrate temperature range; therefore, part of oxygen in the film is released by heat treatment in the later step. Thus, it is possible to form an oxide insulating film which contains oxygen at a higher proportion than oxygen in the stoichiometric composition and from which part of oxygen is released by heating. Moreover, the nitrogen-containing oxide insulating film 24a is provided over the oxide semiconductor film 19. Therefore, in the step of forming the nitrogen-containing oxide insulating film 24b, the nitrogen-containing oxide insulating film 24a functions as a film which relieves damage to the oxide semiconductor film 19. Consequently, the nitrogen-containing oxide insulating film 24b can be formed using the high-frequency power having a high power density while damage to the oxide semiconductor film 19 is reduced.

The oxide insulating film containing oxygen at a higher proportion than oxygen in the stoichiometric composition is formed as the nitrogen-containing oxide insulating film 24b, whereby oxygen can be transferred to the oxide semiconductor film 19 and thus oxygen vacancies in the oxide semiconductor film 19 can be reduced. Alternatively, the nitrogen-containing oxide insulating film 24b is formed over the nitrogen-containing oxide insulating film 24a while heating the nitrogen-containing oxide insulating film 24b, whereby oxygen is transferred to the oxide semiconductor film 19 and thus oxygen vacancies in the oxide semiconductor film 19 can be reduced. Further alternatively, the nitrogen-containing oxide insulating film 24b is formed over the nitrogen-containing oxide insulating film 24a and then is subjected to heat treatment, whereby oxygen is transferred to the oxide semiconductor film 19 and thus oxygen vacancies in the oxide semiconductor film 19 can be reduced.

Next, models for the change of oxygen vacancies in the oxide semiconductor film 19 by heat treatment are described with reference to FIGS. 7A to 7C. Note that in FIGS. 7A to 7C, a dotted-line arrow indicates the transfer of each atom, and a solid arrow indicates change before and after heat treatment.

When an excess of oxygen atoms over oxygen in the stoichiometric composition is transferred to the oxide semiconductor film 19, a first oxygen atom is pushed out by the excess of oxygen atoms over oxygen in the stoichiometric composition from the place of the first oxygen atom. The first oxygen atom which has been pushed out is transferred to the place of a second oxygen atom and the second oxygen atom is pushed out. In this manner, when an excess of oxygen atoms over that in the stoichiometric composition is transferred to the oxide semiconductor film 19, oxygen atoms are sequentially pushed out among the plurality of oxygen atoms. In FIGS. 7A to 7C, sequentially pushing out of oxygen atoms among the plurality of oxygen atoms is not shown, and models for the change of oxygen vacancies are described using three oxygen vacancies (Vo_1, Vo_2, and Vo_3) in the oxide semiconductor film 19 and oxygen contained in the nitrogen-containing oxide insulating film 24b, typically an excess of oxygen atoms over oxygen in the stoichiometric composition (exO_1, exO_2, and exO_3).

Figure 7A:
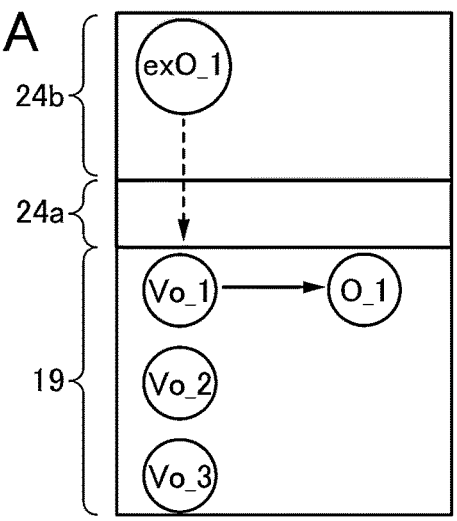
FIGS. 7A to 7C are models for the change of oxygen vacancies in an oxide semiconductor film by heat treatment.

FIG. 7A shows reaction between an oxygen vacancy Vo_1 and an oxygen atom exO_1 by heat treatment. The oxygen vacancy Vo_1 in the oxide semiconductor film 19 becomes an oxygen atom O_1 in such a manner that an excess of oxygen atoms exO_1 over oxygen in the stoichiometric composition is transferred by heat treatment to compensate the oxygen vacancy Vo_1.

Figure 7B:
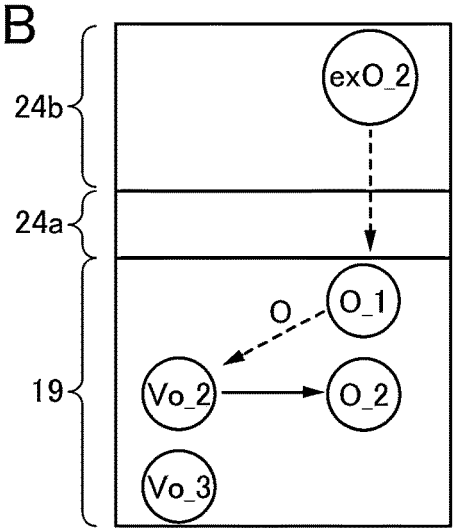

Next, as illustrated in FIG. 7B, when an excess of oxygen atoms exO_2 over oxygen in the stoichiometric composition gets closer to the place of the oxygen atom O_1 contained in the oxide semiconductor film 19, an oxygen atom O is released from the place of the oxygen atom O_1. The released oxygen atom O is transferred to an oxygen vacancy Vo_2 and compensates the oxygen vacancy Vo_2; accordingly, the released oxygen atom O becomes an oxygen atom O_2. On the other hand, an oxygen atom exO_2 is transferred to a vacancy of the oxygen atom O_1 after its release, which is an oxygen vacancy, and compensates the oxygen vacancy; accordingly, the oxygen atom exO_2 becomes an oxygen atom O_1.

Figure 7C:
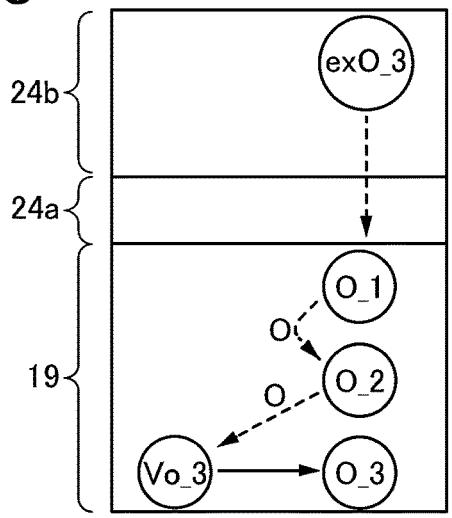

Next, as illustrated in FIG. 7C, when an excess of oxygen atoms exO_3 over oxygen in the stoichiometric composition gets closer to the place of the oxygen atom O_1 contained in the oxide semiconductor film 19, an oxygen atom O is released from the place of the oxygen atom O_1. The released oxygen atom O is transferred to the place of the oxygen atom O_2. An oxygen atom O is released from the oxygen atom O_2. An oxygen vacancy Vo_3 is compensated with the released oxygen atom O and becomes an oxygen atom O_3. On the other hand, an oxygen atom exO_2 is transferred to a vacancy of the oxygen atom O_1 after its release, which is an oxygen vacancy, and compensates the oxygen vacancy; accordingly, the oxygen atom exO_2 becomes oxygen atom O_1. Further, the oxygen atom released from the oxygen atom O_1 is transferred to a vacancy of the oxygen atom O_2 after its release, which is also an oxygen vacancy, and compensates the oxygen vacancy; accordingly, the oxygen atom becomes an oxygen atom O_2.

Through the above process, oxygen in the nitrogen-containing oxide insulating film 24b can compensate oxygen vacancies in the oxide semiconductor film 19. Further, not only an oxygen vacancy on the surface of the oxide semiconductor film 19 but also an oxygen vacancy in the film can be compensated by heat treatment. As described above, the nitrogen-containing oxide insulating film 24b is formed while heating it or heat treatment is performed after the nitrogen-containing oxide insulating film 24b is provided, whereby the number of oxygen vacancies in the oxide semiconductor film 19 can be reduced.

When an oxide insulating film which contains oxygen at a higher proportion than oxygen in the stoichiometric composition is provided over a back channel of the oxide semiconductor film 19 with an oxide insulating film transmitting oxygen, which is provided therebetween as the nitrogen-containing oxide insulating film 24a, oxygen can be transferred to the back channel side of the oxide semiconductor film 19, and oxygen vacancies on the back channel side can be reduced.

In the case where the oxide semiconductor film 19 is not damaged in the step of forming the nitrogen-containing oxide insulating film 24b, the nitrogen-containing oxide insulating film 24a is not provided and only the nitrogen-containing oxide insulating film 24b which is an oxide insulating film containing oxygen at a higher proportion than oxygen in the stoichiometric composition may be provided as a protective film.

Through the above process, a transistor in which change in the electrical characteristics is suppressed and the reliability is improved can be manufactured. Moreover, a highly reliable transistor in which the amount of change in electrical characteristics, typically the amount of change of the threshold voltage are small due to change over time or a BT photostress test can be manufactured.

Note that the structures, methods, and the like described in this embodiment can be used as appropriate in combination with any of the structures, methods, and the like described in the other embodiments and examples.

Embodiment 3

In this embodiment, a transistor having a structure different from that of Embodiment 1 and Embodiment 4 will be described with reference to FIG. 8. A transistor 4 of this embodiment includes a plurality of gate electrodes facing each other with an oxide semiconductor film provided therebetween.

Figure 8:
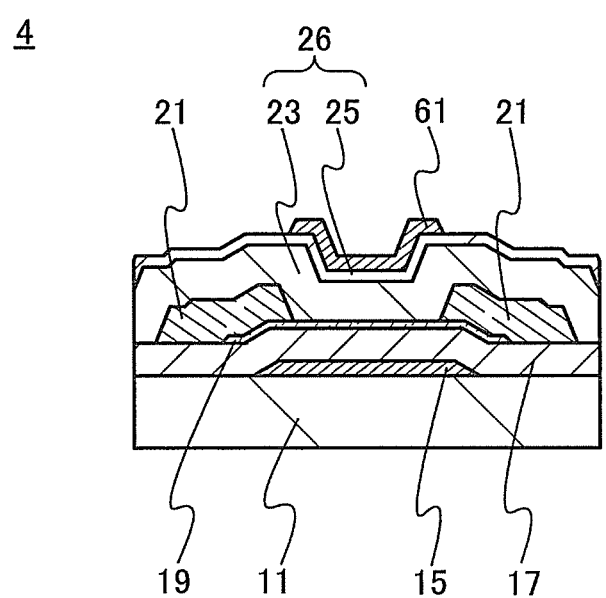
FIG. 8 is a cross-sectionals view illustrating one embodiment of a transistor.

The transistor 4 illustrated in FIG. 8 includes the gate electrode 15 over the substrate 11, the gate insulating film 17 over the substrate 11 and the gate electrode 15, the oxide semiconductor film 19 overlapping with the gate electrode 15 with the gate insulating film 17 provided therebetween, and the pair of electrodes 21 in contact with the oxide semiconductor film 19. A gate insulating film 26 including the nitrogen-containing oxide insulating film 23 and the nitride insulating film 25 is formed over the gate insulating film 17, the oxide semiconductor film 19, and the pair of electrodes 21. Further, a gate electrode 61 overlapping with the oxide semiconductor film 19 with the gate insulating film 26 provided therebetween is included.

The gate electrode 61 can be formed in a manner similar to that of the gate electrode 15 of Embodiment 1.

The transistor 5 of this embodiment includes the gate electrode 15 and the gate electrode 61 facing each other with the oxide semiconductor film 19 provided therebetween. By application of different potentials to the gate electrode 15 and the gate electrode 61, the threshold voltage of the transistor 5 can be controlled. Alternatively, when the same potential is applied to the gate electrode 15 and the gate electrode 61, the on-state current of the transistor 5 can be increased. A nitride insulating film in which, in thermal desorption spectroscopy, the number of released hydrogen molecules is less than $5\times10^{21}$ molecules/cm$^3$, preferably less than or equal to $3\times10^{21}$ molecules/cm$^3$, more preferably less than or equal to $1\times10^{21}$ molecules/cm$^3$ and the number of released ammonia molecules is less than $1\times10^{22}$ molecules/cm$^3$, preferably less than or equal to $5\times10^{21}$ molecules/cm$^3$, more preferably less than or equal to $1\times10^{21}$ molecules/cm$^3$ is provided between the oxide semiconductor film 19 and the gate electrode 61, whereby the amounts of hydrogen and ammonia which are transferred from the nitride insulating film to the oxide semiconductor film 19 can be made small and the concentrations of hydrogen and nitrogen in the oxide semiconductor film 19 can be reduced. Further, the nitride insulating film 25 is provided between the oxide semiconductor film 19 and the gate electrode 61; therefore, entry of water from the outside into the oxide semiconductor film 19 can be suppressed. In other words, entry of hydrogen contained in water into the oxide semiconductor film 19 can be suppressed. As a result, a negative shift of the threshold voltage can be suppressed and fluctuation in electrical characteristics can be reduced.

Note that the structures, methods, and the like described in this embodiment can be used as appropriate in combination with any of the structures, methods, and the like described in the other embodiments and examples.

Embodiment 4

In this embodiment, a transistor having a structure different from that of Embodiment 1 and Embodiment 2 will be described with reference to FIGS. 9A to 9C. Transistors 5 and 6 of this embodiment are each a top-gate transistor, which is different from the transistors in Embodiment 1 and Embodiment 2.

Figure 9A:
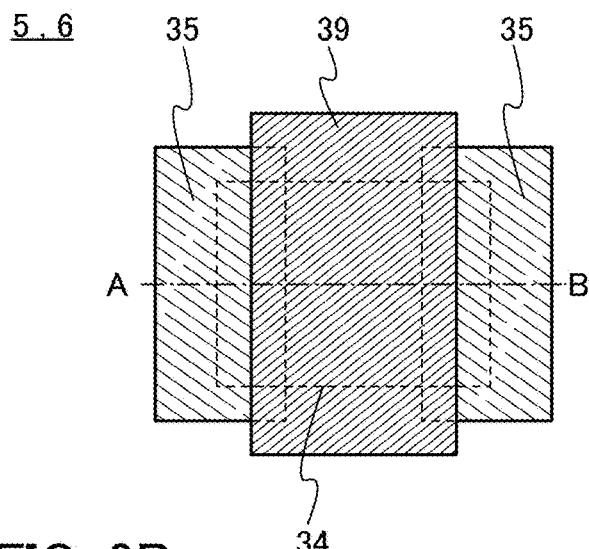
FIGS. 9A to 9C are a top view and cross-sectional views illustrating one embodiment of a transistor.
Figure 9B:
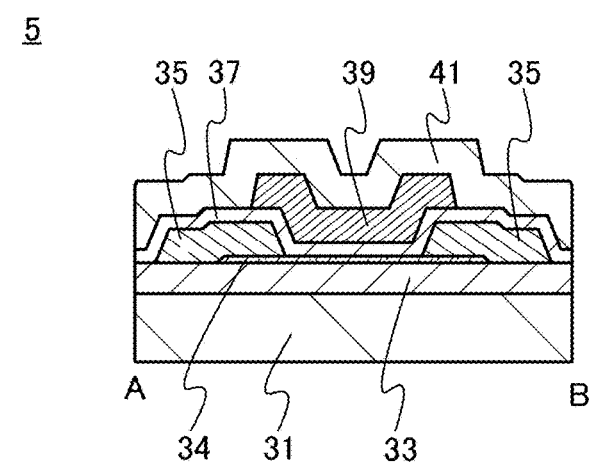
Figure 9C:
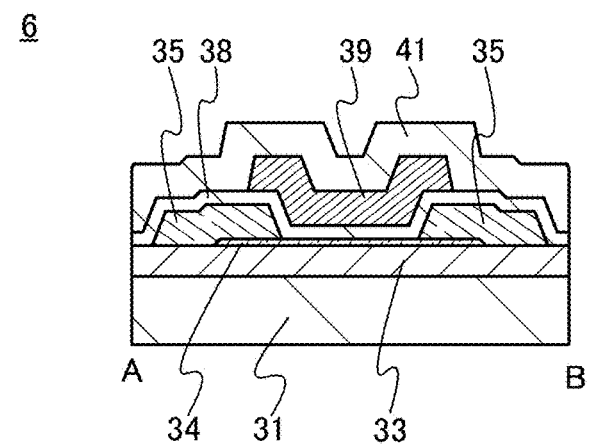

FIGS. 9A to 9C are a top view and cross-sectional views of the transistors 5 and 6. FIG. 9A is a top view of the transistors 5 and 6, and FIG. 9B is a cross-sectional view of the transistor 5 taken along dashed-dotted line A-B in FIG. 9A. FIG. 9C is a cross-sectional view of the transistor 6 taken along dashed-dotted line A-B in FIG. 9A. Note that in FIG. 9A, a substrate 31, a base insulating film 33, a gate insulating film 37, a nitrogen-containing oxide insulating film 41, and the like are omitted for simplicity.

The transistor 5 illustrated in FIG. 9B includes an oxide semiconductor film 34 over the base insulating film 33, a pair of electrodes 35 in contact with the oxide semiconductor film 34, the gate insulating film 37 in contact with the base insulating film 33, the oxide semiconductor film 34, and the pair of electrodes 35, and a gate electrode 39 overlapping with the oxide semiconductor film 34 with the gate insulating film 37 provided therebetween. The nitrogen-containing oxide insulating film 41 is formed over the gate insulating film 37 and the gate electrode 39.

The transistor 6 illustrated in FIG. 9C includes the base insulating film 33 over the substrate 31, the oxide semiconductor film 34 over the base insulating film 33, the pair of electrodes 35 in contact with the oxide semiconductor film 34, a gate insulating film 38 which is a nitrogen-containing oxide insulating film and is in contact with the base insulating film 33, the oxide semiconductor film 34, and the pair of electrodes 35, and the gate electrode 39 overlapping with the oxide semiconductor film 34 with the gate insulating film 38 provided therebetween. The nitrogen-containing oxide insulating film 41 is formed over the gate insulating film 37 and the gate electrode 39.

The nitrogen-containing oxide insulating film 41 and the gate insulating film 38 which is a nitrogen-containing oxide insulating film can be formed using, as appropriate, the nitrogen-containing oxide insulating film 23 described in Embodiment 1. The nitrogen concentration of the nitrogen-containing oxide insulating film 41 and the gate insulating film 38 which is a nitrogen-containing oxide insulating film, which is obtained by secondary ion mass spectrometry (SIMS), is greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. Since the amount of nitrogen in the nitrogen-containing oxide insulating film 41 is small, the amount of nitrogen that is transferred to the oxide semiconductor film 34 of the transistor 5 is small; thus, the number of defects in the nitrogen-containing oxide insulating film 41 is small.

When the oxide semiconductor film 34 contains nitrogen, the oxide semiconductor film 34 easily has n-type conductivity by generation of electrons serving as carriers and an increase of carrier density. Thus, the transistor including the oxide semiconductor film 34 tends to have normally-on characteristics. The amount of nitrogen that is transferred to the oxide semiconductor film 34 can be reduced by setting the nitrogen concentrations of the nitrogen-containing oxide insulating film 41 and the gate insulating film 38 which is a nitrogen-containing oxide insulating film, which are formed over the oxide semiconductor film 34, to be greater than or equal to the lower limit of detection by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. By reducing the amount of nitrogen in the oxide semiconductor film 34 as much as possible, a negative shift of the threshold voltage can be suppressed and fluctuation in electrical characteristics can be reduced. Moreover, leakage current, typically an off-state current in a source and a drain of the transistor can be reduced. Further, the number of defects in the nitrogen-containing oxide insulating film 41 can be reduced by reducing the nitrogen concentration of the nitrogen-containing oxide insulating film 41, and the amount of change in electrical characteristics of the transistor can be reduced and the rising gate voltage (Vg) of the on-state current can be made substantially the same at a different drain voltage.

Other details of the transistors 5 and 6 are described below.

As the substrate 31, a substrate which is given as an example of the substrate 11 of Embodiment 1 can be used as appropriate.

The base insulating film 33 is preferably formed using an oxide insulating film containing oxygen at a higher proportion than oxygen in the stoichiometric composition. The oxide insulating film containing oxygen at a higher proportion than oxygen in the stoichiometric composition can diffuse oxygen into an oxide semiconductor film by heat treatment. Typical examples of the base insulating film 33 are films of silicon oxide, silicon oxynitride, silicon nitride oxide, gallium oxide, hafnium oxide, yttrium oxide, aluminum oxide, and aluminum oxynitride, and the like.

The thickness of the base insulating film 33 is greater than or equal to 50 nm, preferably greater than or equal to 200 nm and less than or equal to 3000 nm, more preferably greater than or equal to 300 nm and less than or equal to 1000 nm. With the use of the thick base insulating film 33, the amount of oxygen released from the base insulating film 33 can be increased, and the interface state between the base insulating film 33 and an oxide semiconductor film formed later can be reduced.

Here, "to release part of oxygen by heating" means that the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis.

Here, in TDS analysis, the measurement method of the amount of released oxygen converted into oxygen atoms is described below.

The amount of released gas in the TDS analysis is proportional to an integral value of ion intensity. Thus, from the ratio of the integral value of ion intensity of the insulating film to a reference value of a standard sample, the amount of released gas can be calculated. The reference value of a standard sample refers to the ratio of the density of a predetermined atom contained in a sample to the integral value of ion intensity.

For example, the number of released oxygen molecules ($N_{O2}$) from an insulating film can be calculated according to Formula 1 using the TDS analysis results of a silicon wafer containing hydrogen at a predetermined density, which is the standard sample, and the TDS analysis results of the insulating film. Here, the total ion intensity having a mass number of 32 which is obtained by the TDS analysis is assumed to originate from an oxygen molecule. Note that CH$_3$OH, which is a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal

[FORMULA 1]

$$N_{H2} = \frac{N_{H2(S)}}{S_{H2(S)}} \times S_{H2} \times \alpha \quad (1)$$

Here, $N_{H2}$ is the value obtained by conversion of the number of hydrogen molecules released from the standard sample into densities, and $S_{H2}$ is the integral value of ion intensity when the standard sample is subjected to TDS analysis. Here, the reference value of the standard sample is set to $N_{H2}/S_{H2}$, $S_{O2}$ is the integral value of ion intensity when the insulating film is subjected to TDS analysis, and α is a coefficient affecting the ion intensity in the TDS analysis. Refer to Japanese Published Patent Application No. H6-275697 for details of Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that since the above α includes the ionization rate of oxygen molecules, the number of released oxygen atoms can also be estimated through the evaluation of the number of the released oxygen molecules.

Note that $N_{O2}$ is the number of released oxygen molecules. For the insulating film, the amount of released oxygen converted into oxygen atoms is twice the number of the released oxygen molecules.

In the above structure, the insulating film from which oxygen is released by heating may be an oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film 33 to the oxide semiconductor film 34, an interface state between the base insulating film 33 and the oxide semiconductor film 34 can be reduced. As a result, electric charge or the like which may be produced due to an operation of the transistor or the like can be prevented from being trapped at the interface between the base insulating film 33 and the oxide semiconductor film 34, so that a transistor with less deterioration in electrical characteristics can be provided.

Further, in some cases, charge is generated due to oxygen vacancies in the oxide semiconductor film 34. In general, part of oxygen vacancies in the oxide semiconductor film serve as donors to generate electrons serving as carriers. As a result, the threshold voltage of each transistor shifts in the negative direction. This tendency occurs remarkably in oxygen vacancies caused on the back channel side. Note that a back channel in this embodiment refers to the vicinity of the interface between the oxide semiconductor film 34 and the base insulating film 33 in FIGS. 9A to 9C. When oxygen is sufficiently supplied from the base insulating film 33 to the oxide semiconductor film 34, oxygen vacancies in the oxide semiconductor film 34, which causes a negative shift of the threshold voltage, can be reduced.

The oxide semiconductor film 34 can be formed in a manner similar to that of the oxide semiconductor film 19 of Embodiment 1.

The pair of electrodes 35 can be formed in a manner similar to that of the pair of electrodes 21 of Embodiment 1.

Note that although the pair of electrodes 35 is provided between the oxide semiconductor film 34 and the gate insulating film 37 in this embodiment, the pair of electrodes 35 may be provided between the base insulating film 33 and the oxide semiconductor film 34.

The gate insulating film 37 can be formed in a manner similar to that of the gate insulating film 17 of Embodiment 1.

The gate electrode 39 can be formed in a manner similar to that of the gate electrode 15 of Embodiment 1.

Next, a method for manufacturing the transistors illustrated in FIGS. 9A and 9B is described with reference to FIGS. 10A to 10D.

Figure 10A:
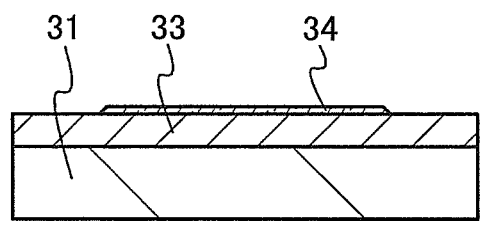
FIGS. 10A to 10D are cross-sectionals views illustrating one embodiment of a method for manufacturing a transistor.

As illustrated in FIG. 10A, the base insulating film 33 is formed over the substrate 31. Then, the oxide semiconductor film 34 is formed over the base insulating film 33.

The base insulating film 33 is formed by a sputtering method, a CVD method or the like.

In the case where an oxide insulating film from which part of oxygen is released by heating is formed by a sputtering method as the base insulating film 33, the amount of oxygen in a deposition gas is preferably large, and oxygen, a mixed gas of oxygen and a rare gas, or the like can be used. Typically, the oxygen concentration of a deposition gas is preferably higher than or equal to 6% and lower than or equal to 100%.

In the case where the oxide insulating film is formed by a CVD method as the base insulating film 33, hydrogen or water derived from a source gas is sometimes mixed in the oxide insulating film. Thus, after the oxide insulating film is formed by a CVD method, heat treatment is preferably performed as dehydrogenation or dehydration.

In the case where oxygen is added to the oxide insulating film formed by a CVD method, the amount of oxygen released by heating can be increased. As the method for adding oxygen to the oxide insulating film, an ion implantation method, an ion doping method, a plasma immersion ion implantation method, plasma treatment, or the like can be used.

In the case where the oxide semiconductor film 34 is a CAAC-OS film, planarity of the surface of the base insulating film 33 serving as a base insulating film of the oxide semiconductor film is preferably improved in order to improve the orientation of the crystal parts in the CAAC-OS film. Typically, the average surface roughness (Ra) of the base insulating film 33 is preferably less than or equal to 1 nm, more preferably less than or equal to 0.3 nm, further preferably less than or equal to 0.1 nm.

As planarization treatment for improving planarity of the surface of the base insulating film 33, one or more can be selected from chemical mechanical polishing (CMP) treatment, dry etching treatment, plasma treatment (what is called reverse sputtering), and the like. The plasma treatment is the one in which minute unevenness of the surface is reduced by introducing an inert gas such as an argon gas into a vacuum chamber and applying an electric field so that a surface to be processed serves as a cathode.

The oxide semiconductor film 34 can be formed using, as appropriate, a formation method similar to that of the oxide semiconductor film 19 of Embodiment 1.

Next, heat treatment is preferably performed. By this heat treatment, part of oxygen contained in the base insulating film 33 can be diffused into the vicinity of the interface between the base insulating film 33 and the oxide semiconductor film 34. Thus, the interface state in the vicinity of the interface between the base insulating film 33 and the oxide semiconductor film 34 can be reduced.

The heat treatment is performed typically at a temperature higher than or equal to 150° C. and lower than or equal to 500° C., preferably higher than or equal to 250° C. and lower than or equal to 450° C., more preferably higher than or equal to 300° C. and lower than or equal to 450° C.

The heat treatment is performed in atmosphere of an inert gas including nitrogen or a rare gas such as helium, neon, argon, xenon, or krypton. Alternatively, the heat treatment may be performed first in an atmosphere of an inert gas and then in an oxygen atmosphere. It is preferable that the above atmosphere of an inert gas and oxygen atmosphere do not contain hydrogen, water, and the like. The treatment time is 3 minutes to 24 hours.

Figure 10B:
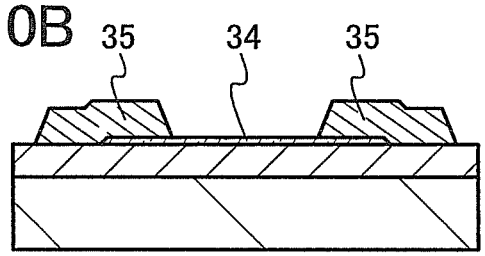

Next, as illustrated in FIG. 10B, the pair of electrodes 35 is formed. The pair of electrodes 35 can be formed using, as appropriate, a formation method similar to that of the pair of electrodes 21 of Embodiment 1. Alternatively, the pair of electrodes 35 can be formed by a printing method or an inkjet method.

Figure 10C:
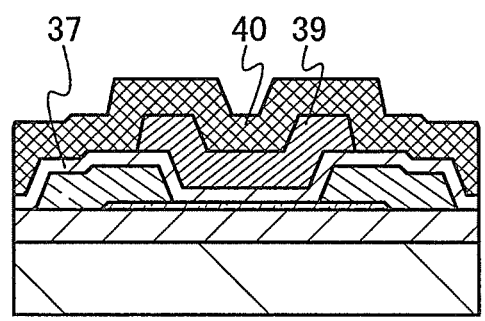

Next, as illustrated in FIG. 10C, the gate insulating film 37 is formed over the oxide semiconductor film 34 and the pair of electrodes 35. Then, the gate electrode 39 is formed over the gate insulating film 37. The gate insulating film 37 and the gate electrode 39 can be formed using, as appropriate, formation methods similar to those of the gate insulating film 17 and the gate electrode 15 of Embodiment 1, respectively.

Next, a nitrogen-containing oxide insulating film 40 is formed over the gate insulating film 37 and the gate electrode 39. The nitrogen-containing oxide insulating film 40 can be formed using, as appropriate, a formation method similar to that of the nitrogen-containing oxide insulating film 22 of Embodiment 1.

Next, nitrogen is released from the nitrogen-containing oxide insulating film 40 by heat treatment in a manner similar to that of Embodiment 1. The heat treatment is performed typically at a temperature higher than or equal to 150° C. and lower than or equal to 500° C., preferably higher than or equal to 200° C. and lower than or equal to 450° C., more preferably higher than or equal to 300° C. and lower than or equal to 450° C. Nitrogen of the nitrogen-containing oxide insulating film 40 can be released by the heat treatment. Note that water, hydrogen, or the like can be eliminated from the nitrogen-containing oxide insulating film 40 by the heat treatment.

Figure 10D:
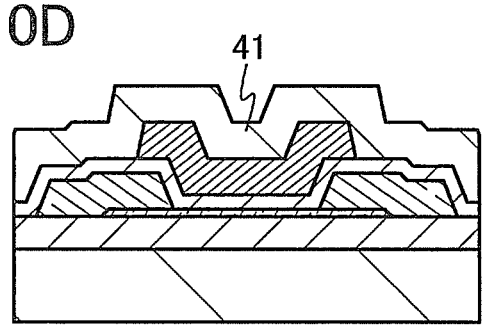

Through the above process, the nitrogen-containing oxide insulating film 41 whose nitrogen concentration is low can be formed over the transistor including the oxide semiconductor film, as illustrated in FIG. 10D. Moreover, a transistor in which change in the electrical characteristics is suppressed and the reliability is improved can be manufactured.

Modified Example

A modified example of the transistors illustrated in FIGS. 9A to 9C is described with reference to FIG. 11.

Figure 11:
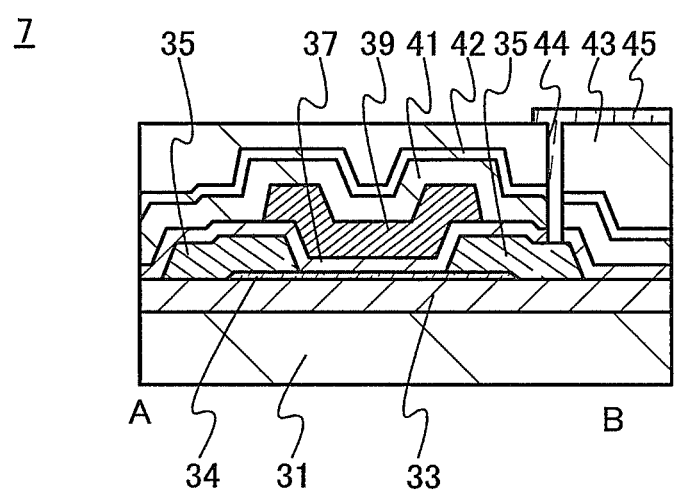
FIG. 11 is cross-sectional view illustrating one embodiment of a transistor.

FIG. 11 is a cross-sectional view of a transistor 7 of the semiconductor device. The transistor 7 illustrated in FIG. 11 includes the base insulating film 33 over the substrate 31, the oxide semiconductor film 34 over the base insulating film 33, and the pair of electrodes 35 in contact with the oxide semiconductor film 34. In addition, the gate insulating film 37 and the gate electrode 39 overlapping with the oxide semiconductor film 34 with the gate insulating film 37 provided therebetween are included. The nitrogen-containing oxide insulating film 41 is formed over the gate insulating film 37 and the gate electrode 39, and a nitride insulating film 42 is formed over the nitrogen-containing oxide insulating film 41. In addition, a planarization film 43 is formed over the nitride insulating film 42. In an opening 44 formed in the gate insulating film 37, the nitrogen-containing oxide insulating film 41, the nitride insulating film 42, and the planarization film 43, a conductive film 45 connected to one of the pair of electrodes 35 may be provided.

The nitride insulating film 42 can be formed using, as appropriate, the nitride insulating film 25 of Embodiment 1.

The planarization film 43 can be formed using, as appropriate, the planarization film 27 of Embodiment 1.

Note that it is preferable to provide the nitride insulating film 42 between the nitrogen-containing oxide insulating film 41 and the planarization film 43 because adhesion between the nitride insulating film 42 and the planarization film 43 is improved.

The conductive film 45 can be formed using, as appropriate, the conductive film 29 of Embodiment 1.

Through the above process, the nitrogen-containing oxide insulating film whose nitrogen concentration is low can be formed over the transistor including the oxide semiconductor film. Moreover, a transistor in which change in the electrical characteristics is suppressed and the reliability is improved can be manufactured.

Note that the structures, methods, and the like described in this embodiment can be used as appropriate in combination with any of the structures, methods, and the like described in the other embodiments and examples.

Embodiment 5

In this embodiment, a structure of a nitrogen-containing oxide insulating film, which is different from that in Embodiment 4, will be described with reference to FIG. 12.

Figure 12:
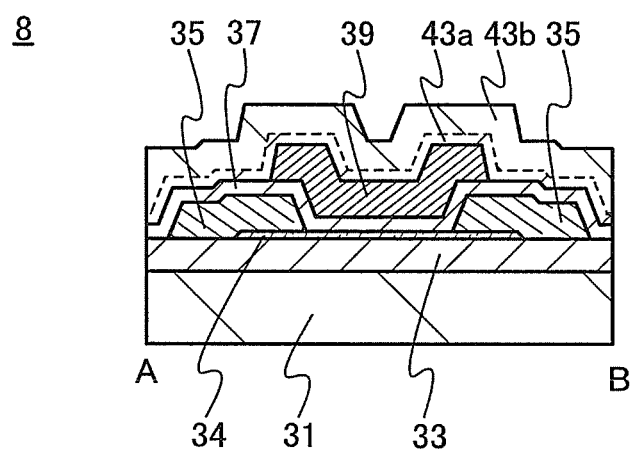
FIG. 12 is a cross-sectional view illustrating one embodiment of a transistor.

A transistor 8 illustrated in FIG. 12 includes the base insulating film 33 over the substrate 31, the oxide semiconductor film 34 over the base insulating film 33, and the pair of electrodes 35 in contact with the oxide semiconductor film 34. In addition, the gate insulating film 37 and the gate electrode 39 overlapping with the oxide semiconductor film 34 with the gate insulating film 37 provided therebetween are included. A nitrogen-containing oxide insulating film 43a and a nitrogen-containing oxide insulating film 43b are formed over the gate insulating film 37 and the gate electrode 39. Note that although the nitrogen-containing oxide insulating film 43a and the nitrogen-containing oxide insulating film 43b are stacked here over the transistor 8, only one of the nitrogen-containing oxide insulating film 43a and the nitrogen-containing oxide insulating film 43b may be formed.

In the transistor 8 of this embodiment, the nitrogen-containing oxide insulating film 43a is formed over the gate insulating film 37 and the gate electrode 39. As the nitrogen-containing oxide insulating film 43a, an oxide insulating film transmitting oxygen is formed in a manner similar to that of the nitrogen-containing oxide insulating film 24a of Embodiment 2.

The nitrogen-containing oxide insulating film 43b is formed to be in contact with the nitrogen-containing oxide insulating film 43a. As the nitrogen-containing oxide insulating film 43b, an oxide insulating film containing oxygen at a higher proportion than oxygen in the stoichiometric composition is formed in a manner similar to that of the nitrogen-containing oxide insulating film 24b of Embodiment 2.

The oxide insulating film containing oxygen at a higher proportion than oxygen in the stoichiometric composition is an oxide insulating film from which part of oxygen is released by heating. Therefore, the nitrogen-containing oxide insulating film 43b is formed over the nitrogen-containing oxide insulating film 43a while heating the nitrogen-containing oxide insulating film 43b, whereby oxygen is transferred to the oxide semiconductor film 34 and thus oxygen vacancies in the oxide semiconductor film 34 can be reduced. Further alternatively, the nitrogen-containing oxide insulating film 43b is formed over the nitrogen-containing oxide insulating film 43a and then is subjected to heat treatment, whereby oxygen is transferred to the oxide semiconductor film 34 and thus oxygen vacancies in the oxide semiconductor film 34 can be reduced.

In the case where the oxide semiconductor film 34 is not damaged in the step of forming the nitrogen-containing oxide insulating film 43b, the nitrogen-containing oxide insulating film 43a is not provided and only the nitrogen-containing oxide insulating film 43b which is an oxide insulating film from which part of oxygen is released by heating may be provided.

Through the above process, a transistor in which change in the electrical characteristics is suppressed and the reliability is improved can be manufactured. Moreover, a highly reliable transistor in which the amount of change in electrical characteristics, typically the amount of change of the threshold voltage are small due to change over time or a BT photostress test can be manufactured.

Note that the structures, methods, and the like described in this embodiment can be used as appropriate in combination with any of the structures, methods, and the like described in the other embodiments and examples.

Embodiment 6

Figure 15:
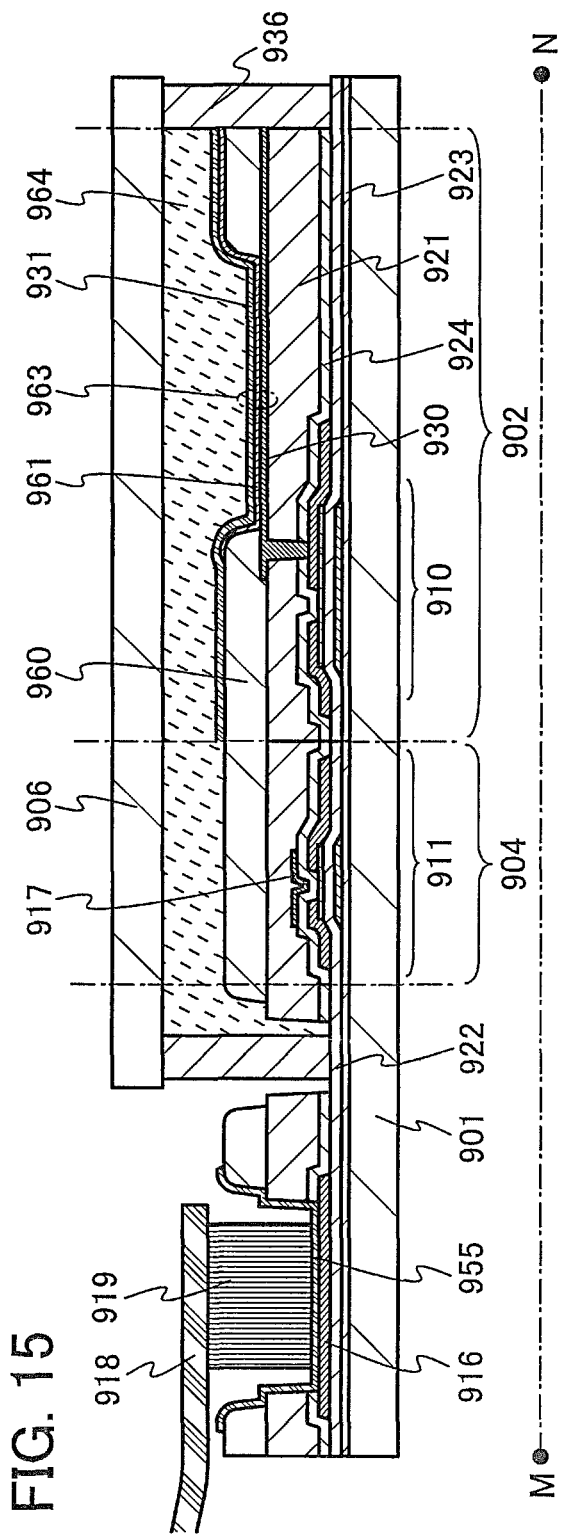
FIG. 15 is a cross-sectional view illustrating one embodiment of a display device.

A semiconductor device (also referred to as a display device) having a display function can be manufactured using the transistor examples of which are shown in the above embodiments. Moreover, some or all of driver circuits which include the transistor can be formed over a substrate where a pixel portion is formed, whereby a system-on-panel can be obtained. In this embodiment, an example of a display device using the transistor examples of which are shown in the above embodiments is described with reference to FIGS. 13A to 13C, FIGS. 14A and 14B, FIG. 15, and FIGS. 16A to 16C. FIGS. 14A and 14B and FIG. 15 are cross-sectional views illustrating cross-sectional structures taken along dashed-dotted line M-N in FIG. 13B. Note that in FIGS. 14A and 14B and FIG. 15, only part of the structure of the pixel portion is illustrated.

In FIG. 13A, a sealant 905 is provided so as to surround a pixel portion 902 provided over a first substrate 901, and the pixel portion 902 is sealed with a second substrate 906. In FIG. 13A, a signal line driver circuit 903 and a scan line driver circuit 904 are each formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

In FIGS. 13B and 13C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 13B and 13C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 13B and 13C, various signals and potentials are supplied to the signal line driver circuit 903, the scan line driver circuit 904, and the pixel portion 902 from an FPC 918.

Although FIGS. 13B and 13C each illustrate an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be employed. FIG. 13A illustrates an example in which the signal line driver circuit 903 and the scan line driver circuit 904 are mounted by a COG method. FIG. 13B illustrates an example in which the signal line driver circuit 903 is mounted by a COG method. FIG. 13C illustrates an example in which the signal line driver circuit 903 is mounted by a TAB method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

A display device illustrated in FIG. 14A includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

A display device illustrated in FIG. 14B includes connection terminal electrodes 915a and 915b and a terminal electrode 916. The connection terminal electrodes 915a and 915b and the terminal electrode 916 are electrically connected to a terminal included in the FPC 918 through the anisotropic conductive agent 919.

The connection terminal electrode 915a is formed using the same conductive film as the first electrode 930 and the connection terminal electrode 915b is formed using the same conductive film as a second electrode 941, and the terminal electrode 916 is formed using the same conductive film as a pair of electrodes in each of the transistor 910 and the transistor 911.

In addition, as illustrated in FIG. 15, a semiconductor device includes a connection terminal electrode 955 and the terminal electrode 916. The connection terminal electrode 955 and the terminal electrode 916 are electrically connected to a terminal included in the FPC 918 through the anisotropic conductive agent 919.

The connection terminal electrode 955 is formed using the same conductive film as a second electrode 931, and the terminal electrode 916 is formed using the same conductive film as the pair of electrodes in each of the transistor 910 and the transistor 911.

Each of the pixel portion 902 and the scan line driver circuit 904 which are provided over the first substrate 901 includes a plurality of transistors. FIGS. 14A and 14B and FIG. 15 illustrate the transistor 910 included in the pixel portion 902 and the transistor 911 included in the scan line driver circuit 904. In FIGS. 14A and 14B, a nitrogen-containing oxide insulating film 924 corresponding to the nitrogen-containing oxide insulating film 23 of Embodiment 1 is provided over the transistor 910 and the transistor 911, and a planarization film 921 is further provided over the nitrogen-containing oxide insulating film 924. Note that an insulating film 923 is an insulating film serving as a base film.

In this embodiment, any of the transistors described in the above embodiments can be applied to the transistors 910 and 911.

Moreover, FIG. 15 illustrates an example in which a conductive film 917 is provided over the nitrogen-containing oxide insulating film 924 so as to overlap with a channel formation region of the oxide semiconductor film of the transistor 911 for the driver circuit. In this embodiment, the conductive film 917 is formed using the same conductive film as the first electrode 930. By providing the conductive film 917 so as to overlap with the channel formation region of the oxide semiconductor film, the amount of change of the threshold voltage of the transistor 911 between before and after a BT stress test can be further reduced. The conductive film 917 may have the same potential as or a potential different from that of the gate electrode of the transistor 911, and the conductive film 917 can function as a second gate electrode. The potential of the conductive film 917 may be GND, 0 V or in a floating state.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent change in electrical characteristics of the transistor due to the influence of an external electric field such as static electricity. The conductive film 917 can be applied to any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

The first electrode and the second electrode (each of which are also referred to as a pixel electrode, a common electrode, a counter electrode layer, or the like) for applying voltage to the display element can have light-transmitting properties or light-reflecting properties, which depends on the direction in which light is extracted, the position where the electrodes are provided, and the pattern structure of the electrodes.

The first electrode 930 and the second electrodes 931 and 941 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the first electrode 930 and the second electrodes 931 and 941 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

An example of a liquid crystal display device using a liquid crystal element as the display element is illustrated in FIGS. 14A and 14B. FIG. 14A illustrates an example in which a vertical electric field method is employed.

In FIG. 14A, a liquid crystal element 913 which is a display element includes the first electrode 930, the second electrode 931, and a liquid crystal layer 908. Note that an insulating film 932 and an insulating film 933 which function as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

FIG. 14B illustrates an example in which a fringe field switching (FFS) mode, which is one of horizontal electric field modes, is employed.

In FIG. 14B, a liquid crystal element 943 which is a display element includes the first electrode 930, the second electrode 941, and the liquid crystal layer 908 which are formed over the planarization film 921. The second electrode 941 functions as the common electrode. An insulating film 944 is provided between the first electrode 930 and the second electrode 941. The insulating film 944 is formed using a silicon nitride film. Note that the insulating film 932 and the insulating film 933 which function as alignment films are provided so that the liquid crystal layer 908 is provided therebetween.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range.

The first substrate 901 and the second substrate 906 are fixed in place by a sealant 925. As the sealant 925, an organic resin such as a thermosetting resin or a photocurable resin can be used. Note that the sealant 925 corresponds to the sealant 905 in FIGS. 13A to 13C.

In the liquid crystal display device illustrated in FIG. 14A, the sealant 925 is in contact with a gate insulating film 922, and the planarization film 921 is provided on an inner side than the sealant 925.

In the liquid crystal display device illustrated in FIG. 14B, the sealant 925 is in contact with the nitrogen-containing oxide insulating film 924.

The size of storage capacitor formed in the liquid crystal display device is set considering the leakage current of the transistor provided in the pixel portion or the like so that charge can be held for a predetermined period. In the case of using such a transistor including the highly purified oxide semiconductor film as described in the above embodiments, it is enough to provide a storage capacitor having a capacitance that is ⅓ or less, preferably ⅕ or less of a liquid crystal capacitance of each pixel; therefore, the aperture ratio of a pixel can be increased.

In the display device, a black matrix (a light-blocking film); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

Figure 16A:
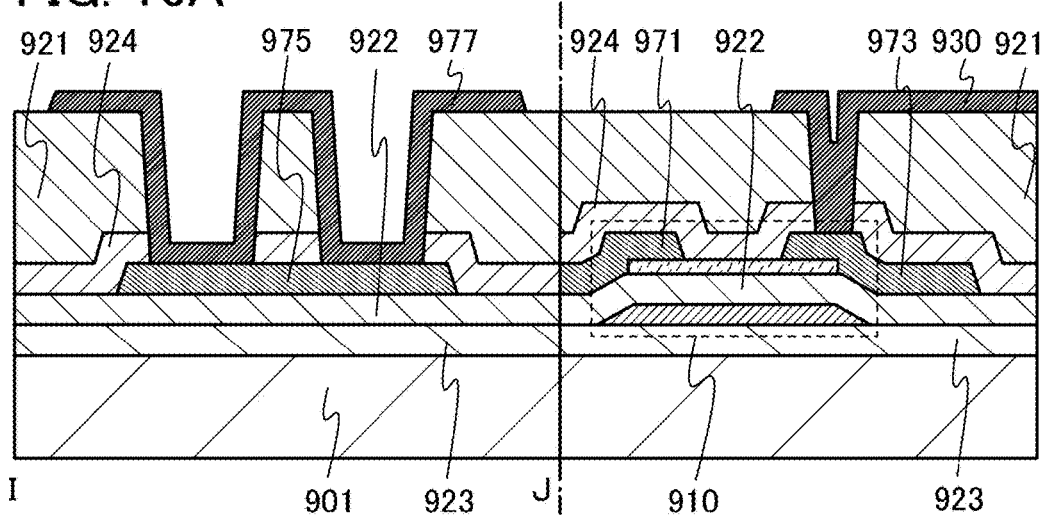
FIGS. 16A to 16C illustrate one embodiment of a display device.
Figure 16B:
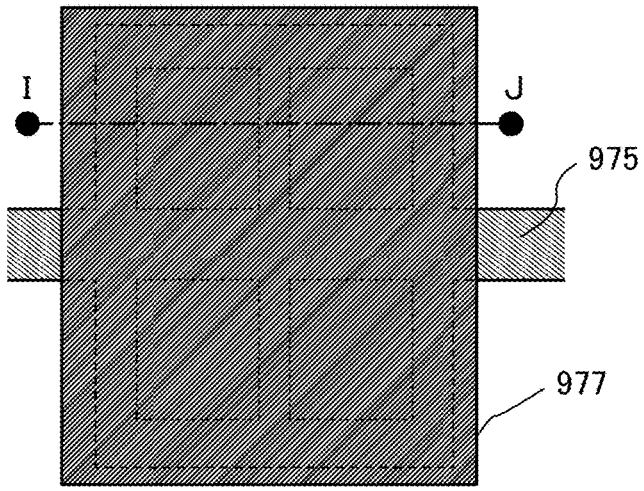
Figure 16C:
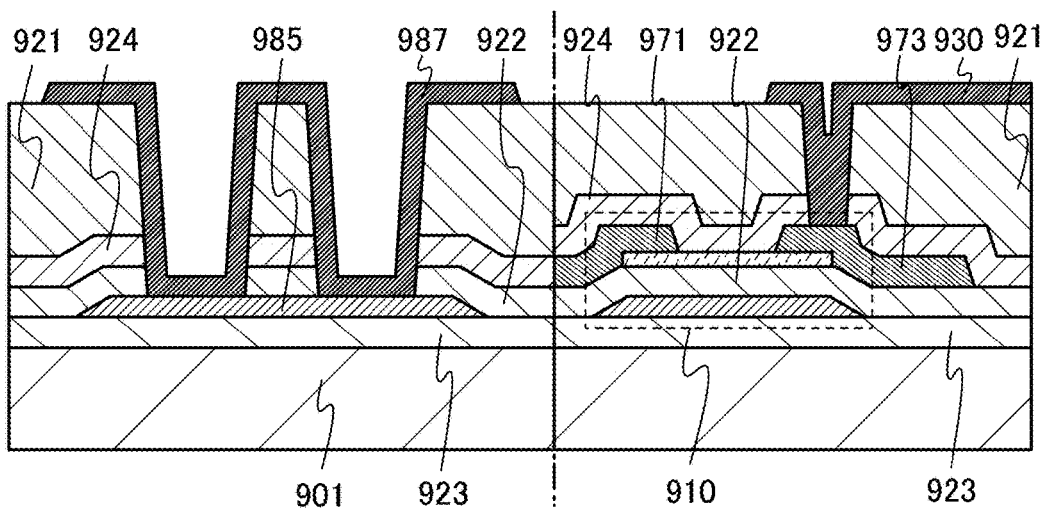

FIGS. 16A to 16C illustrate an example of the display device in FIG. 14A in which a common connection portion (pad portion) for being electrically connected to the second electrode 931 provided on the second substrate 906 is formed over the first substrate 901.

The common connection portion is provided in a position overlapping with the sealant for bonding the first substrate 901 and the second substrate 906, and is electrically connected to the second electrode 931 through conductive particles contained in the sealant. Alternatively, the common connection portion is provided in a position not overlapping with the sealant (except for the pixel portion) and a paste including conductive particles is provided separately from the sealant so as to overlap with the common connection portion, whereby the common connection portion is electrically connected to the second electrode 931.

FIG. 16A is a cross-sectional view of the common connection portion taken along line I-J in the top view in FIG. 16B.

A common potential line 975 is provided over the gate insulating film 922 and is formed using the same material and through the same steps as a source electrode 971 or a drain electrode 973 of the transistor 910 illustrated in FIGS. 14A and 14B.

Further, the common potential line 975 is covered with the nitrogen-containing oxide insulating film 924 and the planarization film 921, and the nitrogen-containing oxide insulating film 924 and the planarization film 921 have a plurality of openings at a position overlapping with the common potential line 975. These openings are formed through the same steps as a contact hole which connects the first electrode 930 and one of the source electrode 971 and the drain electrode 973 of the transistor 910.

Further, the common potential line 975 is connected to a common electrode 977 through the opening. The common electrode 977 is provided over the planarization film 921 and is formed using the same material and through the same steps as the connection terminal electrode 915 and the first electrode 930 in the pixel portion.

In this manner, the common connection portion can be formed through the same manufacturing process as the switching element in the pixel portion 902.

The common electrode 977 is an electrode in contact with the conductive particles contained in the sealant, and is electrically connected to the second electrode 931 of the second substrate 906.

Alternatively, as illustrated in FIG. 16C, a common potential line 985 may be formed using the same material and through the same steps as a gate electrode of the transistor 910.

In the common connection portion illustrated in FIG. 16C, the common potential line 985 is provided under the gate insulating film 922, the nitrogen-containing oxide insulating film 924, and the planarization film 921; and the gate insulating film 922, the nitrogen-containing oxide insulating film 924, and the planarization film 921 have a plurality of openings at a position overlapping with the common potential line 985. These openings are formed by etching the nitrogen-containing oxide insulating film 924 and the planarization film 921 through the same steps as a contact hole which connects the first electrode 930 and one of the source electrode 971 and the drain electrode 973 of the transistor 910, and then by further selectively etching the gate insulating film 922.

Further, the common potential line 985 is connected to a common electrode 987 through the opening. The common electrode 987 is provided over the planarization film 921 and is formed using the same material and through the same steps as the connection terminal electrode 915 and the first electrode 930 in the pixel portion.

Note that in the liquid crystal display device of an FFS mode illustrated in FIG. 14B, the common electrode 977 or 987 is connected to the second electrode 941.

Next, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In order to extract light emitted from the light-emitting element, at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device using a light-emitting element as the display element is illustrated in FIG. 15. A light-emitting element 963 which is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, or the like.

A partition wall 960 is provided over end portions of the first electrode 930. The partition wall 960 can be formed using an organic insulating material or an inorganic insulating material. It is particularly preferable that the partition wall 960 be formed using a photosensitive resin material to have an opening over the first electrode 930 so that a sidewall of the opening has an inclined surface with a continuous curvature.

The light-emitting layer 961 may be formed to have a single-layer structure or a stacked-layer structure including a plurality of layers.

A protective layer may be formed over the second electrode 931 and the partition wall 960 in order to prevent oxygen, hydrogen, moisture, carbon dioxide, or the like from entering the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, a filler 964 is provided and sealed in a space which is sealed with the first substrate 901, the second substrate 906, and a sealant 936. It is preferable that, in this manner, the light-emitting element be packaged (sealed) with a protective film (such as a laminate film or an ultraviolet curable resin film) or a cover material with high air-tightness and little degasification so that the panel is not exposed to the outside air. Note that the sealant 936 corresponds to the sealant 905 in FIGS. 13A to 13C.

As the sealant 936, an organic resin such as a thermosetting resin or a photocurable resin, frit glass including low-melting glass, or the like can be used. The frit glass is preferable because of its high barrier property against impurities such as water and oxygen. Further, in the case where the frit glass is used as the sealant 936, the frit glass is provided over the gate insulating film 922 or the nitrogen-containing oxide insulating film 924 (the gate insulating film 922 in FIG. 15), whereby adhesion of the gate insulating film 922 or the nitrogen-containing oxide insulating film 924 to the frit glass becomes high and water can be prevented from entering the inside of the sealant 936 from the outside.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

Since the transistor is easily broken owing to static electricity or the like, a protective circuit for protecting the driver circuit is preferably provided. The protection circuit is preferably formed using a nonlinear element.

As described above, by applying any of the transistors described in the above embodiments, a highly reliable semiconductor device having a display function can be provided.

Note that the structures, methods, and the like described in this embodiment can be used as appropriate in combination with any of the structures, methods, and the like described in the other embodiments and examples.

Embodiment 7

A semiconductor device having an image sensor function for reading data of an object can be manufactured with the use of the transistor described in any of Embodiments 1 to 6.

Figure 17A:
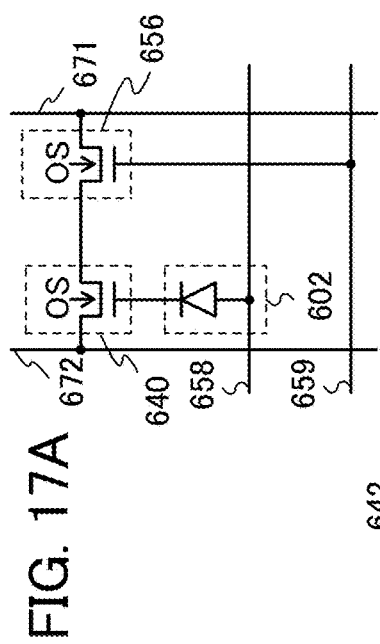
FIGS. 17A and 17B illustrate one embodiment of a semiconductor device.

An example of a semiconductor device having an image sensor function is illustrated in FIG. 17A. FIG. 17A illustrates an equivalent circuit of a photo sensor, and FIG. 17B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a symbol "OS" is written beside a transistor including an oxide semiconductor film so that it can be identified as a transistor including an oxide semiconductor film. In FIG. 17A, the transistor 640 and the transistor 656 are each a transistor including an oxide semiconductor film, to which the transistor described in any of Embodiments 1 to 6 can be applied. In this embodiment, an example in which a transistor having a structure similar to that of the transistor 1 described in Embodiment 1 is applied is described.

Figure 17B:
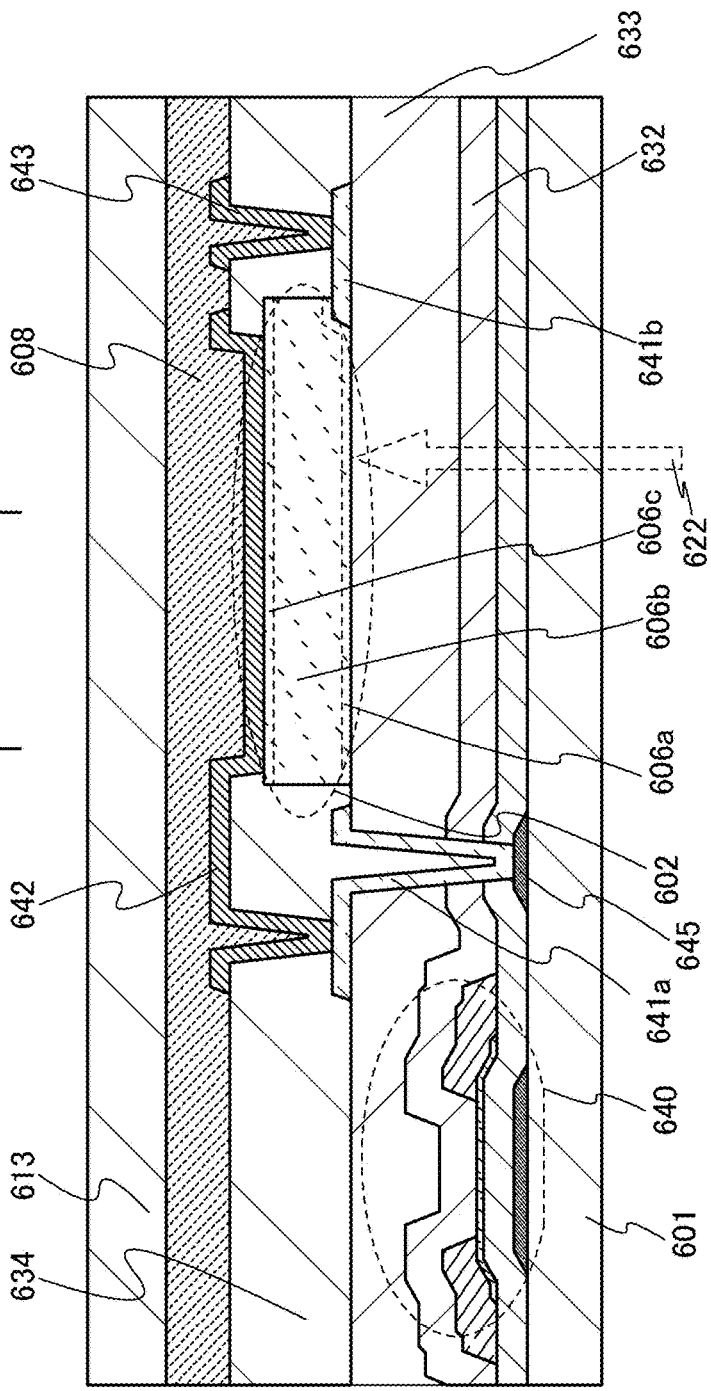

FIG. 17B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with an adhesive layer 608 provided therebetween.

A nitrogen-containing oxide insulating film 632, a planarization film 633, and a planarization film 634 are provided over the transistor 640. The photodiode 602 includes an electrode 641b formed over the planarization film 633; a first semiconductor film 606a, a second semiconductor film 606b, and a third semiconductor film 606c over the electrode 641b in this order; an electrode 642 which is over the planarization film 634 and is electrically connected to the electrode 641b through the first to third semiconductor films;

and an electrode 641a which is in the same layer as the electrode 641b and is electrically connected to the electrode 642.

The electrode 641b is electrically connected to a conductive layer 643 formed over the planarization film 634, and the electrode 642 is electrically connected to a conductive film 645 through the electrode 641a. The conductive film 645 is electrically connected to a gate electrode of the transistor 640, and thus the photodiode 602 is electrically connected to the transistor 640.

Here, a PIN photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by the photoelectric effect is lower than the mobility of electrons. Therefore, a PIN photodiode has better characteristics when a surface on the p-type semiconductor film side is used as a light-receiving plane. Here, an example in which light 622 received by the photodiode 602 from a surface of the substrate 601, over which the PIN photodiode is formed, is converted into electric signals is described. Light from the semiconductor film having a conductivity type opposite to that of the semiconductor film on the light-receiving plane is disturbance light; therefore, a light-blocking conductive film is favorably used for the electrode 642. Note that the n-type semiconductor film side may alternatively be a light-receiving plane.

The nitrogen-containing oxide insulating film 632 whose nitrogen concentration is reduced is provided over the transistor 640, whereby a negative shift of the threshold voltage of the transistor can be suppressed and fluctuation in electrical characteristics can be reduced. Moreover, leakage current, typically an off-state current in a source and a drain of the transistor can be reduced. Further, the amount of change in electrical characteristics of the transistor can be reduced and the rising gate voltage (Vg) of the on-state current can be made substantially the same at a different drain voltage.

The nitrogen-containing oxide insulating film 632, the planarization film 633, and the planarization film 634 can be formed using an insulating material by a sputtering method, a plasma CVD method, spin coating, dipping, spray coating, a droplet discharge method (such as an inkjet method), screen printing, offset printing, or the like depending on the material.

The planarization films 633 and 634 can be formed using an organic material such as an acrylic resin, an epoxy resin, a benzocyclobutene resin, polyimide, or polyamide. Note that the planarization films may be formed by stacking a plurality of insulating films formed using any of these materials.

With detection of light that enters the photodiode 602, data on an object to be detected can be read. Note that a light source such as a backlight can be used at the time of reading data on an object to be detected.

Note that the structures, methods, and the like described in this embodiment can be used as appropriate in combination with any of the structures, methods, and the like described in the other embodiments and examples.

Embodiment 8

A semiconductor device disclosed in this specification can be applied to a variety of electronic devices (including game machines). Examples of electronic devices to which the present invention can be applied include television sets (also referred to as televisions or television receivers), monitors of computers, cameras such as digital cameras or digital video cameras, digital photo frames, mobile phones, portable game consoles, portable information terminals, audio reproducing devices, game machines (e.g., pachinko machines or slot machines), housings of game machines, and the like. An example of such electronic devices is illustrated in FIG. 18.

Figure 18:
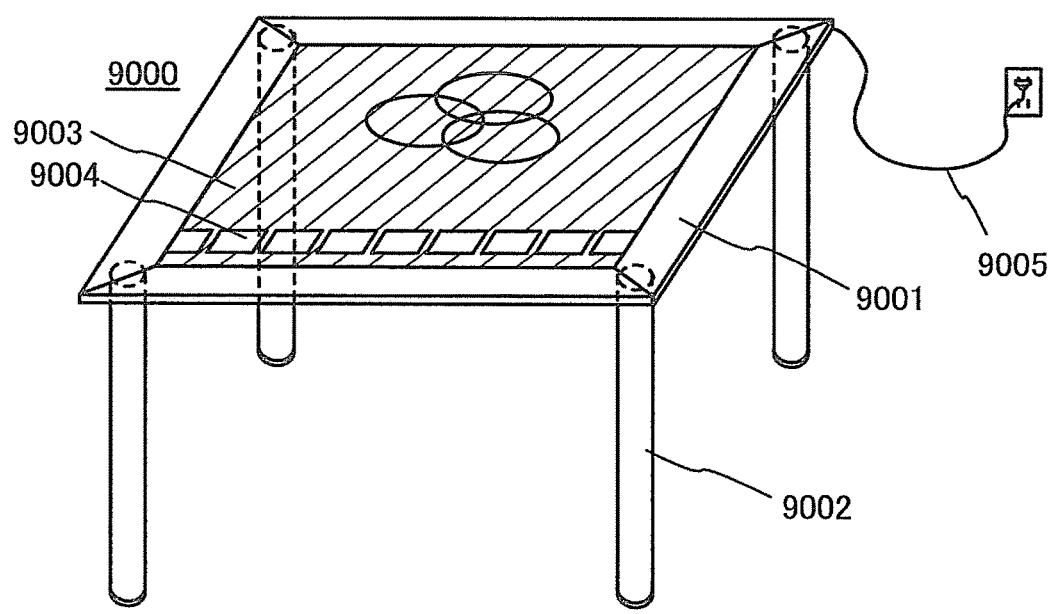
FIG. 18 illustrates an electronic device.

FIG. 18 illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with the use of the semiconductor device having an image sensor function, which is described in Embodiment 7, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 19A:
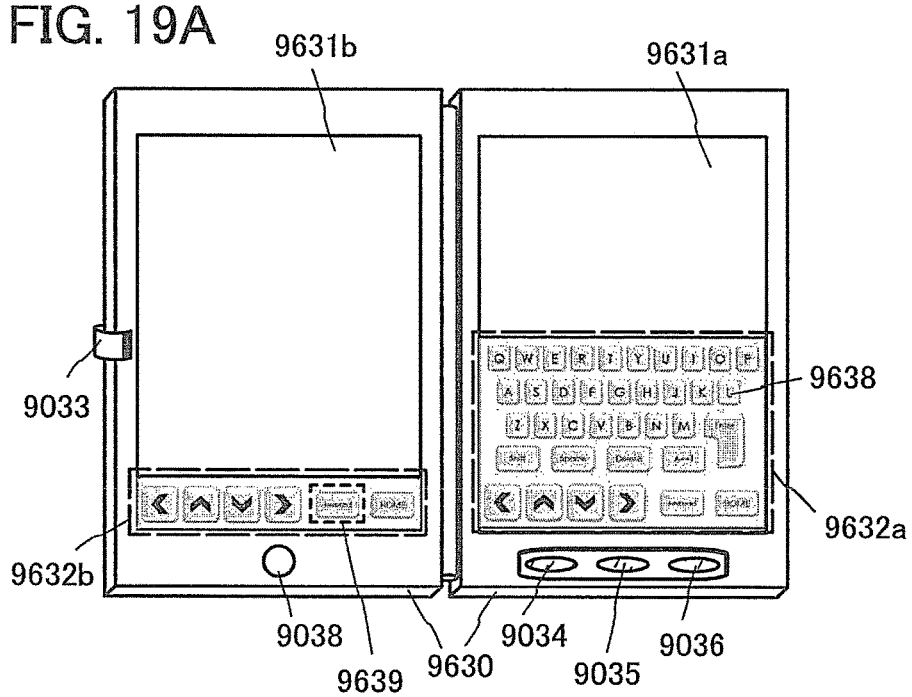
FIGS. 19A to 19C illustrate an electronic device.
Figure 19B:
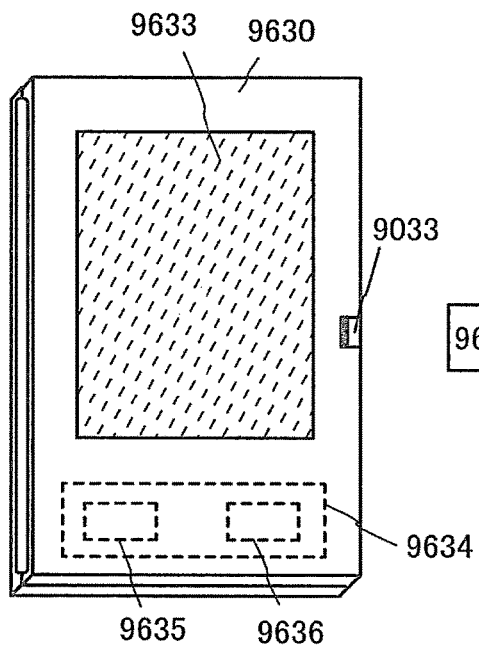

FIGS. 19A and 19B illustrate a foldable tablet terminal. In FIG. 19A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b, so that the tablet terminal can have high reliability.

Part of the display portion 9631a can be a touch panel region 9632a, and data can be input by touching operation keys 9638 that are displayed. Note that FIG. 19A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a portrait mode and a landscape mode, and between monochrome display and color display, for example. With the power-saving-mode switching button 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 19A, one embodiment of the present invention is not limited to this example. The display portion 9631a and the display portion 9631b may have different areas or different display quality. For example, one of them may be a display panel that can display higher-definition images than the other.

FIG. 19B illustrates the tablet terminal folded, which includes the housing 9630, a solar battery 9633, and a charge and discharge control circuit 9634. Note that FIG. 19B shows an example in which the charge and discharge control circuit 9634 includes a battery 9635 and a DCDC converter 9636.

Since the tablet terminal can be foldable, the housing 9630 can be closed when the tablet terminal is not in use. Thus, the display portions 9631a and 9631b can be protected, whereby a tablet terminal with high endurance and high reliability for long-term use can be provided.

The tablet terminal illustrated in FIGS. 19A and 19B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently, which is preferable. When a lithium ion battery is used as the battery 9635, there is an advantage of downsizing or the like.

Figure 19C:
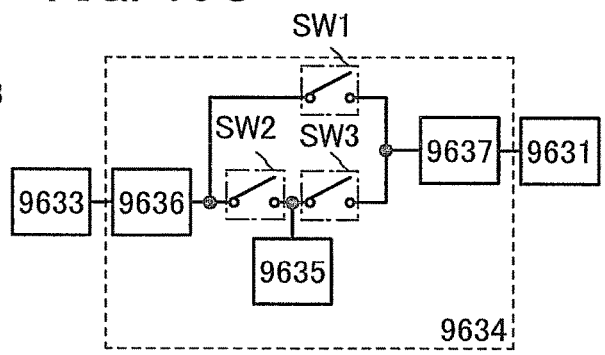

The structure and operation of the charge and discharge control circuit 9634 illustrated in FIG. 19B are described with reference to a block diagram of FIG. 19C. The solar battery 9633, the battery 9635, the DCDC converter 9636, a converter 9637, switches SW1, SW2, and SW3, and the display portion 9631 are illustrated in FIG. 19C, and the battery 9635, the DCDC converter 9636, the converter 9637, and the switches SW1 to SW3 correspond to the charge and discharge control circuit 9634 illustrated in FIG. 19B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Here, the solar battery 9633 is illustrated as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Note that the structures, methods, and the like described in this embodiment can be used as appropriate in combination with any of the structures, methods, and the like described in the other embodiments and examples.

Example 1

In this example, a nitrogen-containing oxide insulating film was formed over an oxide semiconductor film and was exposed to plasma generated by using dinitrogen monoxide or oxygen as an oxidizing gas, and the number of defects generated in the oxide semiconductor film was measured by ESR. The results will be described.

First, a method for forming samples is described.

A 100-nm-thick IGZO film was formed as an oxide semiconductor film over a quartz substrate. Then, a 20-nm-thick silicon oxynitride film was formed as a nitrogen-containing oxide insulating film over the IGZO film. Then, the silicon oxynitride film was exposed to plasma which was generated in an oxidizing gas atmosphere. Conditions of the formation of the films and conditions of plasma treatment are described below.

The IGZO film was formed under the conditions as follows: a sputtering target containing In, Ga, and Zn at an atomic ratio of 1:1:1 was used, argon with a flow rate of 30 sccm and oxygen with a flow rate of 15 sccm were supplied as a sputtering gas to a treatment chamber of a sputtering apparatus, the pressure in the treatment chamber was controlled to 0.4 Pa, and the AC power of 0.5 kW was supplied. Note that the IGZO film was formed at a substrate temperature of 300° C.

The silicon oxynitride film was formed under the conditions as follows: the quartz substrate was placed in a treatment chamber of a plasma CVD apparatus, silane with a flow rate of 1 sccm and dinitrogen monoxide with a flow rate of 800 sccm which were used as a source gas were supplied to the treatment chamber, the pressure in the treatment chamber was controlled to 40 Pa, and the power of 150 W was supplied with the use of a 60 MHz high-frequency power source. Further, the temperature of the quartz substrate at the formation of the silicon oxynitride film was 350° C. Note that the plasma CVD apparatus used in this example is a parallel plate plasma CVD apparatus in which the electrode area is 615 cm$^2$, and the power per unit area (power density) into which the supplied power is converted is 0.24 W/cm$^2$.

Plasma was generated in such a manner that dinitrogen monoxide or oxygen with a flow rate of 900 sccm was supplied to the treatment chamber, and power of 150 W (0.24 W/cm$^2$) was supplied with the use of a 60 MHz high-frequency power source. Further, the temperature of the quartz substrate at the time of plasma generation was 350° C. Here, samples formed at pressures of the treatment chamber in a dinitrogen monoxide atmosphere of 40 Pa, 150 Pa, and 300 Pa are referred to as a sample A1, a sample A2, and a sample A3, respectively. In addition, samples formed at pressures of the treatment chamber in an oxygen atmosphere of 40 Pa, 150 Pa, and 300 Pa are referred to as a sample A4, a sample A5, and a sample A6, respectively.

Note that as a comparative example, a sample in which a 100-nm-thick IGZO film was formed over a quartz substrate in a manner similar to those of the samples A1 to A6 is referred to as a sample A7. In addition, a sample in which a 100-nm-thick IGZO film was formed over a quartz substrate and then a 20-nm-thick silicon oxynitride film was formed thereover in a manner similar to those of the samples A1 to A6 is referred to as a sample A8.

Next, the samples A1 to A8 were measured by ESR. Here, the ESR measurement was performed under the conditions as follows. The measurement temperature was room temperature (25° C.), the high-frequency power (power of microwaves) of 9.5 GHz was 20 mW, and the direction of a magnetic field was parallel to a surface of each sample. Note that the lower limit of the detection of the spin density of a signal due to a defect in the IGZO film, which appears when g (g-factor) is 1.93, was $1 \times 10^{17}$ spins/cm$^3$.

Figure 20A:
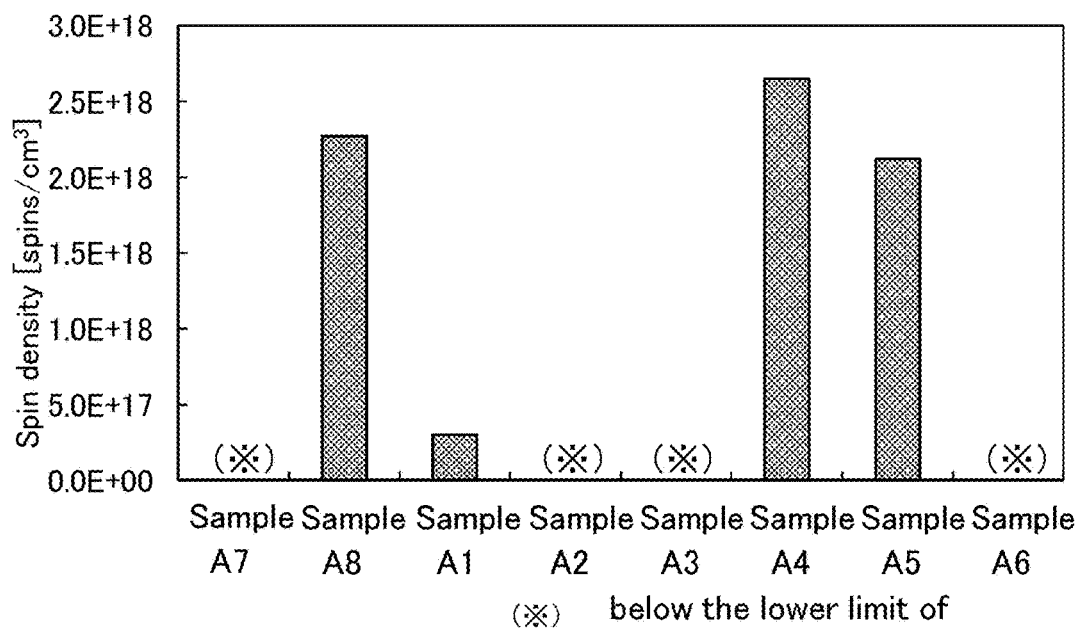
FIGS. 20A and 20B show results of ESR measurement.
Figure 20B:
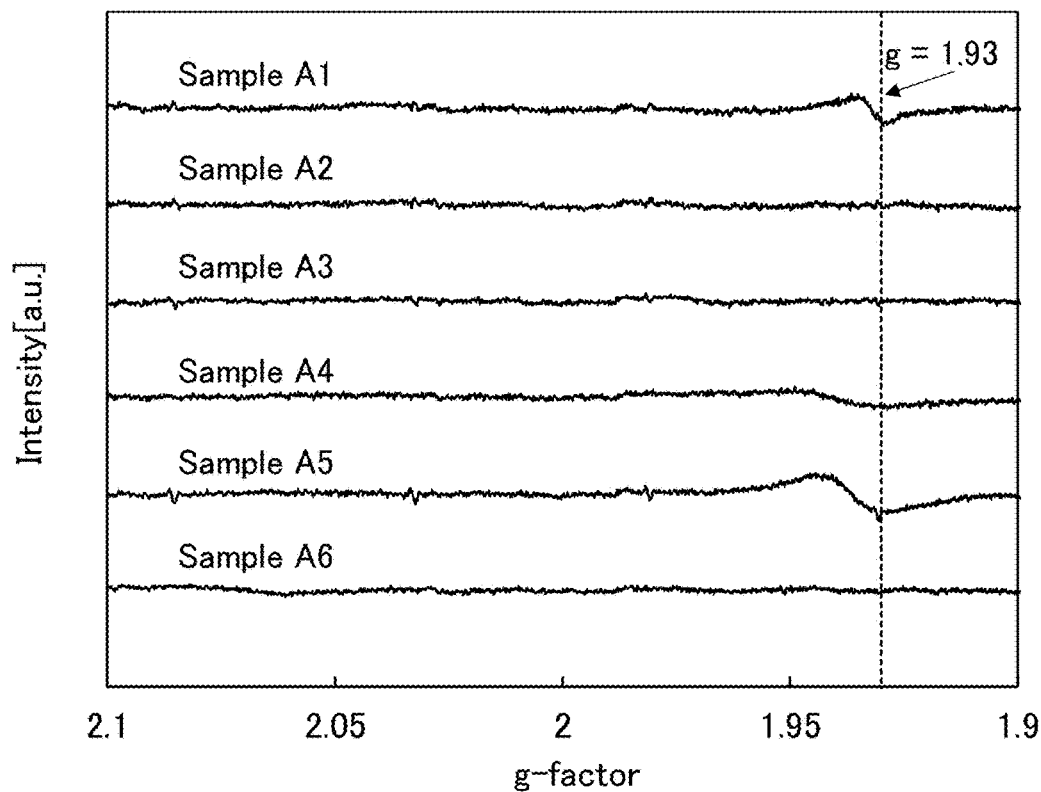

FIG. 20A shows the spin density of a signal which appears when g (g-factor) is 1.93, which were obtained by ESR measurement of the IGZO film included in each of the samples A1 to A8. FIG. 20B shows first derivative curves obtained by ESR measurement of the IGZO films in the samples A1 to A6.

In comparison between the sample A7 and the sample A8 shown in FIG. 20A, it is found that defects are caused in the IGZO film by forming the silicon oxynitride film over the IGZO film.

Moreover, by comparing the samples A1 to A3 with the sample A8, the spin densities in the IGZO films are decreased. Accordingly, it is found that defects in the IGZO film can be reduced in such a manner that, through the silicon oxynitride film which is exposed to plasma generated in a dinitrogen monoxide atmosphere, oxygen in the plasma is transferred to the IGZO film.

On the other hand, by comparing the samples A4 to A6 with the sample A8, the spin densities in the IGZO films are not decreased so much even by exposing the silicon oxynitride film to plasma generated in an oxygen atmosphere when the pressure in the treatment chamber is low, typically lower than or equal to 150 Pa. Accordingly, it is found that defects in the IGZO film is unlikely to be reduced even through the silicon oxynitride film which is exposed to plasma generated in an oxygen atmosphere.

Accordingly, it is found that a dinitrogen monoxide atmosphere is preferred to an oxygen atmosphere in order to reduce defects in the IGZO film in such a manner that, through the silicon oxynitride film which is exposed to plasma generated in an oxidizing gas atmosphere, oxygen in the plasma is transferred to the IGZO film. That is, in the case where an oxide insulating film is formed over an oxide semiconductor film by plasma CVD method, a deposition gas containing silicon and dinitrogen monoxide is used as a source gas, whereby a nitrogen-containing oxide insulating film can be formed while defects in the oxide semiconductor film are reduced.

Example 2

In this example, oxidizing power of plasma caused when an oxide insulating film was exposed to plasma generated by using dinitrogen monoxide or oxygen as an oxidizing gas will be described.

First, a method for forming samples is described.

A 100-nm-thick silicon oxynitride film was formed as a nitrogen-containing oxide insulating film over a quartz substrate. Then, the silicon oxynitride film was exposed to plasma which was generated in an oxidizing gas atmosphere. Conditions of the formation of the silicon oxynitride film and conditions of plasma treatment are described below.

The silicon oxynitride film was formed under the conditions as follows: the quartz substrate was placed in a treatment chamber of a plasma CVD apparatus, silane with a flow rate of 1 sccm and dinitrogen monoxide with a flow rate of 800 sccm which were used as a source gas were supplied to the treatment chamber, the pressure in the treatment chamber was controlled to 40 Pa, and the power of 150 W was supplied with the use of a 60 MHz high-frequency power source. Further, the temperature of the quartz substrate at the formation of the silicon oxynitride film was 400° C. Note that the plasma CVD apparatus used in this example is a parallel plate plasma CVD apparatus in which the electrode area is 615 cm$^2$, and the power per unit area (power density) into which the supplied power is converted is 0.24 W/cm$^2$.

Plasma was generated in such a manner that dinitrogen monoxide or oxygen with a flow rate of 900 sccm was supplied to the treatment chamber, the pressure in the treatment chamber was controlled to 200 Pa, and power of 900 W (1.46 W/cm$^2$) was supplied with the use of a 60 MHz high-frequency power source. Further, the temperature of the quartz substrate at the time of plasma generation was 200° C. Here, a sample which was exposed to plasma generated in a dinitrogen monoxide atmosphere is referred to as a sample B1. In addition, a sample which was exposed to plasma generated in an oxygen atmosphere is referred to as a sample B2.

Next, TDS (thermal desorption spectroscopy) analyses were performed on the samples B1 and B2.

The peaks of the curves shown in the results obtained from TDS analyses appear due to release of atoms or molecules contained in the analyzed samples (in this example, the samples B1 and B2) to the outside. The total amount of the atoms or molecules released to the outside corresponds to the integral value of the peak. Thus, with the degree of the peak intensity, the number of the atoms or molecules contained in the silicon oxynitride film can be evaluated.

FIGS. 21A and 21B show the results of the TDS analyses on the samples B1 and B2. FIGS. 21A and 21B are graphs of the number of released hydrogen molecules against the substrate temperature.

FIGS. 21A and 21B demonstrate that the silicon oxynitride film which was exposed to plasma generated in a dinitrogen monoxide atmosphere has higher TDS intensity of oxygen molecules compared with the silicon oxynitride film which was exposed to plasma generated in an oxygen atmosphere. As described above, plasma generated in a dinitrogen monoxide atmosphere has stronger oxidizing power than plasma generated in an oxygen atmosphere and enables formation of a film containing excess oxygen, from which oxygen is released easily by heating.

Accordingly, in the case where an oxide insulating film is formed over an oxide semiconductor film by a plasma CVD method, a film containing excess oxygen, from which oxygen can be released by heating, can be formed by using a deposition gas containing silicon and dinitrogen monoxide as a source gas. Note that when dinitrogen monoxide is used as a source gas, nitrogen is contained in the oxide insulating film; therefore, an oxide insulating film containing nitrogen and excess oxygen can be obtained.

Example 3

In this example, the nitrogen concentration of a silicon oxynitride film before and after heat treatment will be described. In this example, the transfer of nitrogen by heat treatment will be described by measuring the nitrogen concentration by substrate side depth profile secondary ion mass spectrometry (SSDP-SIMS) (SIMS from the back side).

First, a method for forming a sample C1 and a sample C2 is described.

A 100-nm-thick IGZO film was formed over a quartz substrate. A 250-nm-thick silicon oxynitride film was formed over the IGZO film. Note that the silicon oxynitride film has a stacked-layer structure of a 50-nm-thick first silicon oxynitride film and a 200-nm-thick second silicon oxynitride film. Through the above process, the sample C1 was formed. Next, the sample C2 was formed by performing heat treatment on the sample C1. Conditions of the formation of the films and conditions of the heat treatment are described below.

The IGZO film was formed under the conditions as follows: a sputtering target containing In, Ga, and Zn at an atomic ratio of 1:1:1 was used, argon with a flow rate of 50 sccm and oxygen with a flow rate of 50 sccm were supplied as a sputtering gas to a treatment chamber of a sputtering apparatus, the pressure in the treatment chamber was controlled to 0.6 Pa, and the DC power of 5 kW was supplied. Note that the IGZO film was formed at a substrate temperature of 170° C.

The first silicon oxynitride film was formed under the conditions as follows: the quartz substrate was placed in a treatment chamber of a plasma CVD apparatus, silane with a flow rate of 30 sccm and dinitrogen monoxide with a flow rate of 4000 sccm which were used as a source gas were supplied to the treatment chamber, the pressure in the treatment chamber was controlled to 40 Pa, and the power of 150 W was supplied with the use of a 27.12 MHz high-frequency power source. Further, the temperature of the quartz substrate at the formation of the first silicon oxynitride film was 220° C. Note that the plasma CVD apparatus used in this example is a parallel plate plasma CVD apparatus in which the electrode area is 6000 cm$^2$, and the power per unit area (power density) into which the supplied power is converted is 0.025 W/cm$^2$.

The second silicon oxynitride film was formed under the conditions as follows: the quartz substrate was placed in the treatment chamber, silane with a flow rate of 160 sccm and dinitrogen monoxide with a flow rate of 4000 sccm which were used as a source gas were supplied to the treatment chamber, the pressure in the treatment chamber was controlled to 200 Pa, and the power of 1500 W (power density of 0.25 W/cm$^2$) was supplied with the use of a 27.12 MHz high-frequency power source. Further, the temperature of the quartz substrate at the formation of the second silicon oxynitride film was 220° C.

The heat treatment in the sample C2 was performed at 350° C. in a mixed atmosphere of nitrogen and oxygen for one hour.

Next, the concentration profiles of nitrogen contained in each of the samples C1 and C2 were measured by SSDP-SIMS (measurement from the back side, here from the quartz substrate side). Note that a cesium primary ion (Cs$^+$) was used as a primary ion species.

Figure 22A:
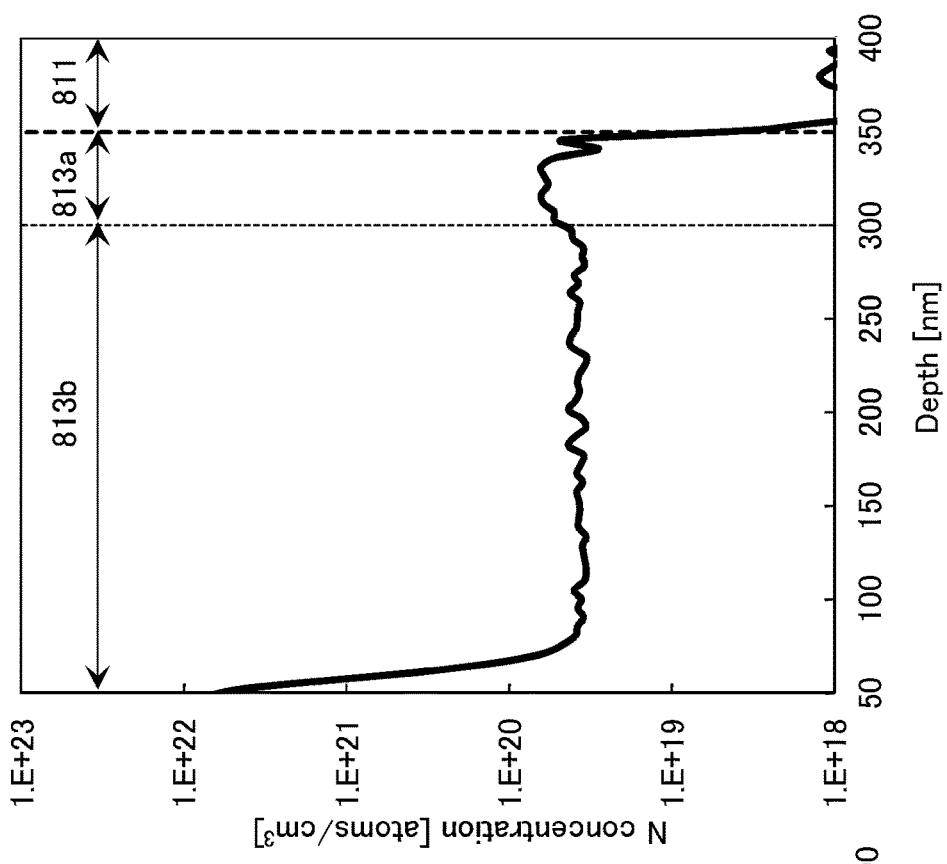
FIGS. 22A and 22B show results of SSDP-SIMS analyses.
Figure 22B:
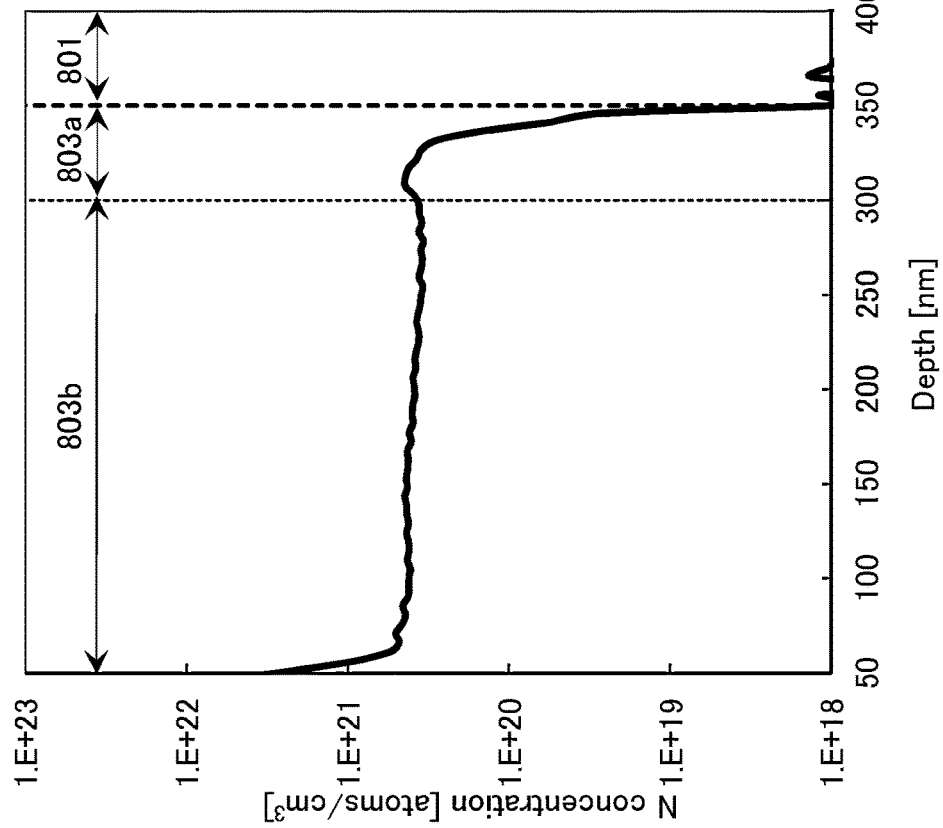

FIGS. 22A and 22B each show the concentration profiles of nitrogen which were obtained by the SSDP-SIMS measurement.

FIG. 22A shows the measurement result of the sample C1, and FIG. 22B shows the measurement result of the sample C2. In FIGS. 22A and 22B, regions 801 and 811 indicate regions of the IGZO films, regions 803*a* and 813*a* indicate regions of the first silicon oxynitride films, and regions 803*b* and 813*b* indicate regions of the second silicon oxynitride films.

In the sample C1, the nitrogen concentrations of the first silicon oxynitride film and the second silicon oxynitride film were greater than or equal to $3 \times 10^{20}$ atoms/cm$^3$ and less than or equal to $5 \times 10^{20}$ atoms/cm$^3$. On the other hand, in the sample C2, the nitrogen concentrations of the first silicon oxynitride film and the second silicon oxynitride film were greater than or equal to $3 \times 10^{19}$ atoms/cm$^3$ and less than or equal to $7 \times 10^{19}$ atoms/cm$^3$.

Accordingly, the above results show that heat treatment performed on a silicon oxynitride film releases nitrogen contained therein and reduces the nitrogen concentration of the silicon oxynitride film.

Example 4

In this example, film formation temperature of a nitrogen-containing oxide insulating film and change in the number of defects of an oxide semiconductor film will be described. In this example, results of electron spin resonance (ESR) by which the number of defects in the oxide semiconductor film was measured will be described.

First, a method for forming samples is described.

A 100-nm-thick IGZO film which was a CAAC-OS film was formed over a quartz substrate by a sputtering method. Conditions of the formation of the IGZO film are similar to those of the IGZO films provided in the samples C1 and C2 of Example 3.

Next, a 400-nm-thick first nitrogen-containing oxide insulating film was formed over the IGZO film. Here, as the first nitrogen-containing oxide insulating film, the oxide insulating film transmitting oxygen described as the nitrogen-containing oxide insulating film 24a in Embodiment 2 was formed. Conditions of the formation of the first nitrogen-containing oxide insulating film are similar to those of the first silicon oxynitride films provided in the samples C1 and C2 of Example 3. Note that samples which were formed at film formation temperatures of 180° C., 200° C., 220° C., 240° C., and 260° C. are referred to as a sample D1, a sample D2, a sample D3, a sample D4, and a sample D5, respectively.

Next, samples which were obtained by performing heat treatment at 350° C. for one hour on the sample D1, the sample D2, the sample D3, the sample D4, and the sample D5 were referred to as a sample D6, a sample D7, a sample D8, a sample D9, and a sample D10, respectively.

Note that samples D1 to D5 in each of which a 400-nm-thick second nitrogen-containing oxide insulating film is formed instead of the first nitrogen-containing oxide insulating film are referred to as a sample D11, a sample D12, a sample D13, a sample D14, and a sample D15. As the second nitrogen-containing oxide insulating film, the oxide insulating film containing excess oxygen described as the nitrogen-containing oxide insulating film 24b in Embodiment 2 was formed. Conditions of the formation of the second nitrogen-containing oxide insulating film are similar to those of the second silicon oxynitride films provided in the samples C1 and C2 of Example 3. Note that the second nitrogen-containing oxide insulating films of the sample D11, the sample D12, the sample D13, the sample D14, and the sample D15 were formed at film formation temperatures of 180° C., 200° C., 220° C., 240° C., and 260° C., respectively.

Next, samples which were obtained by performing heat treatment at 350° C. for one hour on the sample D11, the sample D12, the sample D13, the sample D14, and the sample D15 were referred to as a sample D16, a sample D17, a sample D18, a sample D19, and a sample D20, respectively.

Next, the samples D1 to D20 were measured by ESR. In the ESR measurement performed at a predetermined temperature, a value of a magnetic field ($H_0$) where a microwave is absorbed is used for an equation $g=hv/\beta H_0$, so that a parameter of a g-factor can be obtained. Note that the frequency of the microwave is denoted by v, and the Planck constant and the Bohr magneton are denoted by, respectively, h and β which are both constants.

Here, the ESR measurement was performed under the conditions as follows. The measurement temperature was room temperature (25° C.), the high-frequency power (power of microwaves) of 9.1 GHz was 20 mW, and the direction of a magnetic field was parallel to a surface of each sample. Note that the lower limit of the detection of the spin density of a signal due to a defect in the IGZO film, which appears when g (g-factor) is 1.93, was $4.4 \times 10^{16}$ spins/cm$^3$.

Moreover, FIG. 23A shows first derivative curves obtained by measuring the IGZO films included in the samples D1 to D5 by ESR, FIG. 23B shows first derivative curves obtained by measuring the IGZO films included in the samples D6 to D10 by ESR, and FIG. 23C shows spin densities of signals which appear when g (g-factor) is 1.93 in the samples D1 to D5.

Moreover, FIG. 24A shows first derivative curves obtained by measuring the IGZO films included in the samples D11 to D15 by ESR, FIG. 24B shows first derivative curves obtained by measuring the IGZO films included in the samples D16 to D20 by ESR, and FIG. 24C shows spin densities of signals which appear when g (g-factor) is 1.93 in the samples D11 to D15.

It is found from FIG. 23A and FIG. 24A that the samples D3 to D5 and the samples D13 to D15 have signals symmetry due to a defect in the oxide semiconductor film when a g-factor is 1.93, which means that the IGZO films contain defects. Note that an oxygen vacancy is an example of the defect in the IGZO film. On the other hand, in the samples D1 and D2 and the samples D11 and D12, a symmetrical signal due to a defect is not detected (i.e., the number of defects was less than or equal to the lower limit of detection (here, the lower limit of detection is $4.4 \times 10^{16}$ spins/cm$^3$)), which means that the number of defects in the IGZO film cannot be detected.

In addition, it is found from FIGS. 23B and 24B that, in all of the samples, signal symmetry due to a defect in the oxide semiconductor film is not detected (i.e., here, the number of defects was less than or equal to the lower limit of detection (here, the lower limit of detection is $4.4 \times 10^{16}$ spins/cm$^3$)), which means that the number of defects in the IGZO film cannot be detected.

Accordingly, the above results show that oxygen is diffused from a nitrogen-containing oxide insulating film into an oxide semiconductor film when the nitrogen-containing oxide insulating film formed over the oxide semiconductor film is subjected to heat treatment; thus, defects, for example, oxygen vacancies in the oxide semiconductor film can be reduced.

Example 5

In this example, measurement results of Vg-Id characteristics and a BT photostress test of a transistor will be described.

First of all, a manufacturing process of a transistor included in each of a sample E1 and a sample E2 is described. Description in this example is made with reference to FIGS. 2A to 2E.

First, a glass substrate was used as the substrate 11, and the gate electrode 15 was formed over the substrate 11, as illustrated in FIG. 2A.

The gate electrode 15 was formed as follows: a 100-nm-thick tungsten film was formed by a sputtering method, a mask was formed over the tungsten film by a photolithography process, and the tungsten film was partly etched using the mask.

Next, the gate insulating film 17 was formed over the gate electrode 15.

A 50-nm-thick silicon nitride film and a 200-nm-thick silicon oxynitride film were stacked as the gate insulating film 17. The silicon nitride film was formed under the conditions as follows: silane with a flow rate of 50 sccm and nitrogen with a flow rate of 5000 sccm were supplied to a treatment chamber of a plasma CVD apparatus, the pressure in the treatment chamber was controlled to 60 Pa, and the power of 150 W was supplied with the use of a 27.12 MHz high-frequency power source. The silicon oxynitride film was formed under the conditions as follows: silane with a flow rate of 20 sccm and dinitrogen monoxide with a flow rate of 3000 sccm were supplied to the treatment chamber of the plasma CVD apparatus, the pressure in the treatment chamber was controlled to 40 Pa, and the power of 100 W was supplied with the use of a 27.12 MHz high-frequency power source. Note that each of the silicon nitride film and the silicon oxynitride film was formed at a substrate temperature of 350° C.

Next, the oxide semiconductor film 19 overlapping with the gate electrode 15 with the gate insulating film 17 provided therebetween was formed.

Here, an IGZO film which was a CAAC-OS film was formed over the gate insulating film 17 by a sputtering method, a mask is formed over the IGZO film by a photolithography process, and the IGZO film was partly etched using the mask. Then, the etched IGZO film was subjected to heat treatment, so that the oxide semiconductor film 19 was formed. In this example, a 35-nm-thick IGZO film was formed. Note that conditions of the formation of the IGZO film are similar to those of the IGZO films provided in the samples C1 and C2 of Example 3.

The IGZO film was formed under the conditions as follows: a sputtering target containing In, Ga, and Zn at an atomic ratio of 1:1:1 was used, argon with a flow rate of 50 sccm and oxygen with a flow rate of 50 sccm were supplied as a sputtering gas to a treatment chamber of a sputtering apparatus, the pressure in the treatment chamber was controlled to 0.6 Pa, and the DC power of 5 kW was supplied. Note that the IGZO film was formed at a substrate temperature of 170° C.

Next, water, hydrogen, and the like contained in the oxide semiconductor film were released by heat treatment. Here, heat treatment at 450° C. in a nitrogen atmosphere for one hour was performed, and then heat treatment at 450° C. in a mixed atmosphere of nitrogen and oxygen for one hour was performed.

FIG. 2B can be referred to for the structure obtained through the steps up to here.

Next, after the gate electrode was exposed by partly etching the gate insulating film 17 (this step is not illustrated), the pair of electrodes 21 in contact with the oxide semiconductor film 19 was formed as illustrated in FIG. 2C.

A conductive film was formed over the gate insulating film 17 and the oxide semiconductor film 19, a mask was formed over the conductive film by a photolithography process, and the conductive film was partly etched using the mask, so that the pair of electrodes 21 was formed. Note that as the conductive film, a 400-nm-thick aluminum film was formed over a 50-nm-thick tungsten film, and a 100-nm-thick titanium film was formed over the aluminum film.

Next, after the substrate was moved to a treatment chamber under reduced pressure and was heated at 220° C., the substrate was moved to a treatment chamber filled with dinitrogen monoxide. Then, the oxide semiconductor film 19 was exposed to plasma which was generated in such a manner that an upper electrode provided in the treatment chamber was supplied with high-frequency power of 150 W with the use of a 27.12 MHz high-frequency power source.

Figure 2D:
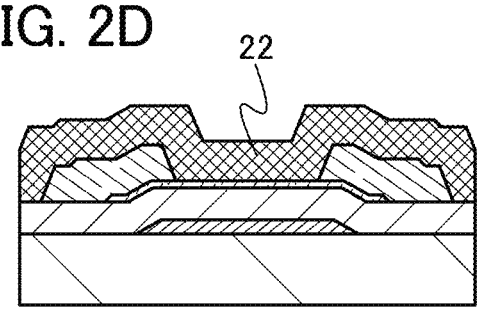
Figure 2E:
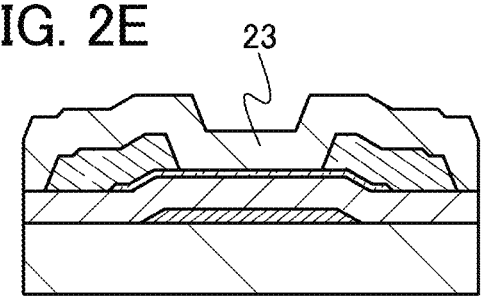

Next, the nitrogen-containing oxide insulating film 22 was formed in succession without exposure to the atmosphere after the above plasma treatment (see FIG. 2D). Here, a 50-nm-thick first silicon oxynitride film and a 400-nm-thick second silicon oxynitride film were stacked as the nitrogen-containing oxide insulating film 22. Note that conditions of the formation of the first silicon oxynitride film and conditions of the formation of the second silicon oxynitride film are similar to those of the first silicon oxynitride films and those of the second silicon oxynitride films which were provided in the samples C1 and C2 of Example 3, respectively.

The first silicon oxynitride film was formed by a plasma CVD method under the conditions as follows: silane with a flow rate of 30 sccm and dinitrogen monoxide with a flow rate of 4000 sccm were used as a source gas, the pressure in a treatment chamber of the plasma CVD apparatus was 40 Pa, the substrate temperature was 220° C., and the high-frequency power of 150 W was supplied to parallel plate electrodes.

The second silicon oxynitride film was formed by a plasma CVD method under the conditions as follows: silane with a flow rate of 160 sccm and dinitrogen monoxide with a flow rate of 4000 sccm were used as a source gas, the pressure in the treatment chamber was 200 Pa, the substrate temperature was 220° C., and the high-frequency power of 1500 W was supplied to parallel plate electrodes. Under the above conditions, it is possible to form a silicon oxynitride film containing oxygen at a higher proportion than oxygen in the stoichiometric composition and from which part of oxygen is released by heating.

Next, heat treatment was performed to remove water, nitrogen, hydrogen, and the like from the nitrogen-containing oxide insulating film 22, and the nitrogen-containing oxide insulating film 23 whose nitrogen concentration is reduced is formed as illustrated in FIG. 2E. Here, the heat treatment was performed at 350° C. in a mixed atmosphere of nitrogen and oxygen for one hour.

Next, after the substrate was moved to a treatment chamber under reduced pressure and was heated at 350° C., a nitride insulating film (not illustrated) was formed over the nitrogen-containing oxide insulating film 23.

As the nitride insulating film, a 50-nm-thick silicon nitride film was formed by a plasma CVD method under the conditions as follows: silane with a flow rate of 200 sccm, nitrogen with a flow rate of 2000 sccm, and ammonia with a flow rate of 100 sccm were used as a source gas, the pressure in the treatment chamber was 100 Pa, the substrate temperature was 350° C., and the high-frequency power of 2000 W was supplied to parallel plate electrodes.

Next, although not illustrated, an opening which exposes part of the pair of electrodes was formed by partly etching the nitrogen-containing oxide insulating film 23 and the nitride insulating film.

Next, a planarization film was formed (not illustrated) over the nitride insulating film. Here, the nitride insulating film was coated with a composition, and exposure and development were performed, so that a planarization film having an opening through which the pair of electrodes is partly exposed was formed. Note that as the planarization film, a 1.5-μm-thick acrylic resin was formed. Then, heat treatment was performed. The heat treatment was performed at a temperature of 250° C. in a nitrogen atmosphere for one hour.

Next, a conductive film connected to part of the pair of electrodes was formed (not illustrated). Here, a 100-nm-thick ITO film containing silicon oxide was formed by a sputtering method. After that, heat treatment was performed at 250° C. in a mixed atmosphere of nitrogen and oxygen for one hour.

Through the above process, a transistor E1 was formed. Note that a sample including a plurality of the transistors E1 is referred to as a sample E1.

Further, a transistor E2 was formed by skipping the step of forming the nitrogen-containing oxide insulating film 23 by the heat treatment, which is followed by the step of forming the nitrogen-containing oxide insulating film 22 in the transistor E1. Note that a sample including a plurality of the transistors E2 is referred to as a sample E2.

Next, a BT stress test and a BT photostress test were performed on each of the samples E1 and E2. Here, the BT stress test in which voltage was applied to the gate electrode was performed under the conditions as follows: the substrate temperature was 80° C., the intensity of an electric field applied to the gate insulating film was 1.2 MV/cm, and the application time was 2000 seconds.

Under conditions similar to those of the above BT stress test, the BT photostress test in which the transistor is irradiated with white LED light with 3000 1× to apply voltage to the gate electrode was performed.

A method of the BT stress test and a method for measuring Vg-Id characteristics of each transistor are described. First, initial Vg-Id characteristics of the transistor were measured. Here, change in characteristics of current flowing between a source electrode and a drain electrode (hereinafter referred to as the drain current), that is, Vg-Id characteristics were measured under the conditions as follows: the substrate temperature was 25° C., the voltages between the source electrode and the drain electrode (hereinafter the drain voltage) was 1 V and 10 V, and the voltages between the source electrode and the gate electrode (hereinafter the gate voltage) were changed from −30 V to +30 V.

Next, the substrate temperature was raised to 80° C., and then, the potentials of the source electrode and the drain electrode of the transistor were set to 0 V. Then, voltage was kept being applied to the gate electrode for 2000 seconds so that the intensity of the electric field applied to the gate insulating film was 1.2 MV/cm.

Note that in a negative BT stress test (dark, −GBT), a voltage of −30 V was applied to the gate electrode, and in a positive BT stress test (dark, +GBT), a voltage of 30 V was applied to the gate electrode. In a negative BT photostress test (photo, −GBT), a voltage of −30 V was applied to the gate electrode while the transistor was irradiated with white LED light with 3000 1×. In a positive BT photostress test (photo, +GBT), a voltage of 30 V was applied to the gate electrode while the transistor was irradiated with white LED light with 3000 1×.

Next, the substrate temperature was lowered to 25° C. while voltage was continuously applied to the gate electrode, and the source electrode and the drain electrode. After the substrate temperature reached to 25° C., the application of voltage to the gate electrode, and the source electrode and the drain electrode was stopped.

Next, Vg-Id characteristics were measured under the same conditions as the measurement of the initial characteristics, and Vg-Id characteristics after the BT stress test and the BT photostress test were obtained.

Figure 25A:
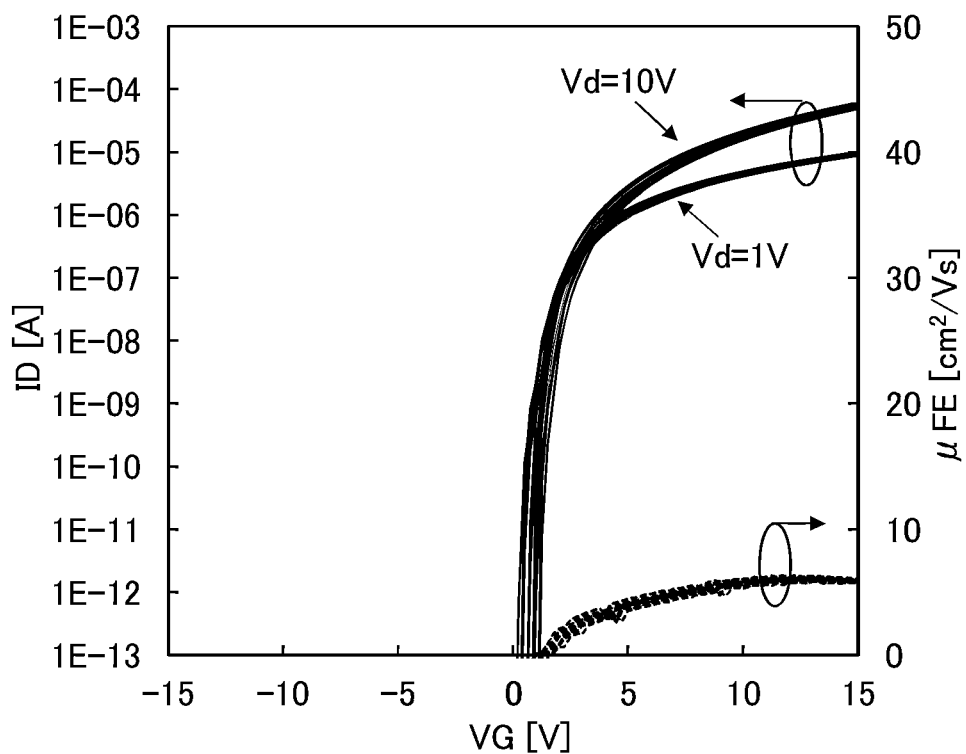
FIGS. 25A and 25B each show Vg-Id characteristics of a transistor.
Figure 25B:
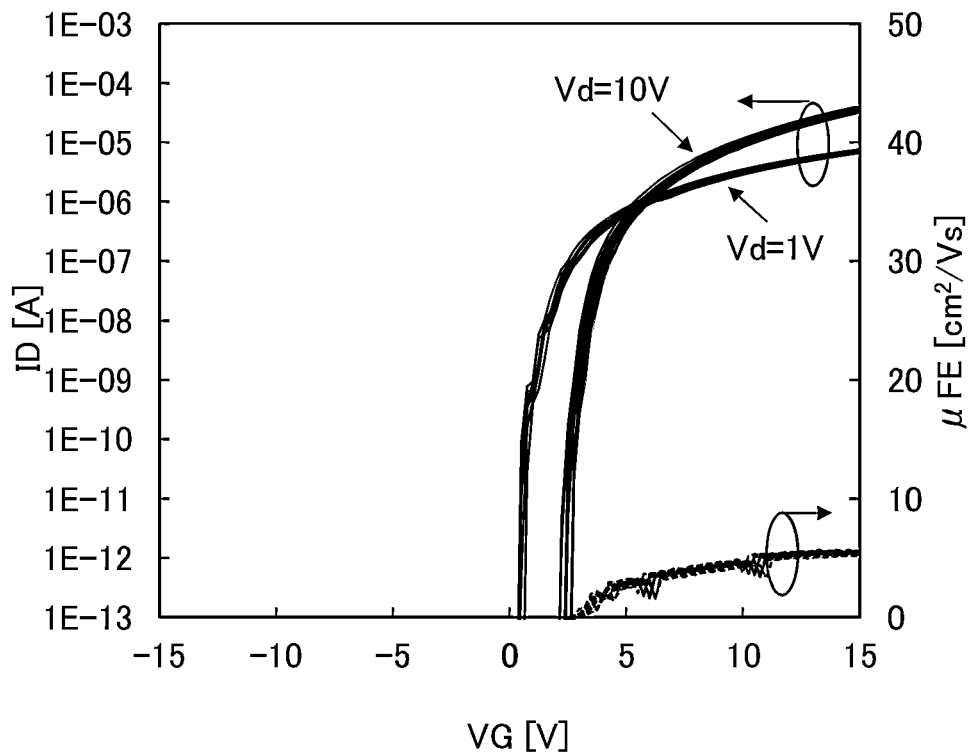

FIG. 25A shows Vg-Id initial characteristics of the transistors included in the sample E1, and FIG. 25B shows Vg-Id initial characteristics of the transistors included in the sample E2. In FIGS. 25A and 25B, the horizontal axis indicates the gate voltage Vg and the vertical axis indicates the drain current Id. Further, the solid lines indicate the Vg-Id characteristics at the drain voltages Vd of 1 V and 10 V, and the dashed line indicates the field-effect mobility with respect to the gate voltages at the drain voltage Vd of 10 V. Note that the field-effect mobility was obtained by operation of each sample in a saturation region.

Figure 26:
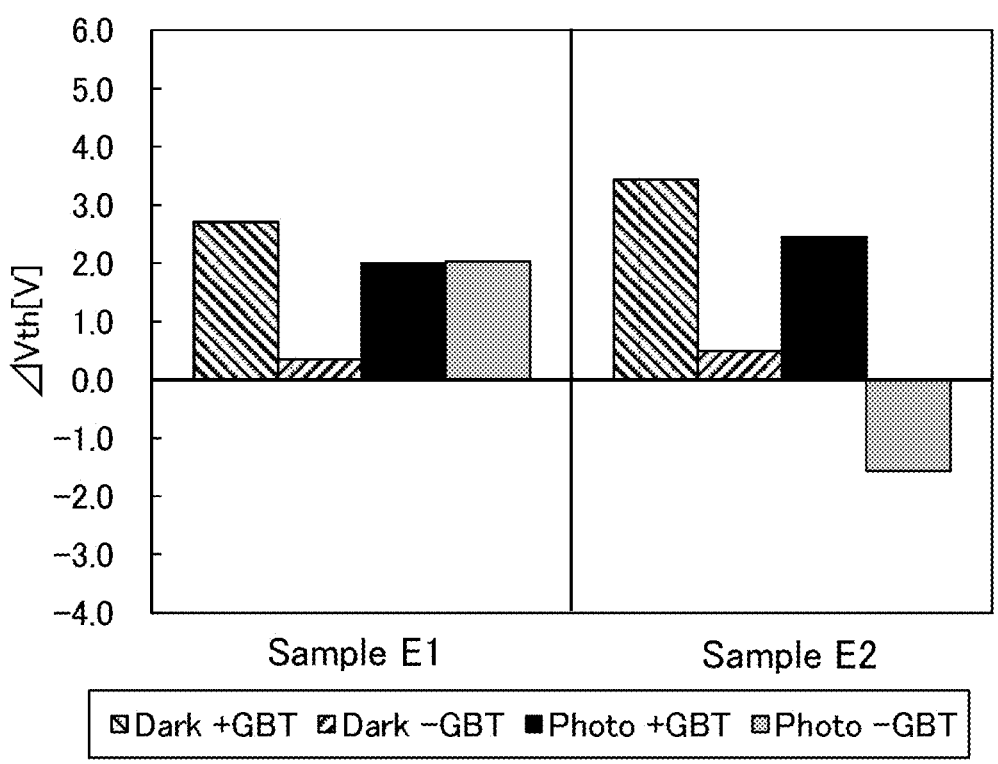
FIG. 26 shows the amount of change of threshold voltages of transistors.

Further, FIG. 26 shows, in the samples E1 and E2, a difference between a threshold voltage in the initial characteristics and a threshold voltage after BT stress tests (i.e., the amount of change of the threshold voltage (ΔVth)). FIG. 26 shows the amounts of change of the threshold voltage (ΔVth) in the positive BT stress test (dark, +GBT), the negative BT stress test (dark, −GBT), the positive BT photostress test (photo, +GBT), and the negative BT photostress test (photo, −GBT), In this specification, in a curve where the horizontal axis indicates the gate voltage (Vg [V]) and the vertical axis indicates the square root of drain current ($Id^{1/2}$ [A]), the threshold voltage (Vth) is defined as a gate voltage at a point of intersection of an extrapolated tangent line of $Id^{1/2}$ having the highest inclination with the Vg axis. Note that in this specification, threshold voltage is calculated with a drain voltage Vd of 10 V.

Note that in each of the transistors, the channel length (L) is 6 μm and the channel width (W) is 50 μm. Further, in each of the samples, 20 transistors having the same structure were formed on the substrate.

In the Vg-Id characteristics shown in FIG. 25B, the rising gate voltage (Vg) of the on-state current at the drain voltage of 1 V and the rising gate voltage (Vg) of the on-state current at the drain voltage of 10 V are different from each other. On the other hand, in the Vg-Id characteristics shown in FIG. 25A, the rising gate voltage (Vg) of the on-state current at the drain voltage of 1 V and the rising gate voltage (Vg) of the on-state current at the drain voltage of 10 V are substantially the same. Accordingly, the above results show that electrical characteristics of a transistor are improved by forming a nitrogen-containing oxide insulating film over the transistor and then performing heat treatment. This is because the nitrogen concentration of the nitrogen-containing oxide insulating film can be reduced by performing the heat treatment on the nitrogen-containing oxide insulating film as described in Example 3. Consequently, the number of defects in the nitrogen-containing oxide insulating film can be reduced; therefore, the electrical characteristics of the transistor are improved.

As shown in FIG. 26, in the negative BT photostress test in the sample E2, there is a negative shift of the threshold voltage (ΔVth), and the amount of change of the threshold voltage was large. On the other hand, in the sample E1, the threshold voltage is positively shifted in all of the BT stress tests and the BT photostress tests and the amounts of change of the threshold voltage (ΔVth) is less than 3.0 V, which is small. Accordingly, the above results show that the amounts of change of the threshold voltage in the BT stress tests and the BT photostress tests are small by forming a nitrogen-containing oxide insulating film over a transistor and then performing heat treatment. This is because heating performed on the nitrogen-containing oxide insulating film as described in Example 4 can reduce the number of defects, for example, oxide vacancies in the oxide semiconductor film and improve the electrical characteristics of the transistor.

This application is based on Japanese Patent Application serial No. 2012-165728 filed with the Japan Patent Office on Jul. 26, 2012, the entire contents of which are hereby incorporated by reference.

What is claimed is:

1. A method for manufacturing a semiconductor device, comprising the steps of:
   forming a gate electrode over a substrate;
   forming a gate insulating film over the gate electrode;
   forming an oxide semiconductor film over the gate insulating film;
   forming a nitrogen-containing oxide insulating film over the oxide semiconductor film, wherein a nitrogen concentration of the nitrogen-containing oxide insulating film is greater than or equal to $1\times10^{18}$ atoms/cm$^3$ and less than or equal to $1\times10^{20}$ atoms/cm$^3$;

releasing nitrogen from the nitrogen-containing oxide insulating film by a heat treatment, wherein the nitrogen-containing oxide insulating film is formed by a plasma CVD method; and forming a nitride insulating film containing hydrogen molecules over the nitrogen-containing oxide insulating film, wherein an amount of the hydrogen molecules released from the nitride insulating film is less than $5\times10^{21}$ molecules/cm$^3$ in the case where the nitride insulating film is measured by thermal desorption spectrometry just after the forming of the nitride insulating film.

2. The method for manufacturing a semiconductor device, according to claim 1, wherein a temperature of the heat treatment is higher than or equal to 150° C. and lower than or equal to 500° C.

3. The method for manufacturing a semiconductor device, according to claim 1, wherein the nitrogen-containing oxide insulating film is a nitrogen-containing silicon oxide film.

4. The method for manufacturing a semiconductor device, according to claim 1, wherein the oxide semiconductor film comprises In, Ga, and Zn.

5. The method for manufacturing a semiconductor device, according to claim 1, wherein the oxide semiconductor film is a c-axis aligned crystalline oxide semiconductor film including crystallized parts.

6. The method for manufacturing a semiconductor device, according to claim 1, wherein a nitrogen concentration of the oxide semiconductor film is less than or equal to $5\times10^{18}$ atoms/cm$^3$.

7. The method for manufacturing a semiconductor device, according to claim 1, further comprising a step of performing a first heat treatment,
wherein the first heat treatment is performed first in an atmosphere of an inert gas and then in an oxygen atmosphere.

8. The method for manufacturing a semiconductor device, according to claim 1, further comprising a step of forming a pair of electrodes before forming the nitrogen-containing oxide insulating film.

9. The method for manufacturing a semiconductor device, according to claim 8, further comprising a step of performing a plasma treatment after forming the pair of electrodes.

10. The method for manufacturing a semiconductor device, according to claim 1, wherein a spin density of a signal which appears when g is 1.93, due to defects in the oxide semiconductor film, is lower than or equal to $1\times10^{17}$ spins/cm$^3$.

11. The method for manufacturing a semiconductor device, according to claim 1, wherein a thickness of the nitrogen-containing oxide insulating film is greater than or equal to 150 nm and less than or equal to 400 nm.

12. A method for manufacturing a semiconductor device, comprising the steps of:
forming a gate electrode over a substrate;
forming a gate insulating film over the gate electrode;
forming an oxide semiconductor film over the gate insulating film;
forming a nitrogen-containing oxide insulating film over the oxide semiconductor film, wherein a nitrogen concentration of the nitrogen-containing oxide insulating film is greater than or equal to $1\times10^{18}$ atoms/cm$^3$ and less than or equal to $1\times10^{20}$ atoms/cm$^3$;

releasing nitrogen from the nitrogen-containing oxide insulating film by a heat treatment; and forming a nitride insulating film containing hydrogen molecules over the nitrogen-containing oxide insulating film, wherein the step of forming the oxide semiconductor film is performed by a sputtering method using a polycrystalline oxide semiconductor sputtering target comprising In, Ga, and Zn, wherein a temperature of the substrate during the step of forming the oxide semiconductor film is higher than or equal to 150° C. and lower than or equal to 450° C., wherein the nitrogen-containing oxide insulating film is formed by a plasma CVD method, and wherein an amount of the hydrogen molecules released from the nitride insulating film is less than $5\times10^{21}$ molecules/cm$^3$ in the case where the nitride insulating film is measured by thermal desorption spectrometry just after the forming of the nitride insulating film.

13. The method for manufacturing a semiconductor device, according to claim 12, wherein a temperature of the heat treatment is higher than or equal to 150° C. and lower than or equal to 500° C.

14. The method for manufacturing a semiconductor device, according to claim 12, wherein the nitrogen-containing oxide insulating film is a nitrogen-containing silicon oxide film.

15. The method for manufacturing a semiconductor device, according to claim 12, wherein the oxide semiconductor film is a c-axis aligned crystalline oxide semiconductor film including crystallized parts.

16. The method for manufacturing a semiconductor device, according to claim 12, wherein a nitrogen concentration of the oxide semiconductor film is less than or equal to $5\times10^{18}$ atoms/cm$^3$.

17. The method for manufacturing a semiconductor device, according to claim 12, further comprising a step of performing a first heat treatment,
wherein the first heat treatment is performed first in an atmosphere of an inert gas and then in an oxygen atmosphere.

18. The method for manufacturing a semiconductor device, according to claim 12, further comprising a step of forming a pair of electrodes before forming the nitrogen-containing oxide insulating film.

19. The method for manufacturing a semiconductor device, according to claim 18, further comprising a step of performing a plasma treatment after forming the pair of electrodes.

20. The method for manufacturing a semiconductor device, according to claim 12, wherein a spin density of a signal which appears when g is 1.93, due to defects in the oxide semiconductor film, is lower than or equal to $1\times10^{17}$ spins/cm$^3$.

21. The method for manufacturing a semiconductor device, according to claim 12, wherein a thickness of the nitrogen-containing oxide insulating film is greater than or equal to 150 nm and less than or equal to 400 nm.

* * * * *